(12) United States Patent
Kalsi et al.

(10) Patent No.: US 11,949,414 B2
(45) Date of Patent: Apr. 2, 2024

(54) METHODS, APPARATUS, AND ARTICLES OF MANUFACTURE TO IMPROVE IN-MEMORY MULTIPLY AND ACCUMULATE OPERATIONS

(71) Applicant: Intel Corporation, Santa Clara, CA (US)

(72) Inventors: Gurpreet Singh Kalsi, Bangalore (IN); Akshay Krishna Ramanathan, State College, PA (US); Kamlesh Pillai, Bangalore (IN); Sreenivas Subramoney, Bangalore (IN); Srivatsa Rangachar Srinivasa, Hillsboro, OR (US); Anirud Thyagharajan, Bangalore (IN); Om Ji Omer, Bangalore (IN); Saurabh Jain, Bangalore (IN)

(73) Assignee: INTEL CORPORATION, Santa Clara, CA (US)

( * ) Notice: Subject to any disclaimer, the term of this patent is extended or adjusted under 35 U.S.C. 154(b) by 571 days.

(21) Appl. No.: 17/131,215

(22) Filed: Dec. 22, 2020

(65) Prior Publication Data

US 2021/0111722 A1 Apr. 15, 2021

(30) Foreign Application Priority Data

Oct. 23, 2020 (IN) .............................. 202041046226

(51) Int. Cl.
*H03K 19/17728* (2020.01)
*H03K 19/1776* (2020.01)

(52) U.S. Cl.
CPC ... *H03K 19/17728* (2013.01); *H03K 19/1776* (2013.01)

(58) Field of Classification Search
CPC ..................... H03K 19/17728; H03K 19/1776
See application file for complete search history.

(56) References Cited

U.S. PATENT DOCUMENTS

| 7,202,698 | B1 * | 4/2007 | Bauer | .............. | H03K 19/17728 |
| | | | | | 326/39 |
| 11,562,217 | B2 * | 1/2023 | Sun | ....................... | G06F 9/3004 |

OTHER PUBLICATIONS

Ping Chi et al., "PRIME: A Novel Processing-in-memory Architecture for Neural Network Computation in ReRam-based Main Memory," in 2016 ACM/IEEE 43rd Annual International Symposium on Computer Architecture (ISCA), pp. 27-39, Jun. 2016 (13 pages).

(Continued)

*Primary Examiner* — Daniel D Chang
(74) *Attorney, Agent, or Firm* — HANLEY, FLIGHT & ZIMMERMAN, LLC

(57) ABSTRACT

Methods, apparatus, systems, and articles of manufacture are disclosed to improve in-memory multiply and accumulate operations. An example apparatus includes a first multiplexer in a subarray of memory, the first multiplexer to receive first values representative of a column of a lookup table (LUT) including entries to represent products of four-bit numbers and return second values from an intersection of a row and the column of the LUT based on a first element of a first operand; shift and adder logic in the subarray, the shift and adder logic to shift the second values based on at least one of the first element of the first operand or a first element of a second operand; and accumulation storage in the subarray, the accumulation storage to store at least the shifted second values.

20 Claims, 19 Drawing Sheets

(56) References Cited

OTHER PUBLICATIONS

Ali Shafiee et al., "Isaac: A Convolutional Neural Network Accelerator with In-Situ Analog Arithmetic in Crossbars," in Proceedings of the 43rd International Symposium on Computer Architecture, ISCA '16, pp. 14-26, Piscataway, NJ, USA, Oct. 5, 2016. IEEE Press (13 pages).
Charles Eckert et al., "Neural Cache: Bit-Serial In-Cache Acceleration of Deep Neural Networks," in Proceedings of the 45th Annual International Symposium on Computer Architecture, ISCA '18, pp. 383-396, Piscataway, NJ, USA, May 9, 2018. IEEE Press (14 pages).
Shaizeen Aga et al., "Compute Caches," in 2017 IEEE International Symposium on High Performance Computer Architecture (HPCA), pp. 481-492, Feb. 2017 (12 pages).
Daichi Fujiki et al., "Duality Cache for Data Parallel Acceleration," in Proceedings of the 46th International Symposium on Computer Architecture, ISCA '19, pp. 397-410, New York, NY, USA, Jun. 22-26, 2019. ACM (14 pages).
J. Wang et al., "A 28-nm Compute SRAM With Bit-Serial Logic/Arithmetic Operations for Programmable In-Memory Vector Computing," IEEE Journal of Solid-State Circuits, 55(1):76-86, Jan. 2020 (11 pages).
Supreet Jeloka et al., "A 28 nm Configurable Memory (TCAM/BCAM/SRAM) Using Push-Rule 6T Bit Cell Enabling Logic-in-Memory," IEEE Journal of Solid-State Circuits, 51(4):1009-1021, Apr. 2016 (13 pages).
P. Hung et al., "Fast Division Algorithm with a Small Lookup Table," in Conference Record of the Thirty-Third Asilomar Conference on Signals, Systems, and Computers (Cat. No. CH37020), vol. 2, pp. 1465-1468 vol. 2, Oct. 24-27, 1999 (4 pages).

Song Han et al., "EIE: Efficient Inference Engine on Compressed Deep Neural Network," in Proceedings of the 43rd International Symposium on Computer Architecture, ISCA '16, p. 243-254. IEEE Press, Jun. 2016 (12 pages).
Y. Bengio and J. Senecal, "Adaptive Importance Sampling to Accelerate Training of a Neural Probabilistic Language Model," IEEE Transactions on Neural Networks, 19(4):713-722, Apr. 2008 (10 pages).
Yoshua Bengio, Nicholas Léonard, and Aaron Courville, "Estimating or Propagating Gradients Through Stochastic Neurons for Conditional Computation," arXiv:1308.3432v1 [cs.LG], Aug. 15, 2013 (12 pages).
A. K. Ramanathan et al., "Look-Up Table based Energy Efficient Processing in Cache Support for Neural Network Acceleration," 2020 53rd Annual IEEE/ACM International Symposium on Microarchitecture (MICRO), Athens, Greece, Oct. 17-21, 2020, pp. 88-101, doi: 10.1109/MICRO50266.2020.00020 (14 pages).
"MICRO 2020: Main Program," 53rd IEEE/ACM International Symposium on Microarchitecture, Oct. 17-21, 2020, available online: https://www.microarch.org/micro53/program/ (21 pages).
Jingyang Zhang, "Exploring Bit-Slice Sparsity in Deep Neural Networks for Efficient ReRAM-Based Deployment," arXiv:1909.08496v2 [cs.LG], Nov. 19, 2019 (5 pages).
Yang et al., "Sparse ReRAM Engine: Joint Exploration of Activation and Weight Sparsity in Compressed Neural Networks," in Proceedings of the 46th International Symposium on Computer Architecture, ISCA '19, pp. 236-249, New York, NY, USA, Jun. 2019, ACM, 14 pages.
Amin et al., "Piecewise Linear Approximation Applied to Nonlinear Function of a Neural Network," IEEE Proceedings-Circuits, Devices and Systems, 144(6):313-317, Dec. 1997, 5 pages.

* cited by examiner

METHODS, APPARATUS, AND ARTICLES OF MANUFACTURE TO IMPROVE IN-MEMORY MULTIPLY AND ACCUMULATE OPERATIONS

CROSS-REFERENCE TO RELATED APPLICATIONS

This patent arises from a U.S. patent application claiming priority to Indian Patent Application Number 202041046226, which was filed on Oct. 23, 2020, Indian Patent Application Number 202041046226 is hereby incorporated herein by reference in its entirety.

FIELD OF THE DISCLOSURE

This disclosure relates generally to in-memory computation, and, more particularly, to methods, apparatus, and articles of manufacture to improve in-memory multiply and accumulate operations.

BACKGROUND

Machine learning models, such as neural networks, are useful tools that have demonstrated their value solving complex problems regarding pattern recognition, natural language processing, automatic speech recognition, etc. Neural networks operate, for example, using artificial neurons arranged into layers that process data from an input layer to an output layer, applying weighting values to the data during the processing of the data. Such weighting values are determined during a training process. The number of layers in a neural network corresponds to the network's depth with more layers corresponding to a deeper network. Many machine learning models execute multiply and accumulate (MAC) operations.

Figure 1:
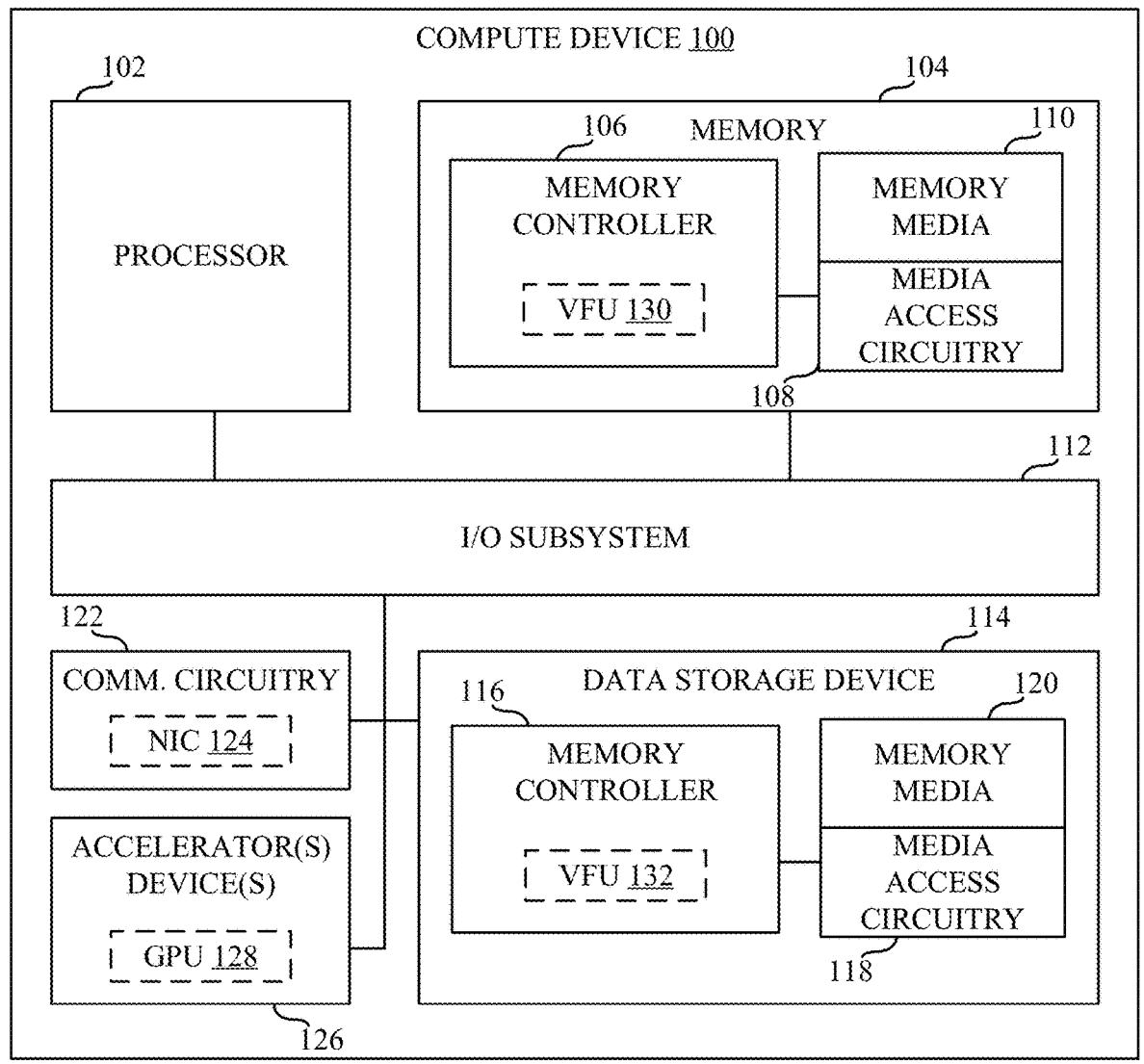
FIG. 1 is a block diagram of an example compute device for improving in-memory multiply and accumulate operations.

The figures are not to scale. In general, the same reference numbers will be used throughout the drawing(s) and accompanying written description to refer to the same or like parts. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other.

Unless specifically stated otherwise, descriptors such as "first," "second," "third," etc. are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions and/or values that may not be exact due to manufacturing tolerances and/or other real-world imperfections. As used herein "substantially real time" refers to occurrence in a near instantaneous manner recognizing there may be real-world delays for computing time, transmission, etc. Thus, unless otherwise specified, "substantially real time" refers to real time+/−1 second. As used herein, "hardwired" and/or "hard-coded" refer to data, circuits, and/or other logic that is implemented as non-configurable (e.g., permanent, long lasting, practically immutable) electronic circuits and/or other hardware.

DETAILED DESCRIPTION

Matrix and vector processing operations are very common in machine learning models. Matrix and vector processing operations include highly data parallel operations that are generally implemented via parallel computing techniques. Enabling high volume parallel computing for machine learning models typically requires that the memory have extensive bandwidth to deliver data to compute logic (sometimes referred to as compute engines). To achieve such bandwidth, designs of circuits, chips, and/or other logic typically require more area and power than devices that do not handle such bandwidth. Additionally, designs that achieve such bandwidth typically add execution delays and increase the energy consumed by the design due to extensive data movement.

Some approaches have placed the compute logic closer to memory which reduces data transfer cost (e.g., energy consumed in transferring data) while also providing access to greater bandwidth. These approaches are referred to generally as processing near memory (PNM). These traditional techniques place compute logic near the memory, where compute logic is implemented by MAC arrays, control circuit(s), and buffers to increase data residency. Such traditional techniques reduce data movement but still do not provide optimal energy efficiency. For example, to enable high volume parallel computing, these approaches typically require multiple instantiations of MAC logic to be placed and routed next to dense memory arrays to increase compute throughput. These additional instantiations inherently limit scalability of traditional PNM designs and impact overall memory density. Additionally, traditional PNM designs are limited by memory interface bandwidth and do not enable high compute and/or memory parallelism. Also, traditional PNM designs can cause thermal and global layout challenges.

Other approaches have implemented MAC logic directly in memory. These approaches are referred to generally as processing in memory (PIM). Many existing PIM designs modify bit-cells of a memory array and perform bit serial computations by activating multiple rows of the memory array. As such, existing PIM designs establish data-dependent bit-line (BL) discharge. Existing PIM designs typically mitigate the limitations of supporting high memory bandwidth and generally offer high potential for parallel computing across all columns of a large memory. However, existing PIM designs impose significant energy consumption due to charging and discharging the BLs. This overhead becomes excessive for complex operations of deep neural network (DNN) and other machine learning model workloads that are broken down into a large sequence of simple BL operations.

Additionally, existing PIM techniques are used in conjunction with modified sense amplifiers or augment digital logic at the edge of the memory array to perform various logical functions within the memory array. These PIM approaches typically require significant modifications to the bit-cell structure and peripheral logic of the memory. Thus, traditional PIM approaches reduce the overall density of memories in which they are implemented. To recover the loss in memory density, existing PIM designs have sought to modify memory as a monolithic three-dimensional (3D) technology. However, traditional PIM approaches impact memory density so severely that they are not feasible for commercial adoption. Additionally, PIM with bit-based algorithms is a relatively new technology that is not well understood and generally is limited in computation types. The technical challenges associated with modifying bit-cells and the loss in memory density have impeded widespread adoption of PIM.

Examples disclosed herein enable deep processing-in-memory without using compute elements. For example, examples disclosed herein include a highly optimized lookup table (LUT)-based approach that achieves highly parallel processing deep in the memory without altering memory bit-cell and periphery circuitry. Thus, examples disclosed herein reduce the impact of PIM designs on overall memory density.

FIG. 1 is a block diagram of an example compute device 100 for improving in-memory multiply and accumulate operations. The example compute device 100 includes an example processor 102, an example memory 104, an example input/output (I/O) subsystem 112, an example data storage device 114, example communication circuitry 122, and example one or more accelerator devices 126. The memory 104 of FIG. 1 includes an example memory controller 106, example media access circuitry 108, and example memory media 110. In some examples, the memory controller 106 of the memory 104 includes an example vector function unit (VFU) 130. The data storage device 114 includes an example memory controller 116, example media access circuitry 118, and example memory media 120. In some examples, the memory controller 116 includes an example VFU 132. In some examples, the communication circuitry 122 includes an example network interface controller (NIC) 124. In some examples, one or more of the one or more accelerator devices 126 include an example graphics processing unit (GPU) 128.

In other examples disclosed herein, the compute device 100 may include other and/or additional components. In some examples, the compute device 100 is in communication with components such as those commonly found in association with a computer (e.g., a display, peripheral devices, etc.). The term "memory," as used herein in reference to performing in-memory multiply and accumulate operations, may refer to the memory 104 and/or the data storage device 114, unless otherwise specified. As explained in more detail herein, example media access circuitry 108, 118 (e.g., any circuitry or device configured to access and operate on data in the corresponding memory media 110, 120) connected to a corresponding memory media 110, 120 (e.g., any device or material that data is written to and read from) may access (e.g., read) data within the corresponding memory media 110, 120 to support general operations of the processor 102. In some examples, the processor 102 may request that the media access circuitry 108, 118 perform one or more MAC operations. In such examples, the media access circuitry 108, 118 forwards the instructions to perform one or more MAC operations to the memory media 110, 120 for PIM. As described further herein, compute logic within the example memory media 110, 120 accesses one or more operands (e.g., values on which to operate) or elements thereof (e.g., one or more 4 bits elements) of vectors and/or matrices to be operated on during the one or more MAC operations. After performing the one or more MAC operations, the compute logic within the example memory media 110, 120 stores the results in the memory media 110, 120 and/or outputs the results to the media access circuitry 108, 118 and/or the processor 102.

In the illustrated example of FIG. 1, the memory media 110 includes one or more banks of static random-access memory (SRAM). Each bank includes one or more sub-banks and each sub-bank includes one or more sub-arrays (SAs). Each SA includes one or more cell arrays (CAs) where each CA includes a group of memory cells placed in rows and columns. For example, each CA may include six trillion memory cells. SAs also include one or more decoders (sometimes referred to as word-line (WL) drivers), one or more I/O sense amplifiers, and one or more timers to enable read and write operations to the one or more CAs. As described herein a sub-bank of SRAM corresponds to a group of SAs where only one SA is accessible at a time. As described herein, a bank of SRAM corresponds to a group of sub-banks of SRAM where only one SA is accessible at a time. In examples disclosed herein, SAs include compute logic to handle MAC operations. Additional detail of the compute logic is illustrated and described in connection with at least FIGS. 2, 3, 4, 5, 6, 7, 8, 9, 10, 11, 12, 13, 14, 15, 16, 17, 18, 19, 20, 21, 22, 23, 24, and 25.

In some examples, the media access circuitry 108 is included in the same die as the memory media 110. In other examples, the media access circuitry 108 is on a separate die but in the same package as the memory media 110. In yet other examples, the media access circuitry 108 is in a separate die and separate package but on the same dual in-line memory module (DIMM) or board as the memory media 110.

The example processor 102 may be implemented as any device or circuitry (e.g., a multi-core processor(s), a microcontroller, and/or other processor or processing/controlling circuit) capable of performing operations described herein, such as executing an application (e.g., an artificial intelligence related application that may be enabled by execution of MAC operations). In some examples disclosed herein, the processor 102 may be implemented as, be in circuit with, or include a field-programmable gate array (FPGA), an application specific integrated circuit (ASIC), reconfigurable hardware or hardware circuitry, or other specialized hardware to facilitate performance of the functions described herein.

The example memory 104, which may include a non-volatile memory (e.g., a far memory in a two-level memory scheme), includes the memory media 110 and the media access circuitry 108 (e.g., a device or circuitry, such as a processor, application specific integrated circuitry (ASIC), or other integrated circuitry constructed from complementary metal-oxide-semiconductors (CMOS) or other materials) in circuit with the memory media 110. The example media access circuitry 108 is also in circuit with the memory controller 106, which may be implemented as any device or circuitry (e.g., a processor, a co-processor, dedicated circuitry, etc.) configured to selectively read from and/or write to the memory media 110 in response to corresponding requests (e.g., from the processor 102 which may be executing an artificial intelligence related application that may be enabled by execution of MAC operations). As described above, in some examples disclosed herein, the memory controller 106 may include the example VFU 130 which may be implemented as any device or circuitry (e.g., dedicated circuitry, reconfigurable circuitry, ASIC, FPGA, etc.) capable of offloading vector-based tasks from the processor 102.

Figure 2:
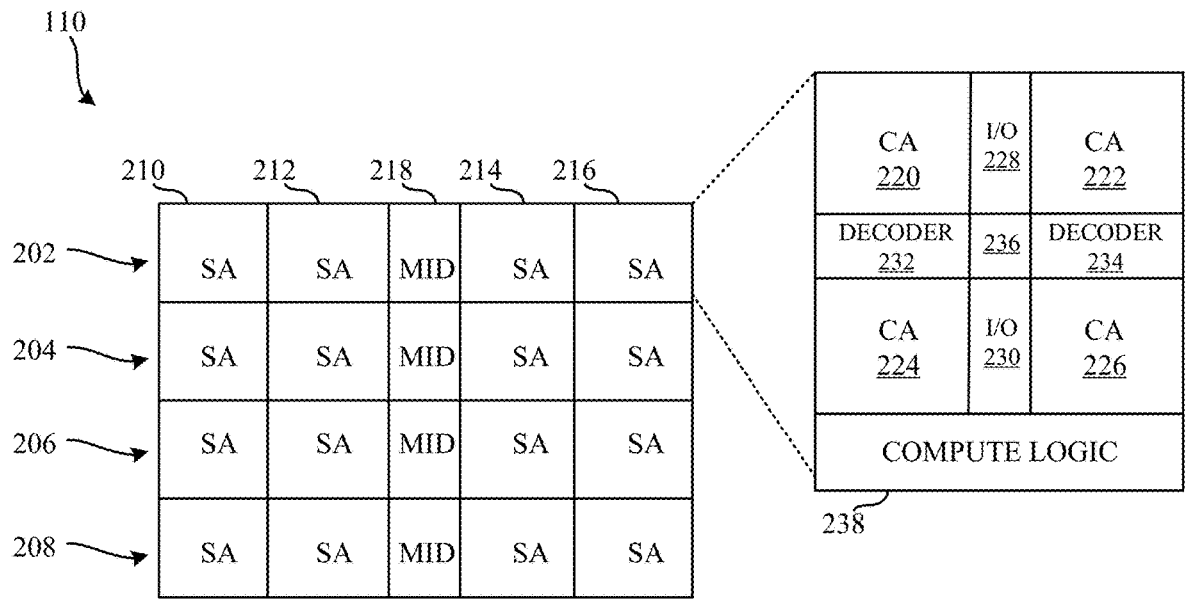
FIG. 2 is a schematic illustration depicting the example memory media of FIG. 1.

Referring briefly to the illustrated example of FIG. 2, the memory media 110 of FIG. 2 illustrates an SRAM bank. The memory media 110 includes example sub-banks 202, 204, 206, and 208. Each of the example sub-banks 202, 204, 206, and 208 includes multiple SAs. For example, sub-bank 202 includes example SAs 210, 212, 214, and 216. The sub-bank 202 includes example middle logic 218 to facilitate data routing and memory access. In the example of FIG. 2, each of the SAs includes one or more CAs, one or more decoders, one or more I/O sense amplifiers, and one or more timers to enable read and/or write operations to the one or more CAs. For example, the SA 216 includes example CAs 220, 222, 224, and 226, example I/O sense amplifiers 228 and 230, example decoders 232 and 234, and an example timer 236. In examples disclosed herein, SAs include example compute logic to handle MAC operations. For example, the SA 216 includes example compute logic 238. Unlike conventional memory devices, the example media access circuitry 108 is configured to offload MAC operations to the compute logic 238 at the request of the memory controller 106, which may produce the request in response to receiving a corresponding request from the processor 102. The example description of FIG. 2 similarly applies to the memory media 120.

In the illustrated example of FIG. 2, the number of SAs within the memory media 110 is dependent on the desired size of the memory media 110, access latency of the memory media 110, performance of the memory media 110, and/or other parameters. For systems with faster access requirements, access latency can be reduced by increasing number of SAs. Increasing the number of SAs may increase area and power consumption of the memory media 110 due to increase in peripheral components and routing interconnects using higher pitch metal layers. For low power memories, larger SAs are preferable. However, there is a tradeoff between SA size and bit-cell access rate. For example, larger SAs reduce bit-cell access rate. In examples disclosed herein, the number of banks, sub-banks, and SAs are selected based on a desired amount of parallelism, power consumption, area consumption, and/or performance metrics. The example compute logic (e.g., the compute logic 238) disclosed herein enables PIM without modifying bit-cells in the corresponding CAs (e.g., CAs 220, 222, 224, and 226) and corresponding peripheral circuitry (e.g., I/O sense amplifiers 228 and 230, decoders 232 and 234, and the timer 236). Examples disclosed herein perform basic compute operations (e.g., multiplication) using a LUT-based compute engine (e.g., compute logic 238) described further herein and for complex compute operations, examples disclosed herein store LUT entries in the SA (e.g., SA 216). The LUT-based compute engine (e.g., compute logic 238) disclosed herein is placed close (e.g., adjacent) to the SA and within the memory (e.g., within the memory media 110). In examples disclosed herein, the compute logic and SA group is referred to as a Comp-SA and facilitates a new memory SA macro.

In the illustrated example of FIG. 2, the bus connecting the ports of the memory media 110 and the SAs (e.g., SAs 210, 212, 214, and 216) is designed such that access latency between each of the SAs and the ports is approximately the same (e.g., for uniform memory). For example, the bus connecting the ports of the memory media 110 and the SAs may be an H-Tree bus which allows equal access latency between each SA and the port of the memory media 110. Because machine learning models frequently transfer data between the memory media 110 and the processor 102, most of the energy consumed and/or time spent in moving the data into and out of the memory media 110 is due to the bus parasitic impedances. Advantageously, the compute logic disclosed herein (e.g., compute logic 238) is adjacent to corresponding SAs. Thus, examples disclosed herein reduce (e.g., eliminate) the energy consumed and/or time spent moving data that is caused by bus parasitic impedances. However, examples disclosed herein do not consume a significant area near the SAs so as to incur significant loss in memory density.

In the illustrated example of FIG. 2, the compute logic (e.g., the compute logic 238) may be visible from visual inspection (e.g., with the naked eye or aided by a magnifying instrument). Generic SRAMs include standard memory cells and decoders whereas examples disclosed herein add additional logic such as multiplexers, adders, wires, and/or a new port to trigger the compute logic in the SRAM which may be visible. Additionally, while executing a machine learning model (e.g., DNN) workload, the example compute logic disclosed herein (e.g., the compute logic 238) may experience an increase in temperature due to the processing in memory. Additionally, examples disclosed herein add a new port to the memory (e.g., memory media 110) to enable PIM. Also, in examples disclosed herein, users provide LUT entries and/or otherwise populate the LUT entries. As such, examples disclosed herein include additional commands and/or an additional application program interface (API) to the compute logic 238. Additionally, when performing PIM addition and/or activation, a user or program dynamically populates LUT entries. Also, to ensure that the weights and activation are loaded into memory and that a command is given to initiate matrix multiplication and/or convolution, examples disclosed herein include one or more corresponding APIs and/or hardware commands.

Referring back to the illustrated example of FIG. 1, the memory 104 may include non-volatile memory and volatile memory. The non-volatile memory may be implemented as any type of data storage capable of storing data in a persistent manner (e.g., a memory capable of storing data even if power is interrupted to the non-volatile memory). For example, the non-volatile memory may be implemented as one or more non-volatile memory devices. The non-volatile memory devices may include any combination of memory devices that use chalcogenide phase change material (e.g., chalcogenide glass), ferroelectric transistor random-access memory (FeTRAM), nanowire-based non-volatile memory, phase change memory (PCM), memory that incorporates memristor technology, Magnetoresistive random-access memory (MRAM) or Spin Transfer Torque (STT)-MRAM. The volatile memory may be implemented as any type of data storage capable of storing data while power is supplied to the volatile memory (e.g., SRAM). For example, the volatile memory may be implemented as one or more volatile memory devices, and is periodically referred to hereinafter as volatile memory with the understanding that the volatile memory may be embodied as other types of non-persistent data storage in other embodiments. The volatile memory devices may include one or more memory devices configured in a bank and/or sub-bank architecture as described above. For example, the volatile memory may include one or more Comp-SAs. In examples disclosed herein, an application scheduler executing on the processor 102 offloads matrix data (e.g., convolutional filter coefficients, input feature maps, etc.) to the bit-cells of the SAs. The example compute logic disclosed herein includes a finite state machine (FSM) to schedule reads from the memory (e.g., data and LUT entries) and to control the compute sequence. The example compute logic disclosed herein also includes lightweight (e.g., low area and/or energy consumption) logic to perform addition for accumulation.

In the illustrated example of FIG. 1, the processor 102 and the memory 104 are in circuit with other components of the compute device 100 via the I/O subsystem 112, which may be implemented as circuitry and/or components to facilitate input/output operations with the processor 102 and/or the memory 104 and other components of the compute device 100. For example, the I/O subsystem 112 may be implemented by and/or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some examples disclosed herein, the I/O subsystem 112 may form a portion of a system-on-a-chip (SoC) and be incorporated, along with one or more of the processor 102, the memory 104, and other components of the compute device 100, in a single chip.

In the illustrated example of FIG. 1, the data storage device 114 may be implemented as any type of device configured for short-term or long-term storage of data such as, for example, memory devices and circuits, memory cards, hard disk drives, solid-state drives, or other data storage device. In the illustrative example of FIG. 1, the data storage device 114 includes a memory controller 116, similar to the memory controller 106, memory media 120 (also referred to as "storage media"), similar to the memory media 110, and media access circuitry 118, similar to the media access circuitry 108. Further, as described above, the memory controller 116 may also include the example VFU 132 similar to the VFU 130. The data storage device 114 may include a system partition that stores data and/or firmware code for the data storage device 114 and/or one or more operating system partitions that store data files and/or executables for operating systems.

In the illustrated example of FIG. 1, the communication circuitry 122 may be implemented as any communication circuit, device, or collection thereof, capable of enabling communications over a network between the compute device 100 and another device. The example communication circuitry 122 may be configured to use any one or more communication technology (e.g., wired or wireless communications) and associated protocols (e.g., Ethernet, Bluetooth®, Wi-Fi®, WiMAX, etc.) to affect such communication.

In some examples, as described above, the illustrative communication circuitry 122 includes the example NIC 124, which may also be referred to as a host fabric interface (HFI). The example NIC 124 may be implemented as one or more add-in-boards, daughter cards, network interface cards, controller chips, chipsets, or other devices that may be used by the compute device 100 to connect with another compute device. In some examples, the NIC 124 may be embodied as part of a system-on-a-chip (SoC) that includes one or more processors or included on a multichip package that also contains one or more processors. In some examples disclosed herein, the NIC 124 may include a local processor (not shown) and/or a local memory (not shown) that are both local to the NIC 124. In such examples, the local processor of the NIC 124 may perform one or more of the functions of the processor 102. Additionally or alternatively, in such examples, the local memory of the NIC 124 may be integrated into one or more components of the compute device 100 at the board level, socket level, chip level, and/or other levels. The one or more example accelerator devices 126 may be embodied as any device(s) or circuitry capable of performing a set of operations faster than the general-purpose processor 102. For example, as described above, the accelerator device(s) 126 may include the example GPU 128, which may be implemented as any device or circuitry (e.g., a co-processor, an ASIC, reconfigurable circuitry, etc.) capable of performing graphics operations (e.g., matrix operations) faster than the processor 102.

Figure 3:
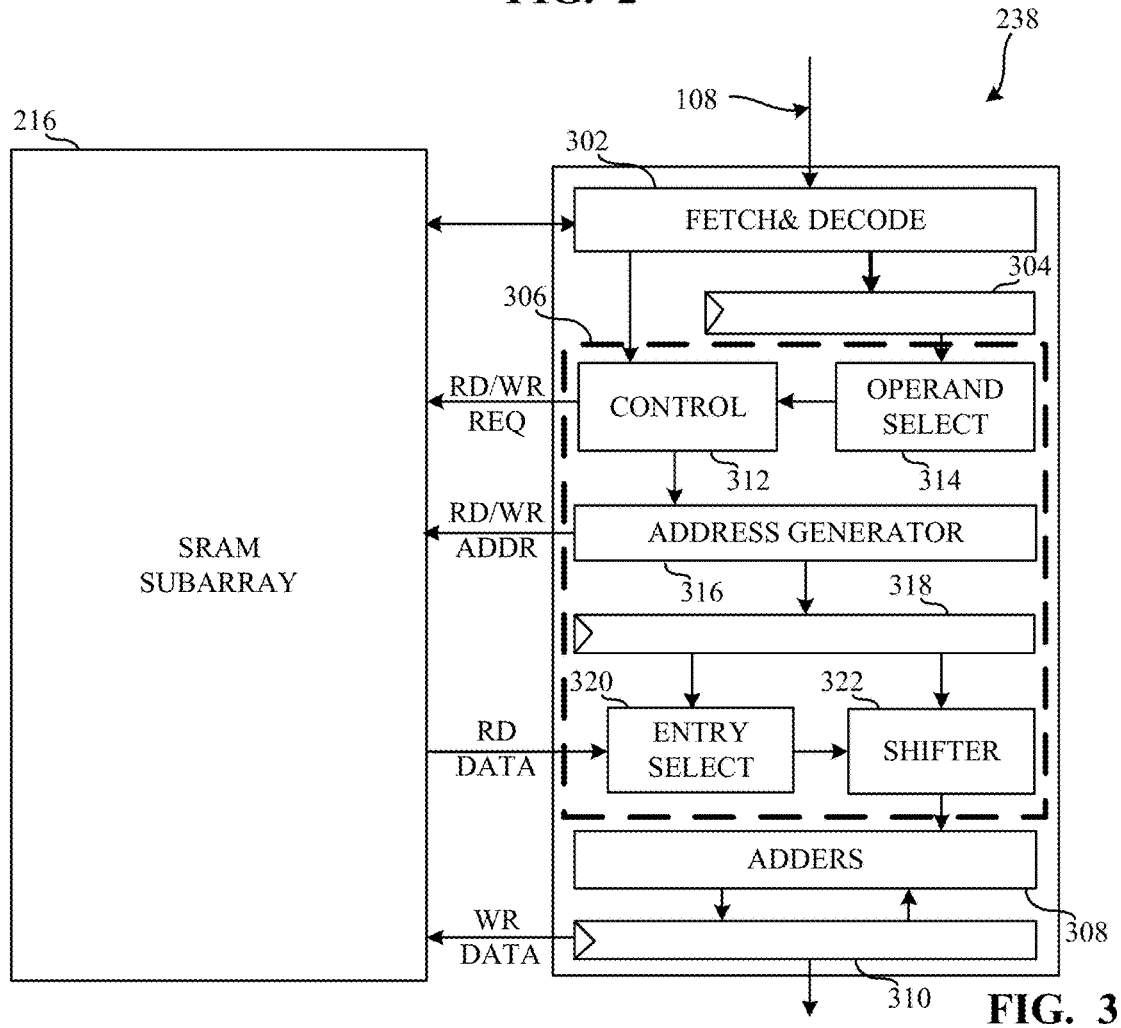
FIG. 3 is a block diagram illustrating additional detail of the compute logic of FIG. 2.

FIG. 3 is a block diagram illustrating additional detail of the compute logic 238 of FIG. 2. In the example of FIG. 3, the compute logic 238 is reconfigurable and can support a large spectrum of machine learning model inference workloads (e.g., DNN workloads, convolutional neural network (CNN) workloads, recurrent neural network (RNN) workloads, transformer model workloads, etc.) which perform different operations such as MAC operations, normalization, element-wise scaler arithmetic, and many non-linear functions. MAC operations are prevalent in many machine learning model inference workloads (e.g., DNN inference workloads). As such, the compute logic 238 disclosed herein includes a hardwired LUT (discussed further herein) dedicated to MAC operations. Additionally, the example SA 216 disclosed herein includes at least two rows (e.g., two or more rows) reserved for operations other than MAC operations (discussed further herein). Similar functionality exists for other compute logic and SAs of the memory media 110.

In the illustrated example of FIG. 3, the compute logic 238 supports 4-bit, 8-bit, and 16-bit integer operations. As such, the example compute logic 238 covers a broad spectrum of machine learning model workloads (e.g., DNN workloads). For example, the compute logic 238 performs integer-to-integer multiplication with the LUT-based approach. Advantageously, the example compute logic 238 reduces (e.g., minimizes) LUT storage costs (e.g., memory consumption) using the 4-bit multiplication capability described herein. The example compute logic 238 handles higher bit multiplication via a shift and add approach (discussed further herein). The example compute logic 238 performs dot-product accumulation via logical adders.

In the illustrated example of FIG. 3, the compute logic 238 is in circuit with the SA 216 and the media access circuitry 108. For example, the compute logic 238 receives requests to perform MAC operations from the media access circuitry 108. In the example of FIG. 3, the compute logic 238 includes example fetch and decode (FAD) logic 302, an example operand register 304, an example compute core 306, example adders 308, and an example accumulation register 310. The example compute core 306 includes example control logic 312, example operand select logic 314, an example address generator 316, an example memory address register 318, example entry select logic 320, and an example shifter 322. In the example of FIG. 3, the control logic 312 transmits read and/or write requests (Rd/Wr Req) to the SA 216. Additionally, the example address generator 316 transmits a corresponding read and/or write address (Rd/Wr Addr) to the SA 216. For write requests, the example compute logic 238 also transmits write data (Wr Data) to the SA 216 via the accumulation register 310. In response to a read request, the example SA 216 generates read data (Rd Data) and transmits the read data to the entry select logic 320.

In the illustrated example of FIG. 3, the FAD logic 302 is in circuit with the operand register 304, the control logic 312, the SA 216, and the media access circuitry 108 to fetch and decode instructions to perform operations in response to one or more requests from the media access circuitry 108. The example operand register 304 is in circuit with the FAD logic 302 and the operand select logic 314. The example control logic 312 is in circuit with the FAD logic 302, the operands select logic 314, the address generator 316, and the SA 216. The example operand select logic 314 is in circuit with the operand register 304 and the control logic 312. The example address generator 316 is in circuit with the control logic 312, the memory address register 318, and the SA 216. The example memory address register 318 is in circuit with the address generator 316, the entry select logic 320, and the shifter 322. The example entry select logic 320 is in circuit with the SA 216, the memory address register 318, and the shifter 322. The example shifter 322 is in circuit with the memory address register 318, the entry select logic 320, and the adders 308. The example adders 308 are in circuit with the shifter 322 and the accumulation register 310. The example accumulation register 310 is in circuit with the SA 216, the adders 308, and the media access circuitry 108. Although components of FIG. 3 are illustrated in circuit with other components using a single line, inter-component connections may be implemented using multiple connection lines to accommodate parallel multi-bit values and/or multiple control signal lines. Additionally, while some components are shown directly connected to other components in examples illustrated herein, in some implementations there may be other components and/or circuitry connected between such components. Also, while not illustrated in FIG. 3, additional connections between various components of the compute logic 238 may exist.

In the illustrated example of FIG. 3, the FAD logic 302 is implemented by a program counter, a memory data register, and/or an instruction register. In example operations to fetch and decode instructions, the FAD logic 302 transmits the value of the program counter to the control logic 312. The value of the program counter specifies an address within the example SA 216 from which the compute logic 238 is to read an instruction. The example control logic 312 forwards the value of the program counter to the address generator 316 and transmits a read request to the SA 216 to access the instruction from the SA 216 according to the value of the program counter. The example address generator 316 transmits the address from which to read the instruction in the SA 216 as specified by the value of the program counter.

In example operation to fetch and decode instructions, in response to receiving a read request from the control logic 312 and a corresponding address from the address generator 316, the SA 216 returns the data stored in the memory location specified by the address generator 316. For example, the SA 216 transmits the data stored in the memory location to the FAD logic 302. The example FAD logic 302 stores the data received from the SA 216 in the memory data register. The data retrieved from the example SA 216 is an instruction. As such, the example FAD logic 302 copies the data to the instruction register.

In example operation to fetch and decode instructions, the data retrieved from the SA 216 includes an opcode and an operand. The opcode specifies an operation (e.g., MAC operation) that the compute logic 238 is to perform on data specified by the operand. The operand specifies the address in the example SA 216 where data will be read from or written to depending on the operation. In some examples, the data specified by the operand is referred to as the operand. In examples disclosed herein, operands are retrieved in groups of elements where each element corresponds to four bits. After the FAD logic 302 copies the data to the instruction register, the FAD logic 302 transmits the opcode to the control logic 312. The example FAD logic 302 also transmits the operand to the operand register 304. The example control logic 312 decodes the opcode to determine the operation (e.g., load, add, store, MAC, etc.) to perform on the data specified by the operand.

In the illustrated example of FIG. 3, the operand register 304 stores one or more operands on which the compute logic 238 is to operate. The example operand select logic 314 selects the operand corresponding to the opcode, that the control logic 312 receives from the FAD logic 302 and transmits the selected operand to the control logic 312. In the example of FIG. 3, the compute logic 238 performs 4-bit, 8-bit, and/or 16-bit MAC operations. An example 4-bit MAC operation corresponding to matrix multiplication is illustrated below in Equation 1.

$$\begin{bmatrix} \frac{A_0}{1110} & \frac{A_1}{0100} \\ \frac{A_2}{1100} & \frac{A_3}{1000} \end{bmatrix} * \begin{bmatrix} \frac{B_0}{1110} & \frac{B_1}{0100} \\ \frac{B_2}{1100} & \frac{B_3}{1000} \end{bmatrix} = \quad \text{Equation 1}$$

$$\begin{bmatrix} \frac{C_0}{0000\ 1111\ 0100} & \frac{C_1}{0000\ 0101\ 1000} \\ \frac{A_2}{0001\ 0000\ 1000} & \frac{A_3}{0000\ 0111\ 0000} \end{bmatrix}$$

In the example of Equation 1, the first operand of matrix A includes $A_0$ and $A_1$. The first element of the first operand of matrix A includes $A_0$ and the second element of the first operand of matrix A includes $A_1$. The second operand of matrix A includes $A_2$ and $A_3$. The first element of the second operand of matrix A includes $A_2$ and the second element of the second operand of matrix A includes $A_3$. Similar relationships exist for matrix B and matrix C (e.g., a product matrix).

In example processing of operands, the control logic 312 forwards the operand corresponding to the opcode to the address generator 316. Based on the opcode, the example control logic 312 transmits a read or write request to the SA 216. For example, if the opcode corresponds to a load operation, then the control logic 312 transmits a read request to the SA 216. In some examples (e.g., when the opcode calls for a MAC operation), the control logic 312 does not transmit a read and/or write request to the SA 216, but instead only forwards the operand to the address generator 316. The example address generator 316 transmits the operand (e.g., address corresponding to the data on which to be operated) corresponding to the opcode to the SA 216. The example address generator 316 also loads the memory address register 318 with the operand. In some examples (e.g., when the opcode calls for a MAC operation), the address generator 316 does not transmit the operand to the SA 216, but instead only forwards the operand to the memory address register 318.

In example processing of operands, based on the selected operand received from the address generator 316, the SA 216 transmits the data stored at the address of the operand to the entry select logic 320. The example entry select logic 320 forwards the data stored at the address of the operand to the shifter 322. In examples where the address generator 316 does not transmit the operand to the SA 216 (e.g., when the opcode calls for a MAC operation), the entry select logic 320 reads the operand from the memory address register 318. Based on the value of the operand stored in the example memory address register 318, the entry select logic 320 generates one or more values based on hardwired values within the entry select logic 320.

In example processing of operands, based on the operand, the shifter 322 either (1) shifts the data stored at the address of the operand and forwards the data to the adders 308 or (2) forwards the data stored at the address of the operand to the adders 308. The example adders 308 then add the data corresponding to the operand to the data stored in the accumulation register 310 and stores the sum in the accumulation register 310. In some examples, the accumulation register 310 stores the sum in the SA 216. In additional or alternative examples, the accumulation storage returns the sum to the media access circuitry 108. In the example of FIG. 3, the SA 216 does not store LUT entries for 4-bit multiplication operation but instead, can store LUT entries for more complex operations such as activation.

Figure 4:
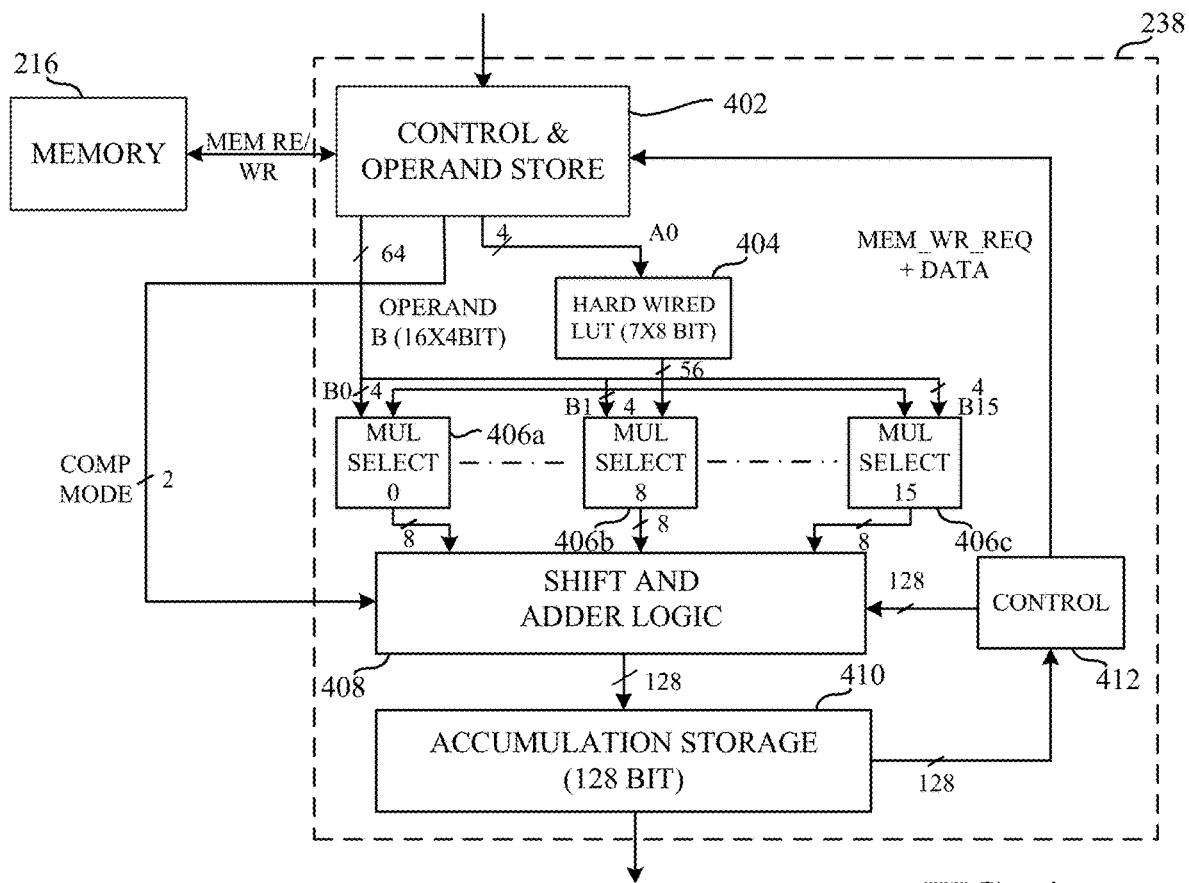
FIG. 4 is a block diagram illustrating additional detail of the compute logic of FIG. 3.

FIG. 4 is a block diagram illustrating additional detail of the example compute logic 238 of FIG. 3. In the example of FIG. 4, the compute logic 238 includes example control logic and operand storage 402, an example hardwired LUT multiplexer 404, an example first select multiplexer 406a, an example second select multiplexer 406b, an example nth select multiplexer 406c, example shift and adder logic 408, example accumulation storage 410, and example control logic 412. In the example of FIG. 4, the compute logic 238 is in circuit with the SA 216 and the media access circuitry 108.

In the illustrated example of FIG. 4, the control logic and operand storage 402 may be implemented by the FAD logic 302, the operand register 304, the control logic 312, the operand select logic 314, the address generator 316, and/or the memory address register 318 of FIG. 3. The example control logic and operand storage 402 includes a first input terminal in circuit with the SA 216, a second input terminal in circuit with the control logic 412, and a third input terminal in circuit with the media access circuitry 108. The example control logic and operand storage 402 includes first output terminals in circuit with the hardwired LUT multiplexer 404; second output terminals in circuit with the first select multiplexer 406a, the second select multiplexer 406b, and the nth select multiplexer 406c; and third output terminals in circuit with the shift and adder logic 408.

In the illustrated example of FIG. 4, the hardwired LUT multiplexer 404 includes select terminals and output terminals. The select terminals of the example hardwired LUT multiplexer 404 are in circuit with the first outputs of the control logic and operand storage 402 to receive a first element $A_0$ of a first operand as a 4-bit value. In the example of FIG. 4, the first operand corresponds to a first row of a first matrix on which to be operated. The output terminals of the example hardwired LUT multiplexer 404 are in circuit with the first select multiplexer 406a, the second select multiplexer 406b, and the nth select multiplexer 406c.

In the illustrated example of FIG. 4, each of the first select multiplexer 406a, the second select multiplexer 406b, and the nth select multiplexer 406c includes select terminals, input terminals, and output terminals. In the example of FIG. 4, the select terminals of the example first select multiplexer 406a are in circuit with first ones of the second output terminals of the control logic and operand storage 402. The input terminals of the example first select multiplexer 406a are in circuit with the output terminals of the hardwired LUT multiplexer 404. The output terminals of the example first select multiplexer 406a are in circuit with the shift and adder logic 408.

In the illustrated example of FIG. 4, the select terminals of the example second select multiplexer 406b are in circuit with second ones of the second output terminals of the control logic and operand storage 402. The input terminals of the example second select multiplexer 406b are in circuit with the output terminals of the hardwired LUT multiplexer 404. The output terminals of the example second select multiplexer 406b are in circuit with the shift and adder logic 408.

In the illustrated example of FIG. 4, the select terminals of the example nth select multiplexer 406c are in circuit with third ones of the second output terminals of the control logic and operand storage 402. The input terminals of the example nth select multiplexer 406c are in circuit with the output terminals of the hardwired LUT multiplexer 404. The output terminals of the example nth select multiplexer 406c are in circuit with the shift and adder logic 408. In the example of FIG. 4, the hardwired LUT multiplexer 404, the first select multiplexer 406a, the second select multiplexer 406b, and/or the nth select multiplexer 406c implement the entry select logic 320. In the example of FIG. 4, each of the first select multiplexer 406a, the second select multiplexer 406b, and the nth select multiplexer 406c receive an element (e.g., Bo, Bi, Bo, respectively) of a second operand as a 4-bit value. In the example of FIG. 4, the second operand corresponds to a first row of a second matrix on which to be operated.

In the illustrated example of FIG. 4, the shift and adder logic 408 may be implemented by the adders 308 and/or the shifter 322 of FIG. 3. The example shift and adder logic 408 includes first input terminals, second input terminal, third input terminals, and output terminals. In the example of FIG. 4, the first input terminals of the shift and adder logic 408 are in circuit with the third output terminals of the control logic and operand storage 402. In the example of FIG. 4, first ones of the second input terminals of the shift and adder logic 408 are in circuit with the output terminals of the first select multiplexer 406a. In the example of FIG. 4, second ones of the second input terminals of the shift and adder logic 408 are in circuit with the output terminals of the second select multiplexer 406b. In the example of FIG. 4, third ones of the second input terminals of the shift and adder logic 408 are in circuit with the output terminals of the nth select multiplexer 406c. In the example of FIG. 4, the third input terminals of the shift and adder logic 408 are in circuit with the control logic 412. In the example of FIG. 4, the output terminals of the shift and adder logic 408 are in circuit with the accumulation storage 410. The shift and adder logic 408 additionally receives the first and second operands (not illustrated).

In the illustrated example of FIG. 4, the accumulation storage 410 includes input terminals, first output terminals, and second output terminals. The input terminals of the example accumulation storage 410 are in circuit with the output terminals of the shift and adder logic 408. The first output terminals of the example accumulation storage 410 are in circuit with the control logic 412. The second output terminals of the example accumulation storage 410 are in circuit with the media access circuitry 108. In the example of FIG. 4, the accumulation storage 410 may be partitioned to represent elements of a product matrix. For example, the accumulation storage 410 may be partitioned to represent a first element (e.g., $C_0$), a second element (e.g., $C_1$), a third element (e.g., $C_2$), and/or a fourth element (e.g., $C_3$) of a product matrix. The example control logic 412 includes input terminals, first output terminals, and second output terminals. In the example of FIG. 4, the input terminals of the control logic 412 are in circuit with the output terminals of the accumulation storage 410. In the example of FIG. 4, the first output terminals of the control logic 412 is in circuit with the third input terminals of the shift and adder logic 408. In the example of FIG. 4, the second output terminals of the control logic 412 are in circuit with the second input terminal of the control logic and operand storage 402.

In example operation, the control logic and operand storage 402 reads operands from the SA 216 and stores the operands in a local register (e.g., the operand register 304). In the example of FIG. 4, the first input of the control logic and operand storage 402 is implemented by an eight-byte (e.g., 8B) interface. As such, the example control logic and operand storage 402 reads sixteen elements of a first operand (e.g., operand A) (e.g., 64 bits, 8 bytes, one row of a matrix A) and sixteen elements a second operand (e.g., operand B) (e.g., 64 bits, 8 bytes, one row of a matrix B) and stores the 16 elements of the first operand and 16 elements of the second operand in the control logic and operand storage 402. In the example of FIG. 4, the control logic and operand storage 402 generates a 2-bit value at the third output terminals of the control logic and operand storage 402 that specifies whether the shift and adder logic 408 is operating on 4-bit, 8-bit, and/or 16-bit values.

In the illustrated example of FIG. 4, to increase (e.g., maximize) the operand reuse and reduce partial write/reads, the control logic and operand storage 402 transmits one element of the first operand (e.g., operand A) (e.g., 4-bits) to the hardwired LUT multiplexer 404. Based on the element of the first operand, the example hardwired LUT multiplexer 404 returns (e.g., generates) all possible products of two odd 4-bit numbers, excluding the number one (e.g., 3, 5, 7, 9, 11, 13, and 15) where one of the 4-bit numbers corresponds to the value of the element of the first operand. As such, the hardcoded LUT entries represent products of four-bit numbers. For example, the hardwired LUT multiplexer 404 generates values representative of a first one of the columns of the hardwired LUT (discussed further herein) based on the first element of the first operand received from the control logic and operand storage 402. The example hardwired LUT multiplexer 404 broadcasts the possible products to the input terminals of the first select multiplexer 406a, the second select multiplexer 406b, and the nth select multiplexer 406c. In the example of FIG. 4, the hardwired LUT multiplexer 404 transmits a 56-bit value to each of the first select multiplexer 406a, the second select multiplexer 406b, and the nth select multiplexer 406c.

Figure 10:
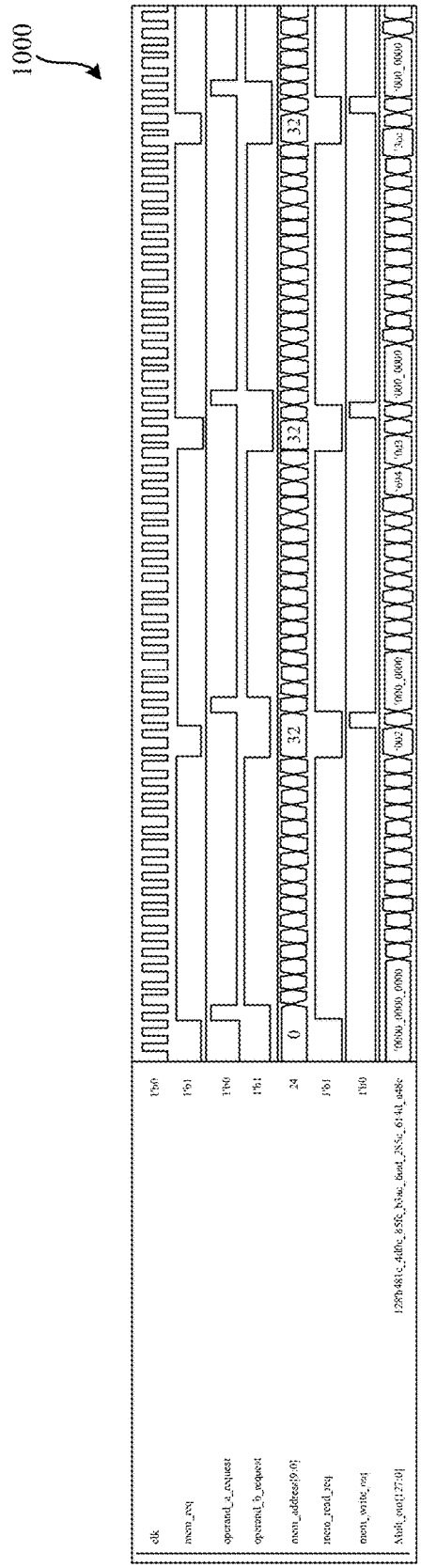
FIG. 10 is a graphical illustration of a timing diagram illustrating example operation of the compute logic of FIGS. 2, 3, 4, 5, 8, and/or 9.

In the illustrated example of FIG. 4, the first select multiplexer 406a, the second select multiplexer 406b, and the nth select multiplexer 406c generate values representative of respective rows of the first one of the columns of the LUT based on the element of the second operand (e.g., operand B) received by the first select multiplexer 406a, the second select multiplexer 406b, and the nth select multiplexer 406c, respectively. In the example of FIG. 4, the first select multiplexer 406a, the second select multiplexer 406b, and the nth select multiplexer 406c transmit 8-bit values to the shift and adder logic 408. As illustrated in FIG. 4, n equals fifteen. As such, there are 16 instances of the select multiplexers (e.g., the first select multiplexer 406a, the second select multiplexer 406b, the nth select multiplexer 406c, etc.) with one element (e.g., 4-bits) of the second operand (e.g., operand B) per select multiplexer. Example waveforms representative of the operation of the compute logic 238 of FIG. 4 with respect to 4-bit operations are illustrated in FIG. 10. For higher bit (e.g., 8-bit, 16-bit, higher precision, etc.) operations, the single elements of the second operand (e.g., operand B) are maintained within the select multiplexers for two or more clock cycles and the control logic and operand storage 402 changes the operands appropriately to generate partial products (additional detail of 8-bit and 16-bit operation is discussed further herein).

Figure 11:
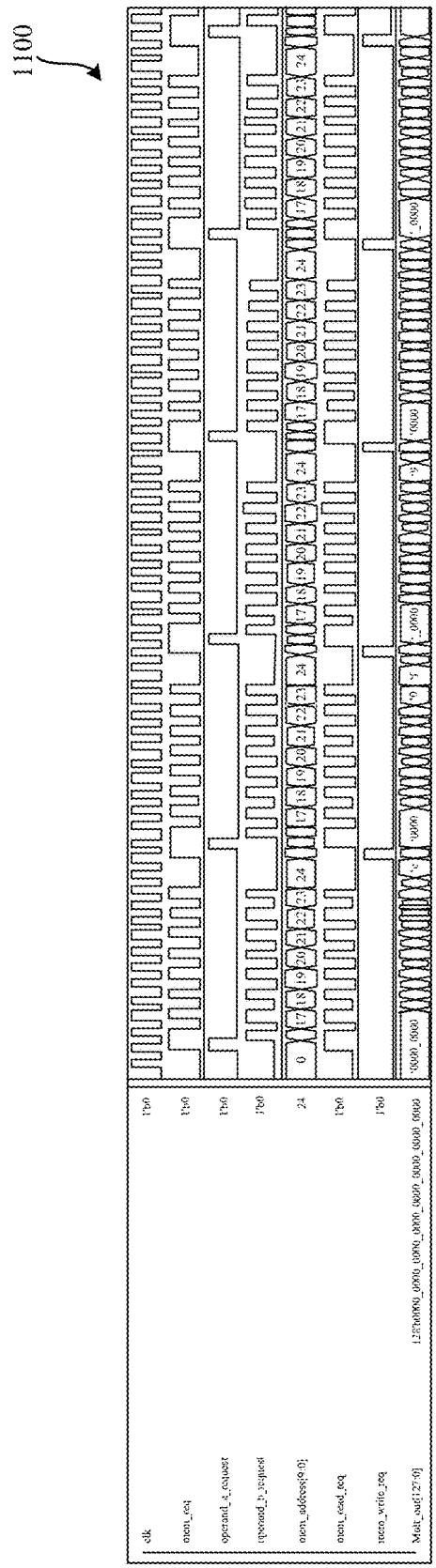
FIG. 11 is a graphical illustration of a timing diagram illustrating example operation of the compute logic of FIGS. 2, 3, 4, 5, 8, and/or 9.
Figure 12:
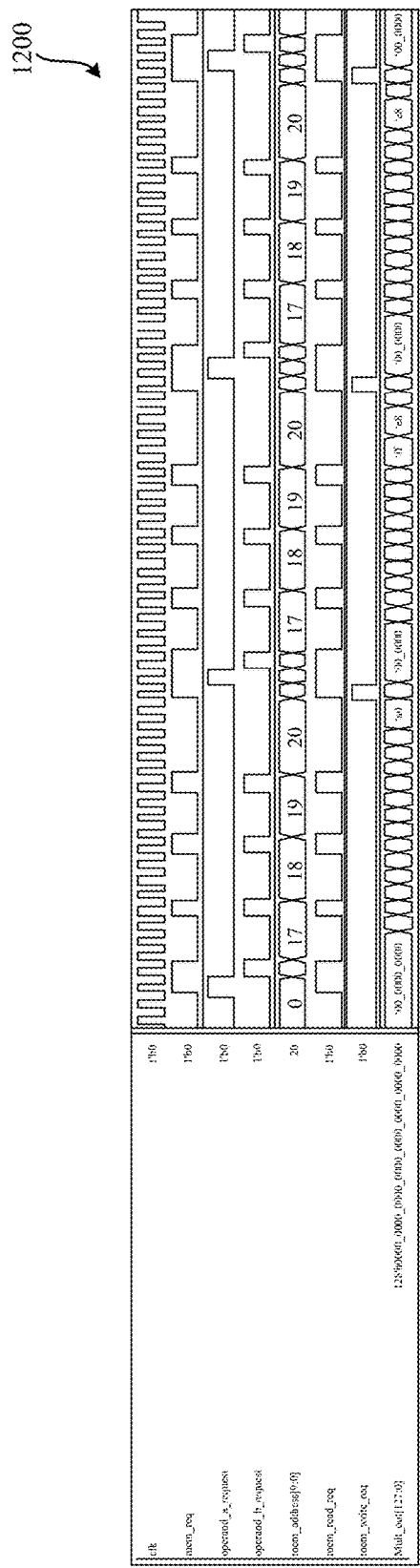
FIG. 12 is a graphical illustration of a timing diagram illustrating example operation of the compute logic of FIGS. 2, 3, 4, 5, 8, and/or 9.

For example, for 8-bit operations, single elements of the second operand (e.g., operand B) are maintained within the select multiplexers for two clock cycles. Example waveforms representative of the operation of the compute logic 238 of FIG. 4 with respect to 8-bit operations are illustrated in FIG. 11. Alternatively, for 16-bit operations, single elements of the second operand (e.g., operand B) are maintained within the select multiplexers for four clock cycles. Example waveforms representative of the operation of the compute logic 238 of FIG. 4 with respect to 16-bit operations are illustrated in FIG. 12.

In example operation, the shift and adder logic 408 handles partial products and enables accumulation of previous values after any appropriate shift to the values generated by the select multiplexers. For example, the shift and adder logic 408 determines whether to shift the values at the output of the select multiplexers based on at least one of the first element of the first operand (e.g., operand A) or the respective elements of the second operand (e.g., operand B) received by the select multiplexers. Example truth tables describing the shifting operations are discussed further herein. Additionally or alternatively, the example shift and adder logic 408 can bypass the hardwired LUT multiplexer 404, the first select multiplexer 406a, the second select multiplexer 406b, and the nth select multiplexer 406c for certain values of the first operand and/or the second operand. For example, if the value of at least one of the first operand or the second operand is equal to 0, 1, 2, 4, and/or 8, the shift and adder logic 408 can bypass the hardwired LUT multiplexer 404, the first select multiplexer 406a, the second select multiplexer 406b, and the nth select multiplexer 406c.

In the illustrated example of FIG. 4, the shift and adder logic 408 generates and transmits a 128-bit value to the accumulation storage 410. The example accumulation storage 410 stores the accumulated values. In the example of FIG. 4, the accumulation storage 410 can store 128 bits of data. The example accumulation storage 410 transmits the accumulated values to the control logic 412. In the example of FIG. 4, the accumulation storage 410 transmits a 128-bit value to the control logic 412. The example control logic 412 either (1) feeds the accumulated values back to the shift and adder logic 408 for further accumulation or (2) transmits the accumulated values to the SA 216. In the example of FIG. 4, if the control logic 412 determines to feedback the accumulated values to the shift and adder logic 408, the control logic 412 transmits a 128-bit value to the shift and adder logic 408. The example compute logic 238 disclosed herein facilitates sixteen 4-bit MAC operations, four 8-bit MAC operations, and one 16-bit MAC operation per clock cycle. The number of MAC operations facilitated by the example compute logic 238 can be increased by replicating the hardwired LUT multiplexer 404, the first select multiplexer 406a, the second select multiplexer 406b, the nth select multiplexer 406c, the shift and adder logic 408, the accumulation storage 410, and the control logic 412 whereas the control logic and operand storage 402 may be shared between the replicated components.

Figure 5:
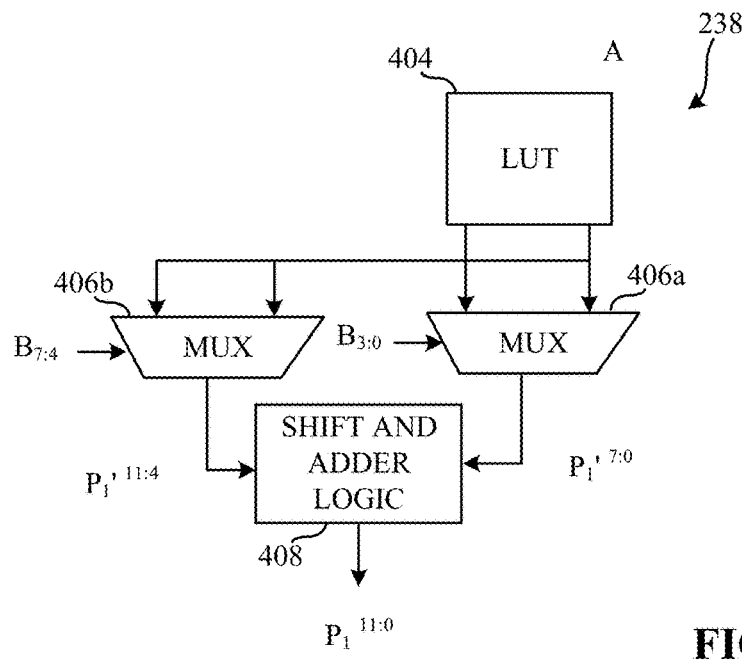
FIG. 5 is an alternate block diagram of the compute logic illustrated in FIG. 4.

FIG. 5 is an alternate block diagram of the example compute logic 238 illustrated in FIG. 4. In the example of FIG. 5, the hardwired LUT multiplexer 404 receives one element of a first operand (e.g., operand A) (e.g., 4-bits) and returns (e.g., generates), based on the element of the first operand, all possible products of two odd 4-bit numbers, excluding the number one (e.g., 3, 5, 7, 9, 11, 13, and 15) where one of the 4-bit numbers corresponds to the value of the element of the first operand. For example, the hardwired LUT multiplexer 404 generates values representative of a first one of the columns of the hardwired LUT (discussed further herein) based on the first element of the first operand (e.g., operand A) received from the control logic and operand storage 402. The example hardwired LUT multiplexer 404 broadcasts the possible products to the input terminals of the first select multiplexer 406a and the second select multiplexer 406b.

In the illustrated example of FIG. 5, the first select multiplexer 406a and the second select multiplexer 406b generate values representative of respective rows of the first one of the columns of the LUT based on the element of the second operand (e.g., operand B) received by the first select multiplexer 406a and the second select multiplexer 406b, respectively. In the example of FIG. 5, the first select multiplexer 406a and the second select multiplexer 406b transmit 8-bit values to the shift and adder logic 408. In the example of FIG. 5, the first select multiplexer 406a generates an 8-bit value (e.g., $P_1^{'7:0}$) and transmits the 8-bit value to the shift and adder logic 408. In the example of FIG. 5, the second select multiplexer 406b generates an 8-bit value (e.g., $P_1^{'11:4}$) and transmits the 8-bit value to the shift and adder logic 408. In the example of FIG. 5, the shift and adder logic 408 generates a 12-bit value (e.g., $P_1^{11:0}$) based on the 8-bit values (e.g., $P_1^{'7:0}$ and $P_1^{'11:4}$). In the example of FIG. 5, the shift and adder logic 408 determines whether to shift the 12-bit value, and after applying a shift (if the shift and adder logic 408 determines a shift is applicable), transmits the 12-bit value to the accumulation storage 410.

Figure 6:
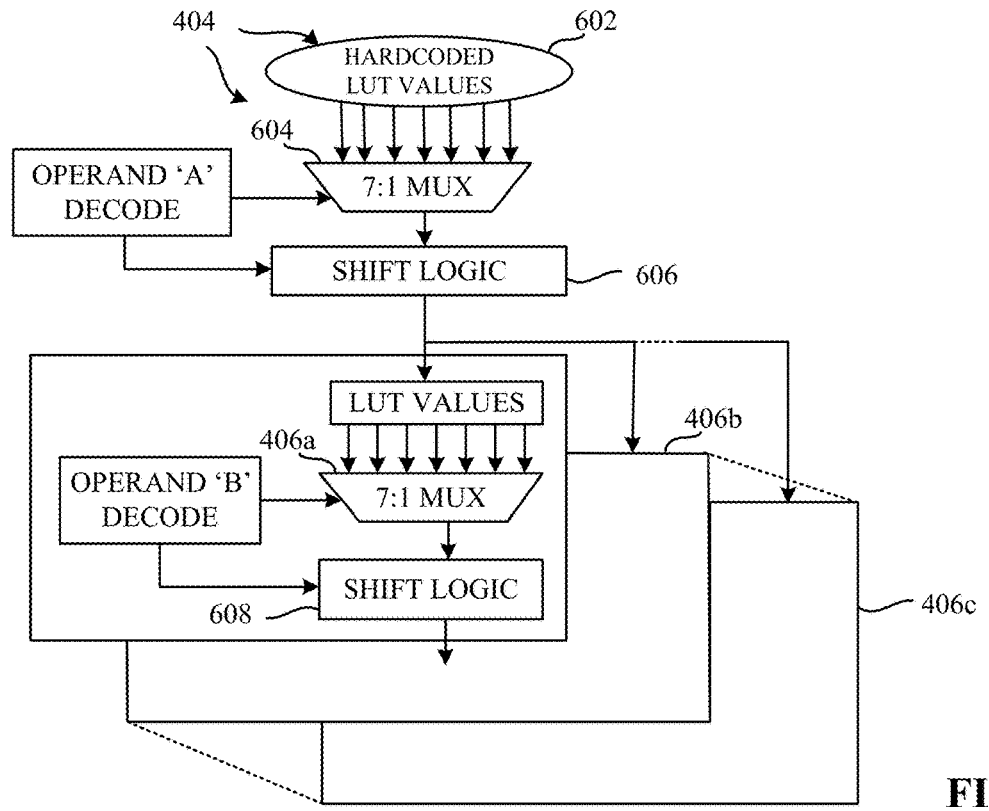
FIG. 6 is a block diagram illustrating additional detail of the hardwired LUT multiplexer, the first select multiplexer, the second select multiplexer, the nth select multiplexer, and the shift and adder logic of FIG. 4.

FIG. 6 is a block diagram illustrating additional example detail of the hardwired LUT multiplexer 404, the first select multiplexer 406a, the second select multiplexer 406b, the nth select multiplexer 406c, and the shift and adder logic 408 of FIG. 4. In the example of FIG. 6, the hardwired LUT multiplexer 404 includes example hardcoded LUT values 602 and an example first multiplexer 604. The second select multiplexer 406b and the nth select multiplexer 406c include similar components to those illustrated and described with respect to the first select multiplexer 406a.

In the illustrated example of FIG. 6, the first multiplexer 604 includes select terminals, input terminals, and output terminals. The select terminals of the example first multiplexer 604 are in circuit with the control logic and operand storage 402 and receive a first element of a first operand (e.g., operand A). The input terminals of the example first multiplexer 604 are in circuit with the hardcoded LUT values 602. In this manner, the input terminals of the example first multiplexer 604 are hardwired to represent respective columns of a LUT. In the example of FIG. 6, each column of the LUT corresponds to 56-bits or seven rows of 8-bit values. Based on the value of the first element of the operand A, the example first multiplexer 604 generates values representative of a first one of the columns. In the example of FIG. 6, the example first multiplexer 604 generates a 56-bit value or seven rows of 8-bit values. The output terminals of the example first multiplexer 604 are in circuit with example first shift logic 606.

In the illustrated example of FIG. 6, the first shift logic 606 includes first input terminals, second input terminals, and output terminals. The first input terminals of the example first shift logic 606 are in circuit with the output terminals of the first multiplexer 604. The second input terminals of the example first shift logic 606 are in circuit with the control logic and operand storage 402 to receive the first element of the operand A. The output terminals of the example first shift logic 606 are in circuit with the first select multiplexer 406a. The example first shift logic 606 shifts the values generated by the first multiplexer 604 based on the value of the first element of the operand A.

In the illustrated example of FIG. 6, the select terminals of the first select multiplexer 406a are in circuit with the control logic and operand storage 402 and receive a first element of a second operand (e.g., operand B). The input terminals of the example first select multiplexer 406a are in circuit with the output terminals of the first shift logic 606. Based on the value of the first element of the second operand, the example first select multiplexer 406a generates values representative of a row of the first one of the columns received by the first select multiplexer 406a. In the example of FIG. 6, the first select multiplexer 406a generates an 8-bit value representative of the row of the first one of the columns received by the first select multiplexer 406a. The output terminals of the example first select multiplexer 406a are in circuit with example second shift logic 608.

In the illustrated example of FIG. 6, the second shift logic 608 includes first input terminals, second input terminals, and output terminals. The first input terminals of the example second shift logic 608 are in circuit with the output terminals of the first select multiplexer 406a. The second input terminals of the example second shift logic 608 are in circuit with the control logic and operand storage 402 to receive the first element of the second operand. The output terminals of the example second shift logic 608 are in circuit with the shift and adder logic 408. The example second shift logic 608 shifts the values generated by the first select multiplexer 406a based on the value of the first element of the second operand. In the example of FIG. 6, the first shift logic 606 and the second shift logic 608 implement a portion of the shift and adder logic 408.

Figure 7:
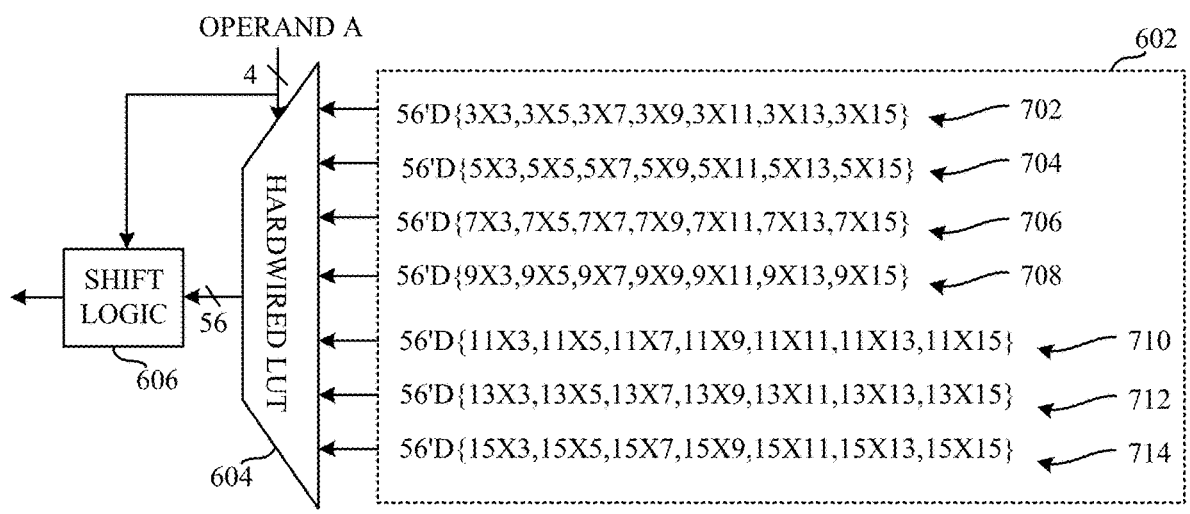
FIG. 7 is a block diagram illustrating additional detail of the hardcoded LUT values.

FIG. 7 is a block diagram illustrating additional detail of the hardcoded LUT values 602. In the example of FIG. 7, the hardcoded LUT values 602 include an example first column 702, an example second column 704, an example third column 706, an example fourth column 708, an example fifth column 710, an example sixth column 712, and an example seventh column 714. In the example of FIG. 7, each of the first column 702, the second column 704, the third column 706, the fourth column 708, the fifth column 710, the sixth column 712, and the seventh column 714 includes 56-bits and is representative of one of the columns of the hardwired LUT where each column includes all possible products of two odd 4-bit numbers, excluding the number one (e.g., 3, 5, 7, 9, 11, 13, and 15) and where one of the 4-bit numbers corresponds to the value of an element of an operand.

In the illustrated example of FIG. 7, the first column 702 corresponds to the products of three and other odd 4-bit numbers excluding the number one. The example second column 704 corresponds to the products of five and other odd 4-bit numbers excluding the number one. The example third column 706 corresponds to the products of seven and other odd 4-bit numbers excluding the number one. The example fourth column 708 corresponds to the products of nine and other odd 4-bit numbers excluding the number one. The example fifth column 710 corresponds to the products of eleven and other odd 4-bit numbers excluding the number one. The example sixth column 712 corresponds to the products of thirteen and other odd 4-bit numbers excluding the number one. The example seventh column 714 corresponds to the products of fifteen and other odd 4-bit numbers excluding the number one. For example, the hardcoded LUT values 602 are illustrated in Table 1 below.

TABLE 1

| Hardcoded LUT Values | | | | | | |
|---|---|---|---|---|---|---|
| 702 | 704 | 706 | 708 | 710 | 712 | 714 |
| 3 × 3 | 5 × 3 | 7 × 3 | 9 × 3 | 11 × 3 | 13 × 3 | 15 × 3 |
| 3 × 5 | 5 × 5 | 7 × 5 | 9 × 5 | 11 × 5 | 13 × 5 | 15 × 5 |
| 3 × 7 | 5 × 7 | 7 × 7 | 9 × 7 | 11 × 7 | 13 × 7 | 15 × 7 |
| 3 × 9 | 5 × 9 | 7 × 9 | 9 × 9 | 11 × 9 | 13 × 9 | 15 × 9 |
| 3 × 11 | 5 × 11 | 7 × 11 | 9 × 11 | 11 × 11 | 13 × 11 | 15 × 11 |
| 3 × 13 | 5 × 13 | 7 × 13 | 9 × 13 | 11 × 13 | 13 × 13 | 15 × 13 |
| 3 × 15 | 5 × 15 | 7 × 15 | 9 × 15 | 11 × 15 | 13 × 15 | 15 × 15 |

In the illustrated example of FIG. 7, based on the value of the first element of a first operand (e.g., operand A), the first multiplexer 604 generates values representative of a first one of the first column 702, the second column 704, the third column 706, the fourth column 708, the fifth column 710, the sixth column 712 or the seventh column 714. In the example of FIG. 7, the first multiplexer 604 generates a 56-bit value or seven rows of 8-bit values. The output terminals of the example first multiplexer 604 are in circuit with the first shift logic 606. For example, a truth table representative of the first multiplexer 604 is illustrated in Table 2 below.

TABLE 2

| Truth Table of First Multiplexer 604 | |
|---|---|
| Element of First Operand | Output of First Multiplexer 604 |
| 0 | Not Valid |
| 1 | Not Valid |
| 2 | Not Valid |
| 3 | 702 |
| 4 | Not Valid |
| 5 | 704 |
| 6 | 702 |
| 7 | 706 |
| 8 | Not Valid |
| 9 | 708 |
| 10 | 704 |
| 11 | 710 |
| 12 | 702 |
| 13 | 712 |
| 14 | 706 |
| 15 | 714 |

In the illustrated example of FIG. 7, the first shift logic 606 shifts the values generated by the first multiplexer 604 based on the value of the first element of the first operand (e.g., operand A). For example, a truth table representative of the first shift logic 606 is illustrated in Table 3 below.

TABLE 3

Truth Table of First Shift Logic 606

| Element of First Operand | Output of First Shift Logic 606 |
|---|---|
| 0 | Do not shift input value |
| 1 | Do not shift input value |
| 2 | Left shift input value by one bit |
| 3 | Do not shift input value |
| 4 | Left shift input value by two bits |
| 5 | Do not shift input value |
| 6 | Left shift input value by one bit |
| 7 | Do not shift input value |
| 8 | Left shift input value by three bits |
| 9 | Do not shift input value |
| 10 | Left shift input value by one bit |
| 11 | Do not shift input value |
| 12 | Left shift input value by two bits |
| 13 | Do not shift input value |
| 14 | Left shift input value by one bit |
| 15 | Do not shift input value |

In the illustrated example of FIG. 7, based on the value of the first element of a second operand (e.g., operand B), the first select multiplexer 406a generates values representative of a row of the first one of the columns received by the first select multiplexer 406a. In examples disclosed herein, the rows of the one or more columns are representative of a product of the first element of the first operand and the first element of the second operand. In the example of FIG. 7, the first select multiplexer 406a generates an 8-bit value representative of the row of the first one of the columns received by the first select multiplexer 406a. For example, a truth table representative of the first select multiplexer 406a is illustrated in Table 4 below.

TABLE 4

Truth Table of First Select Multiplexer 406a

| Element of Second Operand | Output of First Select Multiplexer 406a |
|---|---|
| 0 | Not Valid |
| 1 | Not Valid |
| 2 | Not Valid |
| 3 | First row of the received column (e.g., X*3) |
| 4 | Not Valid |
| 5 | Second row of the received column (e.g., X*5) |
| 6 | First row of the received column (e.g., X*3) |
| 7 | Third row of the received column (e.g., X*7) |
| 8 | Not Valid |
| 9 | Fourth row of the received column (e.g., X*9) |
| 10 | Second row of the received column (e.g., X*5) |
| 11 | Fifth row of the received column (e.g., X*11) |
| 12 | First row of the received column (e.g., X*3) |
| 13 | Sixth row of the received column (e.g., X*13) |
| 14 | Third row of the received column (e.g., X*7) |
| 15 | Seventh row of the received column (e.g., X*15) |

In the illustrated example of FIG. 7, the second shift logic 608 shifts the values generated by the first select multiplexer 406a based on the value of the first element of the second operand (e.g., operand B). For example, a truth table representative of the second shift logic 608 is illustrated in Table 5 below.

TABLE 5

Truth Table of Second Shift Logic 608

| Element of Second Operand | Output of Second Shift Logic 608 |
|---|---|
| 0 | Do not shift input value |
| 1 | Do not shift input value |
| 2 | Left shift input value by one bit |
| 3 | Do not shift input value |
| 4 | Left shift input value by two bits |
| 5 | Do not shift input value |
| 6 | Left shift input value by one bit |
| 7 | Do not shift input value |
| 8 | Left shift input value by three bits |
| 9 | Do not shift input value |
| 10 | Left shift input value by one bit |
| 11 | Do not shift input value |
| 12 | Left shift input value by two bits |
| 13 | Do not shift input value |
| 14 | Left shift input value by one bit |
| 15 | Do not shift input value |

In the illustrated example of FIG. 7, the hardcoded LUT values 602, the first multiplexer 604, the first shift logic 606, the first select multiplexer 406a, and the second shift logic 608 reduce the space (e.g., memory consumption) to store an equivalent LUT for 4-bit operands. In the example of FIG. 7, the hardcoded LUT values 602 are implemented by hardwired circuitry to represent constant values. The example hardcoded LUT values 602 include all possible products of prime numbers represented in 4-bit values (e.g., odd 4-bit numbers), excluding the number one. For the products of prime numbers represented in 4-bit values and operands corresponding to the numbers zero, one, and two are achieved by shifting the output of the first multiplexer 604 and/or the first select multiplexer 406a.

In examples disclosed herein, the hardwired LUT multiplexer 404, the first select multiplexer 406a, the second select multiplexer 406b, and the nth select multiplexer 406c perform 4-bit multiplication of the elements of a first operand (e.g., operand A) and a second operand (e.g., operand B). The example shift and adder logic 408 (e.g., 4-bit adders) and accumulation storage 410 shift and accumulate the products of the 4-bit multiplication. The example hardwired LUT multiplexer 404 disclosed herein is dedicated for MAC operations. As such, examples disclosed herein achieve matrix multiplication operation with hardwired values. Examples disclosed herein reduce the space (e.g., memory consumption) of the LUT by selecting 4-bit operands for computation. In examples with higher bit operations (e.g., 8-bits, 16-bits, etc.), the operands are decomposed into 4-bit elements and then accumulated appropriately to get exact results. As such, examples disclosed herein perform absolute computations and do not approximate results. Because MAC operations are common in machine learning model (e.g., DNN) inference workloads, examples disclosed herein improve performance of machine learning model inference workloads.

Figure 8:
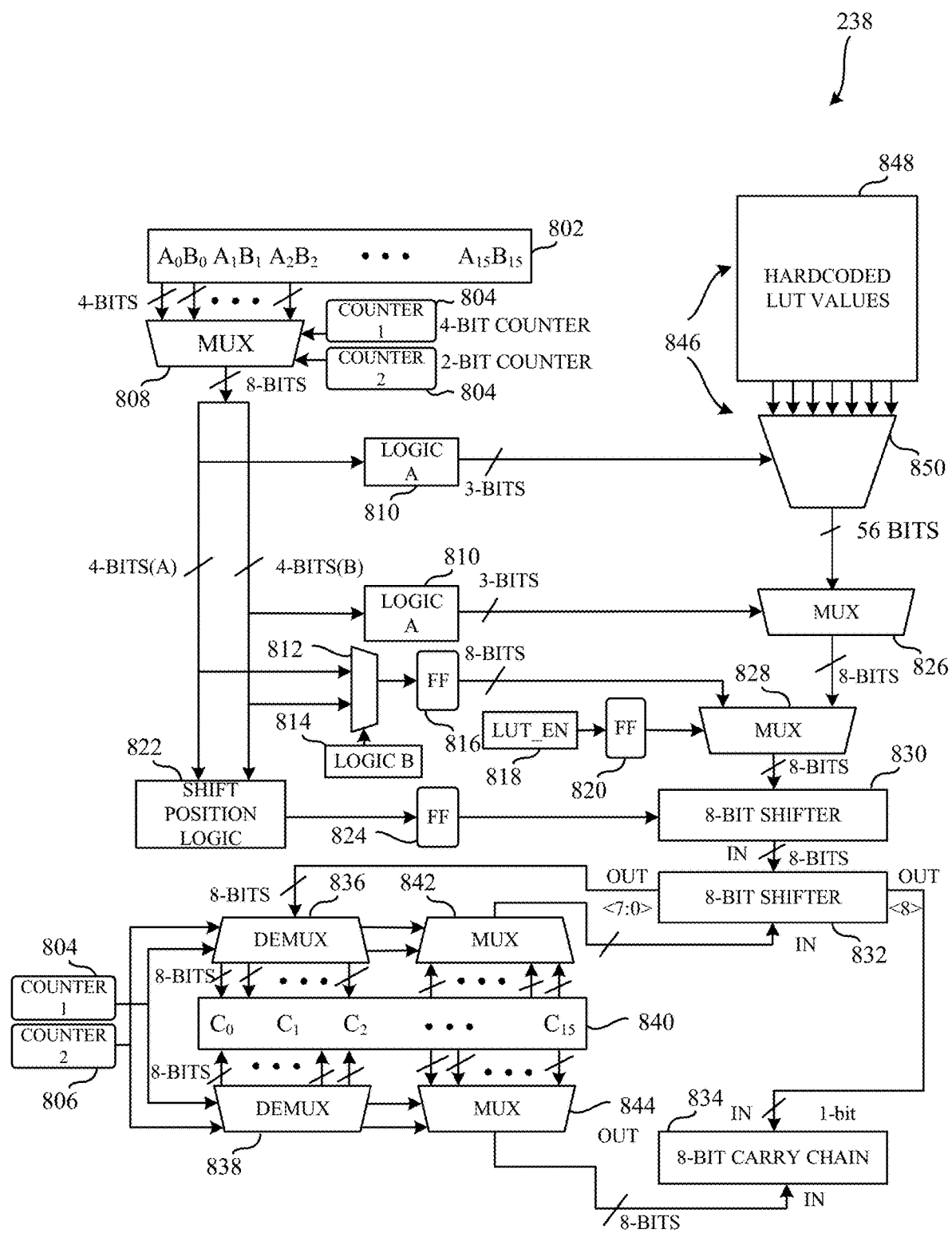
FIG. 8 is a block diagram illustrating additional detail of the compute logic of FIGS. 2, 3, 4, and 5.

FIG. 8 is a block diagram illustrating additional detail of the compute logic 238 of FIGS. 2, 3, 4, and 5. In the example of FIG. 8, the compute logic 238 includes an example operand register 802, an example first counter 804, an example second counter 806, an example operand select multiplexer 808, example converter logic 810, an example bypass multiplexer 812, example control logic 814, an example first feedforward register 816, example LUT enable logic 818, an example second feedforward register 820, example shift position logic 822, an example third feedforward register 824, an example select multiplexer 826, an example LUT enable multiplexer 828, an example shifter 830, an example adder 832, example carry chain logic 834, an example first accumulation demultiplexer 836, an example second accumulation demultiplexer 838, an example accumulation register 840, an example first accumulation multiplexer 842, an example second accumulation multiplexer 844, and an example hardwired LUT multiplexer 846 including example hardcoded values 848 and an example multiplexer 850.

In the illustrated example of FIG. 8, each of the operand select multiplexer 808, the converter logic 810, the bypass multiplexer 812, the control logic 814, the LUT enable logic 818, the shift position logic 822, the select multiplexer 826, the LUT enable multiplexer 828, the shifter 830, the adder 832, the carry chain logic 834, the first accumulation demultiplexer 836, the second accumulation demultiplexer 838, the first accumulation multiplexer 842, the second accumulation multiplexer 844, and the multiplexer 850 is implemented by logic (e.g., combinational and/or sequential). For example, combinational logic generates output values that are only dependent on the present values at the input terminals to the combinational logic whereas sequential logic generates output values that are dependent on the present values at the input terminals to the sequential logic as well as previous values for those input terminals. Additionally, in the example of FIG. 8, each of the operand register 802, the first counter 804, the second counter 806, the first feedforward register 816, the second feedforward register 820, the third feedforward register 824, and the accumulation register 840 is implemented by a register. In the example of FIG. 8, the hardcoded LUT values 848 are implemented by hardwired circuitry to represent constant values.

In the illustrated example of FIG. 8, the first counter 804 and/or the second counter 806 are enabled and/or disabled depending on whether the compute logic 238 is to operate on 4-bit operands, 8-bit operands, and/or 16-bit operands. For example, the first counter 804 is enabled when the compute logic 238 is to perform MAC operations based on the hardcoded LUT values 848. Additionally or alternatively, the example second counter 806 is enabled and/or disabled based on the bitlength of the operands. Additionally, the second counter 806 may be reset based on a reset value.

Table 6 illustrates parameters of the second counter 806 with respect to the bitlength of one or more operands to the compute logic 238.

TABLE 6

| Operand Bitlength | Second Counter 806 Enabled? | Second Counter 806 Max Count |
|---|---|---|
| 4 | No | Null |
| 8 | Yes | 1 |
| 16 | Yes | 3 |

As illustrated in the Table 6, the example second counter 806 is enabled for operands with bitlengths higher than 4-bits. As such, because MAC operations are based on the 4-bit elements, the example compute logic 238 decomposes higher bitlength operands into 4-bit elements and adds appropriately partial products to the corresponding positions (e.g., partitions) of the accumulation register 840. In the example of FIG. 8, the operand select multiplexer 808, the first accumulation demultiplexer 836, the second accumulation demultiplexer 838, the first accumulation multiplexer 842, and the second accumulation multiplexer 844 are controlled (e.g., selected) based on the values of the first counter 804 and/or the second counter 806. In the example of FIG. 8, the first counter 804 is implemented by a 4-bit counter and the second counter 806 is implemented by a 2-bit counter.

In example operation, the operand register 802 stores a first operand (e.g., operand A) and/or a second operand (e.g., operand B). For example, each of the first operand and the second operand include sixteen 4-bit elements (e.g., 64-bits). Based on the value of the first counter 804 and/or the second counter 806, the example operand select multiplexer 808 generates a first element of the first operand or the second operand. In the example of FIG. 8, if the operand select multiplexer 808 generates a first element of the first operand (e.g., operand A), the operand select multiplexer 808 transmits the first element of the first operand to the multiplexer 850 (e.g., via the converter logic 810) and the shift position logic 822.

In example operation, the converter logic 810 converts the 4-bit element of the operand to a 3-bit value. In response to receiving the first element of the operand, the example multiplexer 850 returns first values (e.g., 56-bits) representative of a column of the hardcoded LUT values 848. The example multiplexer 850 transmits the first values representative of a column of the hardcoded LUT values 848 to the select multiplexer 826. In the example of FIG. 8, if the operand select multiplexer 808 generates a first element of the second operand (e.g., operand B), the operand select multiplexer 808 transmits the first element of the second operand to the select multiplexer 826 (e.g., via the converter logic 810) and the shift position logic 822. In response to receiving the first element of the second operand, the example select multiplexer 826 generates second values representative of a first row of the column of the hardcoded LUT values 848 selected based on the first element of the first operand. For example, the second values are representative of an entry of the hardcoded LUT values 848 from an intersection of a row and the column of the hardcoded LUT values 848. The example select multiplexer 826 transmits the second values representative of the first row of the column of the hardcoded LUT values 848 to the shifter 830 (e.g., via the LUT enable multiplexer 828).

In example operation, the shift position logic 822 determines a value to cause the shifter 830 to shift the second values representative of the first row of the column of the hardcoded LUT values 848 based on the values of the first element of the first operand and/or the first element of the second operand in accordance with teachings of this disclosure. The example shift position logic 822 transmits (e.g., via the third feedforward register 824) the value to the shifter 830 to cause the corresponding shift. In the example of FIG. 8, the shifter 830 is implemented by an 8-bit shifter. The example shifter 830 shifts the second values representative of the first row of the column of the hardcoded LUT values 848 based on the value received from the shift position logic 822. In some examples, the shifter 830 does not shift the values received from the select multiplexer 826 (e.g., via the LUT enable multiplexer 828). The example shifter 830 transmits the output to the adder 832.

In example operation, the adder 832 adds the values output from the shifter 830 to any values that may be stored in the accumulation register 840. For example, the adder 832 operates in conjunction with the carry chain logic 834, the first accumulation demultiplexer 836, the second accumulation demultiplexer 838, the first accumulation multiplexer 842, and/or the second accumulation multiplexer 844. In the example of FIG. 8, the adder 832 is implemented by an 8-bit adder. In the example of FIG. 8, the carry chain logic 834 is implemented by an 8-bit carry chain.

In example operation, the bypass multiplexer 812 transmits the element of the first operand or the element of the second operand to the LUT enable multiplexer 828 based on the control logic 814. For example, the control logic 814 selects which of the first operand or second operand to transmit to the LUT enable multiplexer 828 based on the values of the first and/or second operand. Table 7 illustrates the operation of the bypass multiplexer 812 and the control logic 814. For values 2, 4, and 8, appropriate shifting is applied by the shifter 830 based on control from the shift position logic 822.

TABLE 7

| If A \| \| B = | Output of 812 |
| --- | --- |
| 0 | 0 |
| 1 | the other operand |
| 2 | the other operand |
| 4 | the other operand |
| 8 | the other operand |

In example operation, the LUT enable logic 818 causes the LUT enable multiplexer 828 to generate the values output from the select multiplexer 826 when LUT-based operation is enabled (e.g., for operand values not equal to 0, 1, 2, 4, and/or 8). Alternatively, for some operand values, the example LUT enable logic 818 causes the LUT enable multiplexer 828 to generate the values output from the bypass multiplexer 812 when LUT-based operation can be bypassed. For example, if the first element of the first operand and/or the first element of the second operand is equal to zero, one, two four, or eight, LUT-based operation can be bypassed.

As mentioned above, the example SA 216 disclosed herein includes at least two rows reserved for operations other than MAC operations. For example, pooling operations in machine learning models (e.g., neural networks) are typically used for down-sampling. Examples disclosed herein support such pooling operations (e.g., max and/or min pooling operations). For example, pooling operations include calculating an average across the patches of input feature map based on the convolutional filters. Such an operation requires accumulating the entries of an input matrix and dividing the sum by the total number of entries. As such, examples disclosed herein (e.g., the adders 308 and/or the shift and adder logic 408) facilitate such pooling operations.

For the division operations, examples disclosed herein utilize Taylor series expansion of operands for faster division operation and reduced LUT entries. Examples disclosed herein perform division operations using Equation 2 below.

$$\frac{X}{Y} \approx \frac{X(Y_h - Y_l)}{Y_h^2}; X, Y \in [1, 2) \qquad \text{Equation 2}$$

In the example of Equation 2, X and Y are the division operands represented with 2*(m) bits. M represents half the bit-value of the operands being divided. For example, for 8-bit division, m equals 4. For 4-bit division, m equals 2. For 16-bit division, m equals 8. $Y_h$ and $Y_l$ are the upper and lower m-bits. The input operand values are mapped to [1;2) using the shift operations. The shift counter value is stored in one or more of the reserved rows of the SA 216 to re-map the result. Examples disclosed herein concurrently calculate the values of $X(Y_h-Y_l)$ and $1/Y_h^2$. Examples disclosed herein remap the computed result to the original data range via shift operations.

Examples disclosed herein support exponent, sigmoid and tanh operations. For example, examples disclosed herein implement a piecewise linear approximation. For the exponent operation, the piecewise linear approximation is shown in Equation 3 below. For sigmoid and tanh operation, $y_l^s$ may be replaced with an appropriate function related to sigmoid and/or tanh operations.

$$f^s(x) = a^{s*}(x - x_l^s) + y_l^s = a^{s*}x + (y_l^s - a^{s*}x_l^s)$$

$$x \in [x_l^s; x_r^s], y_l^s = e^{x_l^s}, s \in [1, S] \qquad \text{Equation 3}$$

For Equation 3, the reserved rows of the SA 216 stores the values of $\alpha_s$ and $(y_l^s - \alpha_s^* x_l^s)$ corresponding to $x_l^s$. Similarly, examples disclosed herein compute exponential operations for softmax operations the LUT-based approach and accumulate the results for further normalization operations. The normalized operations (involving division) are performed according to the above discussed division operation.

Figure 9:
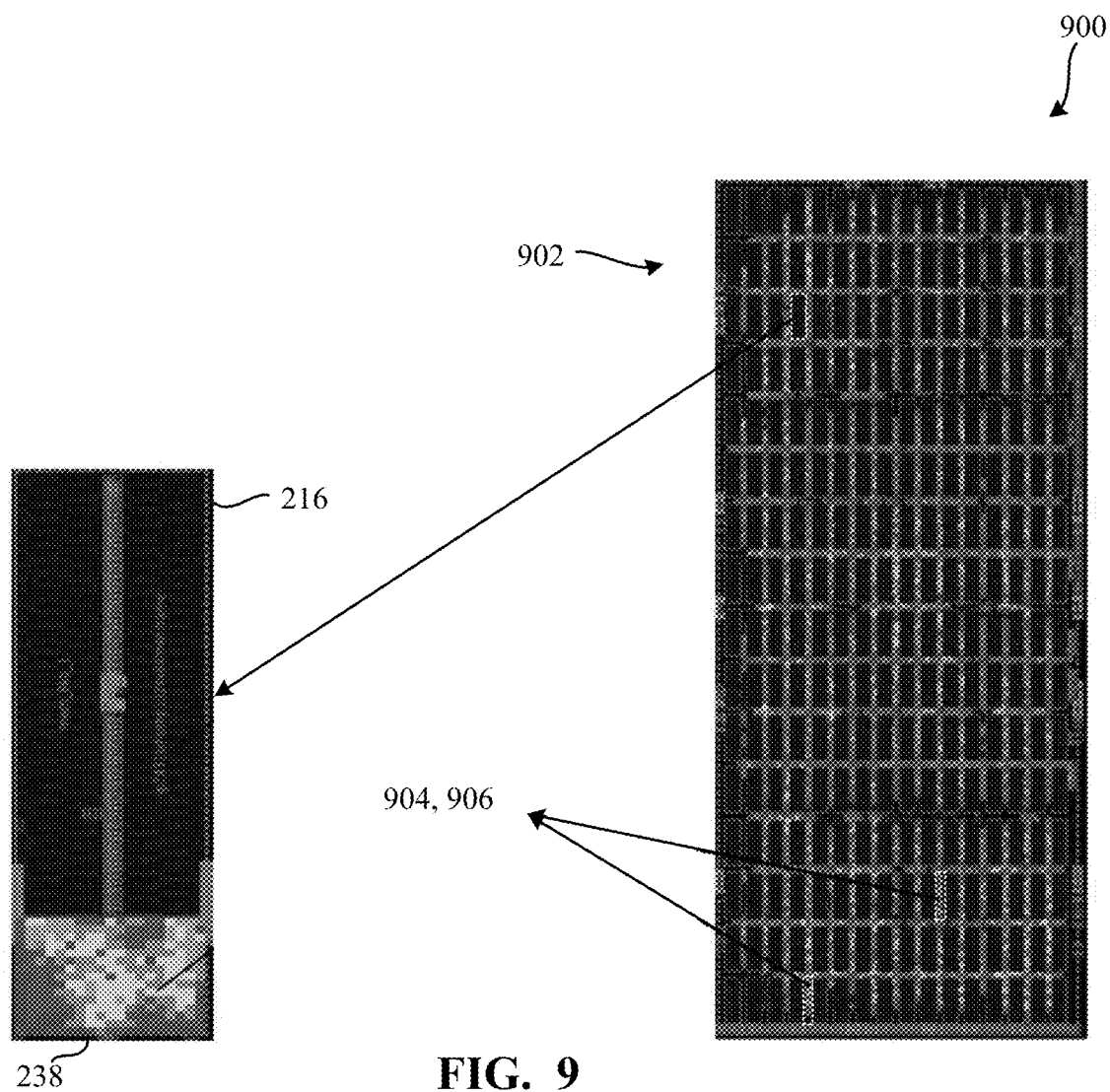
FIG. 9 is a graphical illustration of an example physical layout the compute logic of FIGS. 2, 3, 4, 5, and/or 8 in accordance with teachings of this disclosure.

FIG. 9 is a graphical illustration 900 of an example physical layout of the compute logic 238 of FIGS. 2, 3, 4, 5, and/or 8 in accordance with teachings of this disclosure. In the example of FIG. 9, the graphical illustration 900 includes an example memory media 902. The example memory media 902 includes the SA 216, the compute logic 238, example compute logic 904, and example compute logic 906. The description of the example compute logic 238 may additionally apply to the compute logic 904 and the compute logic 906.

In the illustrated example of FIG. 9, the memory media 902 implements a two-megabytes (MB) memory. In some examples, the memory media 902 implements a 64 kilobyte (KB) memory. In some examples, the memory media 902 implements a four MB memory. In other examples, the memory media 902 implements any amount of memory. In the example of FIG. 9, the SA 216 implements 8 KB of memory. In additional or alternative examples, the SA 216 implements 16 KB of memory. In the example of FIG. 9, the memory media 902 performs four 8-bit MAC operations per clock cycle per SA.

FIG. 10 is a graphical illustration of a timing diagram 1000 illustrating example operation of the compute logic 238 of FIGS. 2, 3, 4, 5, 8, and/or 9. The timing diagram 1000 illustrates example operation of the compute logic 238 with respect to 4-bit operations.

FIG. 11 is a graphical illustration of a timing diagram 1100 illustrating example operation of the compute logic 238 of FIGS. 2, 3, 4, 5, 8, and/or 9. The timing diagram 1100 illustrates example operation of the compute logic 238 with respect to 8-bit operations.

FIG. 12 is a graphical illustration of a timing diagram 1200 illustrating example operation of the compute logic 238 of FIGS. 2, 3, 4, 5, 8, and/or 9. The timing diagram 1200 illustrates example operation of the compute logic 238 with respect to 16-bit operations.

Figure 13:
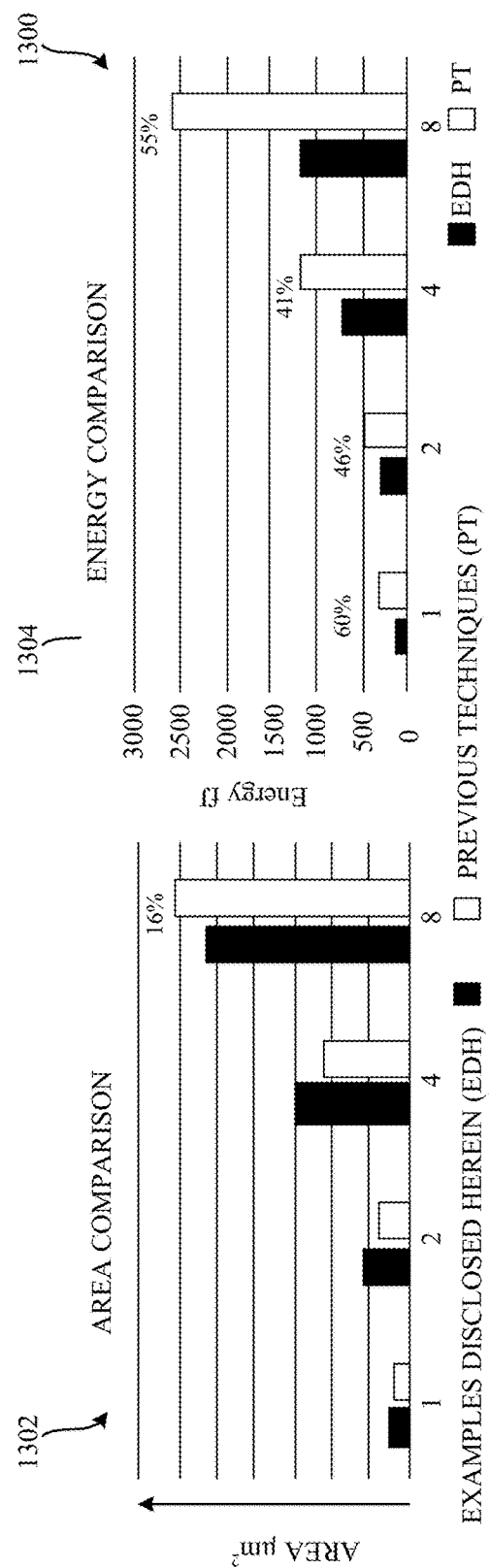
FIG. 13 is a graphical illustration of a bar graph illustrating example area consumption of the compute logic disclosed herein as compared to previous techniques and a second bar graph illustrating example energy consumption of compute logic disclosed herein as compared to previous techniques.

FIG. 13 is a graphical illustration 1300 of a bar graph 1302 illustrating example area consumption of the compute logic disclosed herein as compared to previous techniques and a second bar graph 1304 illustrating example energy consumption of compute logic disclosed herein as compared to previous techniques. In the example of FIG. 13, the X axis of the bar graph 1302 corresponds to the number of 4-bit multiplications ranging from one to eight. In the example of FIG. 13, the Y axis of the bar graph 1302 corresponds to the area consumption of the compute logic in $\mu m^2$ on an increasing scale. As illustrated in the bar graph 1302, examples disclosed herein consume 16% less area than previous techniques for eight 4-bit multiplications. In the example of FIG. 13, the X axis of the bar graph 1304 corresponds to the number of 4-bit multiplications ranging from one to eight. In the example of FIG. 13, the Y axis of the bar graph 1304 corresponds to the energy consumption of the compute logic in femtojoules (fJ). As illustrated in the bar graph 1304, examples disclosed herein consume 60% less fJ than previous techniques for one 4-bit multiplication. As illustrated in the bar graph 1304, examples disclosed herein consume 46% less fJ than previous techniques for two 4-bit multiplication. As illustrated in the bar graph 1304, examples disclosed herein consume 41% less fJ than previous techniques for four 4-bit multiplication. As illustrated in the bar graph 1304, examples disclosed herein consume 55% less fJ than previous techniques for eight 4-bit multiplication.

Figure 14:
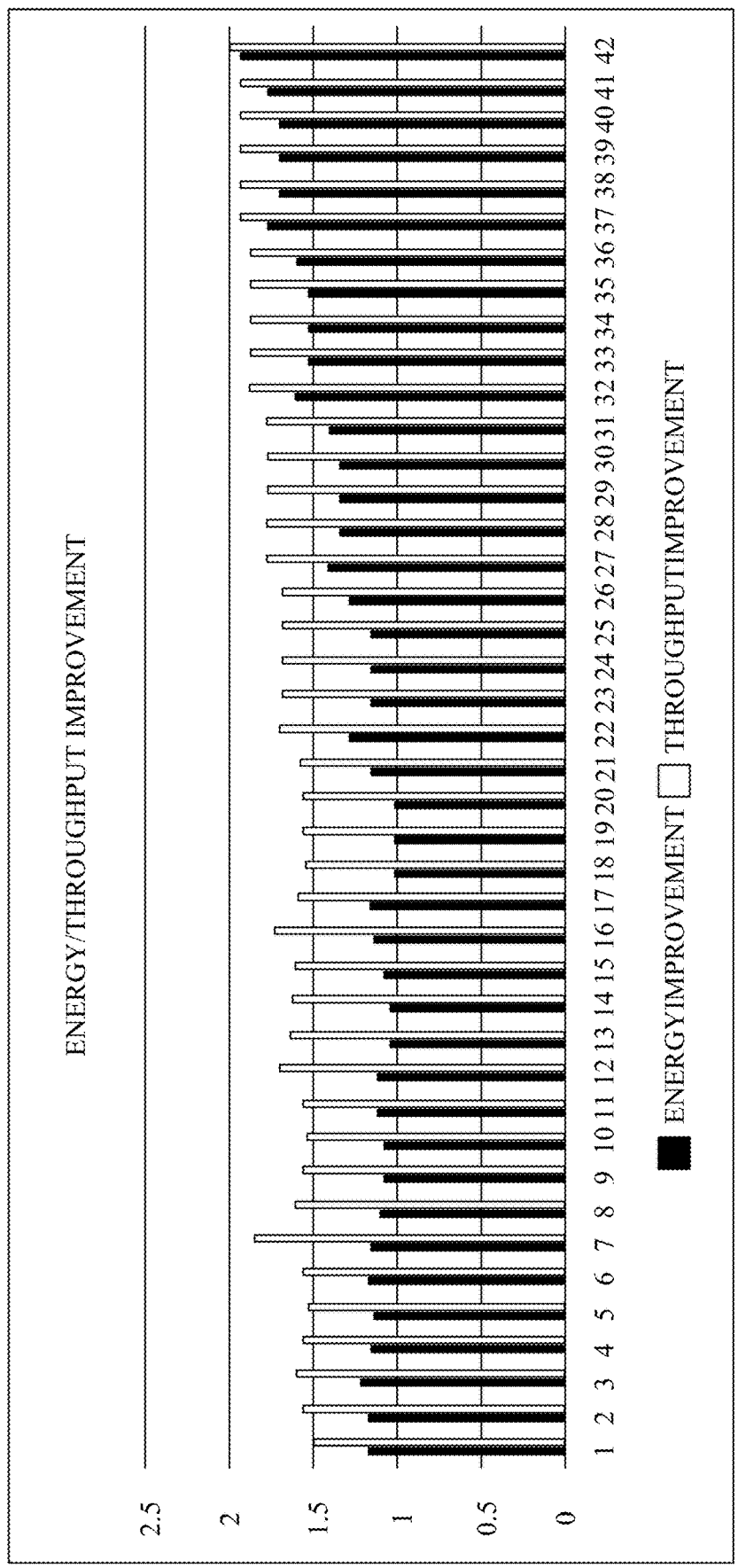
FIG. 14 is a bar graph illustrating example improvements to the energy consumption and throughput of a machine learning model that implements compute logic in accordance with teachings of this disclosure as compared to baseline metrics.

FIG. 14 is a bar graph 1402 illustrating example improvements to the energy consumption and throughput of a machine learning model that implements compute logic in accordance with teachings of this disclosure as compared to baseline metrics. In the example of FIG. 14, the X axis of the bar graph 1402 corresponds to respective layers of the machine learning model. In the example of FIG. 14, the Y axis of the bar graph 1402 corresponds to factors of improvement (e.g., 1× improvement, 2× improvement, etc.). As such, the bar graph 1402 illustrates the improvements to the energy consumption and throughput of the machine learning model, per layer.

In the illustrated example of FIG. 14, the baseline metrics correspond to a PNM design with iso-compute resources and a sixteen KB local buffer. The sixteen KB buffer ensures peak baseline performance by reducing the number of SRAM accesses (e.g., which include bus parasitic impedances) and providing data reuse from the buffer. As illustrated in FIG. 14, for layers 1-14, examples disclosed herein achieve energy consumption improvements about one times (1×) greater than the baseline design. Additionally, for layers 1-14, examples disclosed herein achieve energy consumption improvements about one and a half (1.5×) greater than the baseline design. As the machine learning model gets deeper, the improvements to energy consumption and throughput achieved by examples disclosed herein increase.

While example manners of implementing the compute logic 238 of FIG. 2 are illustrated in FIGS. 3 and 4, one or more of the elements, processes and/or devices illustrated in FIGS. 3 and/or 4 may be combined, divided, re-arranged, omitted, eliminated and/or implemented in any other way. Further, the example fetch and decode logic 302, the example operand register 304, the example compute core 306, the example adders 308, the example accumulation register 310, the example control logic 312, example operand select logic 314, the example address generator 316, the example memory address register 318, the example entry select logic 320, the example shifter 322, and/or the example control logic and operand storage 402, the example hardwired LUT multiplexer 404, the example first select multiplexer 406a, the example second select multiplexer 406b, the example nth select multiplexer 406c, the example shift and adder logic 408, the example accumulation storage 410, the example control logic 412, and/or, more generally, the example compute logic 238 of FIGS. 3 and/or 4 may be implemented by hardware, software, firmware and/or any combination of hardware, software and/or firmware. Thus, for example, any of the example fetch and decode logic 302, the example operand register 304, the example compute core 306, the example adders 308, the example accumulation register 310, the example control logic 312, example operand select logic 314, the example address generator 316, the example memory address register 318, the example entry select logic 320, the example shifter 322, and/or the example control logic and operand storage 402, the example hardwired LUT multiplexer 404, the example first select multiplexer 406a, the example second select multiplexer 406b, the example nth select multiplexer 406c, the example shift and adder logic 408, the example accumulation storage 410, the example control logic 412, and/or, more generally, the example compute logic 238 of FIGS. 3 and/or 4 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example fetch and decode logic 302, the example operand register 304, the example compute core 306, the example adders 308, the example accumulation register 310, the example control logic 312, example operand select logic 314, the example address generator 316, the example memory address register 318, the example entry select logic 320, the example shifter 322, and/or the example control logic and operand storage 402, the example hardwired LUT multiplexer 404, the example first select multiplexer 406a, the example second select multiplexer 406b, the example nth select multiplexer 406c, the example shift and adder logic 408, the example accumulation storage 410, the example control logic 412, and/or, more generally, the example compute logic 238 of FIGS. 3 and/or 4 is/are hereby expressly defined to include a non-transitory computer readable storage device or storage disk such as a memory, a digital versatile disk (DVD), a compact disk (CD), a Blu-ray disk, etc. including the software and/or firmware. Further still, the example compute logic 238 of FIGS. 3 and/or 4 may include one or more elements, processes and/or devices in addition to, or instead of, those illustrated in FIGS. 3 and/or 4, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

A flowchart representative of example hardware logic, machine-readable instructions, hardware implemented state machines, and/or any combination thereof for implementing the compute logic 238 of FIGS. 3 and/or 4 is shown in FIG.

15. The machine-readable instructions may be one or more executable programs or portion(s) of an executable program for execution by a computer processor and/or processor circuitry, such as the processor 2612 shown in the example processor platform 2600 discussed below in connection with FIG. 26. The program may be embodied in software stored on a non-transitory computer readable storage medium such as a CD-ROM, a floppy disk, a hard drive, a DVD, a Blu-ray disk, or a memory associated with the processor 2612, but the entire program and/or parts thereof could alternatively be executed by a device other than the processor 2612 and/or embodied in firmware or dedicated hardware. Further, although the example program is described with reference to the flowchart illustrated in FIG. 15, many other methods of implementing the example compute logic 238 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more devices (e.g., a multi-core processor in a single machine, multiple processors distributed across a server rack, etc.).

Figure 15:
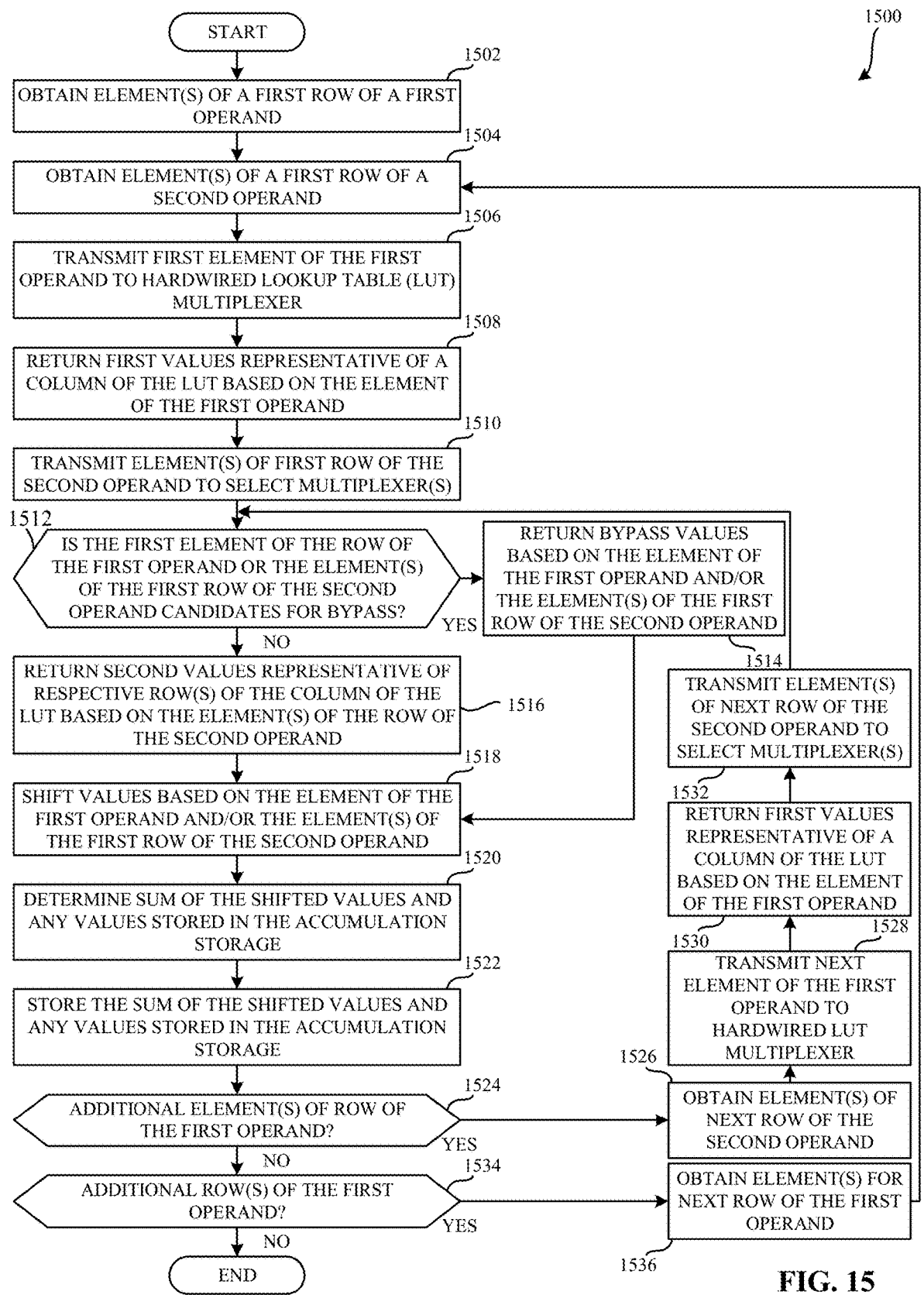
FIG. 15 is a flowchart representative of machine-readable instructions which may be executed to implement the compute logic of FIGS. 2, 3, 4, 5, 8, and/or 9.

FIG. 15 is a flowchart representative of machine-readable instructions 1500 which may be executed to implement the compute logic 238 of FIGS. 2, 3, 4, 5, 8, and/or 9. In the example of FIG. 15, a processor may execute the machine-readable instructions 1500 in response to a request from the media access circuitry 108 to perform one or more MAC operations. In the example of FIG. 15, the machine-readable instructions 1500 begin at block 1502 where the compute logic 238 obtains one or more elements of a first row of a first operand. For example, at block 1502, the FAD logic 302 obtains one or more elements of a first row of a first operand. Additionally or alternatively, at block 1502, the example control logic and operand storage 402 obtains one or more elements of a first row of a first operand. In some examples, at block 1502, the operand register 802 obtains one or more elements of a first row of a first operand.

In the illustrated example of FIG. 15, at block 1504, the compute logic 238 obtains one or more elements of a first row of a second operand. For example, at block 1504, the FAD logic 302 obtains one or more elements of a first row of a second operand. Additionally or alternatively, at block 1504, the example control logic and operand storage 402 obtains one or more elements of a first row of a second operand. In some examples, at block 1504, the operand register 802 obtains one or more elements of a first row of a second operand. At block 1506, the example compute logic 238 transmits a first element of the first row of the first operand to a hardwired LUT multiplexer. For example, at block 1506, the memory address register 318 transmits a first element of the first row of the first operand to the entry select logic 320. Additionally or alternatively, at block 1506, the example control logic and operand storage 402 transmits a first element of the first row of the first operand to the hardwired LUT multiplexer 404. In some examples, at block 1506, the operand select multiplexer 808 transmits a first element of the first row of the first operand to the hardwired LUT multiplexer 846.

In the illustrated example of FIG. 15, at block 1508, the compute logic 238 returns first values representative of a column of the LUT based on the first element of the first row of the first operand. For example, at block 1508, the entry select logic 320 returns first values representative of a column of the LUT based on the first element of the first row of the first operand. Additionally or alternatively, at block 1508, the example hardwired LUT multiplexer 404 returns first values representative of a column of the LUT based on the first element of the first row of the first operand. In some examples, at block 1508, the multiplexer 850 returns first values representative of a column of the LUT based on the first element of the first row of the first operand. At block 1510, the example compute logic 238 transmits the elements of the first row of the second operand to one or more select multiplexers. For example, at block 1510, the memory address register 318 transmits the elements of the first row of the second operand to the entry select logic 320. Additionally or alternatively, at block 1510, the example control logic and operand storage 402 transmits the elements of the first row of the second operand to the first select multiplexer 406a, the second select multiplexer 406b, and the nth select multiplexer 406c. In some examples, at block 1510, the operand select multiplexer 808 transmits the elements of the first row of the second operand to the select multiplexer 826.

In the illustrated example of FIG. 15, at block 1512, the compute logic 238 determines whether at least one of the first element of the first row of the first operand or the element(s) of the first row of the second operand is a candidate for bypass. For example, at block 1512, the entry select logic 320 determines whether at least one of the first element of the first row of the first operand or the element(s) of the first row of the second operand is a candidate for bypass. Additionally or alternatively, at block 1512, the example hardwired LUT multiplexer 404 determines whether at least one of the first element of the first row of the first operand or the element(s) of the first row of the second operand is a candidate for bypass. In some examples, at block 1512, the bypass multiplexer 812 determines whether at least one of the first element of the first row of the first operand or the element(s) of the first row of the second operand is a candidate for bypass. In the example of FIG. 15, candidates for bypass include elements equal to zero, one, two, four, and eight.

In the illustrated example of FIG. 15, in response to the compute logic 238 determining that at least one of the first element of the first row of the first operand or the element(s) of the first row of the second operand is a candidate for bypass (block 1512: YES), the machine-readable instructions 1500 proceed to block 1514. In response to the example compute logic 238 determining that at least one of the first element of the first row of the first operand or the element(s) of the first row of the second operand is not a candidate for bypass (block 1512: NO), the machine-readable instructions 1500 proceed to block 1516. At block 1514, the example compute logic 238 returns first bypass values based on at least one of the first element of the first row of the first operand or the element(s) of the first row of the second operand. For example, at block 1514, the shifter 322 returns first bypass values based on at least one of the first element of the first row of the first operand or the element(s) of the first row of the second operand. Additionally or alternatively, at block 1514, the example shift and adder logic 408 returns first bypass values based on at least one the first element of the first row of the first operand or the element(s) of the first row of the second operand. In some examples, at block 1514, the LUT enable multiplexer 828 returns first bypass values based on at least one of the first element of the first row of the first operand or the element(s) of the first row of the second operand.

In the illustrated example of FIG. 15, at block 1516, the compute logic 238 returns second values representative of one or more respective rows of the column of the LUT based on the one or more elements of the row of the second operand. For example, at block 1516, the entry select logic 320 returns second values representative of one or more respective rows of the column of the LUT based on the one or more elements of the row of the second operand. Additionally or alternatively, at example block 1516, one or more of the first select multiplexer 406a, the second select multiplexer 406b, or the nth select multiplexer 406c return second values representative of one or more respective rows of the column of the LUT based on the one or more elements of the row of the second operand. In some examples, at block 1516, the select multiplexer 826 returns second values representative of one or more respective rows of the column of the LUT based on the one or more elements of the row of the second operand.

At block 1518, the example compute logic 238 shifts the values (e.g., second values representative of one or more respective rows of the column of the LUT or the bypass values) based on at least one of the first element of the first row of the first operand or the element(s) of the first row of the second operand. For example, at block 1518, the shifter 322 shifts the values (e.g., second values representative of one or more respective rows of the column of the LUT or the bypass values) based on at least one of the first element of the first row of the first operand or the element(s) of the first row of the second operand. Additionally or alternatively, at block 1518, the example shift and adder logic 408 shifts the values (e.g., second values representative of one or more respective rows of the column of the LUT or the bypass values) based on at least one of the first element of the first row of the first operand or the element(s) of the first row of the second operand. In some examples, at block 1518, the shifter 830 shifts the values (e.g., second values representative of one or more respective rows of the column of the LUT or the bypass values) based on at least one of the first element of the first row of the first operand or the element(s) of the first row of the second operand.

In the illustrated example of FIG. 15, at block 1520, the compute logic 238 determines the sum of the shifted values and any values stored in an accumulation storage. For example, at block 1520, the adders 308 determine the sum of the shifted values and any values stored in the accumulation register 310. Additionally or alternatively, at block 1520, the shift and adder logic 408 determines the sum of the shifted values and any values stored in the accumulation storage 410. In some examples, at block 1520, the adder 832 determines the sum of the shifted values and any values stored in the accumulation register 840.

As described above, the accumulation storage (e.g., the accumulation register 310, the accumulation storage 410, and/or the accumulation register 840) may be partitioned to represent elements of a product matrix. For example, one or more of the accumulation register 310, the accumulation storage 410, or the accumulation register 840 may be partitioned to represent a first element (e.g., $C_0$), a second element (e.g., $C_1$), a third element (e.g., $C_2$), and/or a fourth element (e.g., $C_3$) of a product matrix. In the example of FIG. 15, at block 1522, the compute logic 238 stores the sum of the shifted values and any values stored in the accumulation storage. For example, at block 1522, the accumulation register 310 stores the sum of the shifted values and any values stored in the accumulation storage. Additionally or alternatively, at block 1522, the example accumulation storage 410 stores the sum of the shifted values and any values stored in the accumulation storage. In some examples, at block 1522, the accumulation register 840 stores the sum of the shifted values and any values stored in the accumulation register 840.

In the illustrated example of FIG. 15, at block 1524, the compute logic 238 determines whether there are additional elements of the row of the first operand. For example, at block 1524, the operand select logic 314 determines whether there are additional elements of the row of the first operand. Additionally or alternatively, at block 1524, the example control logic and operand storage 402 determines whether there are additional elements of the row of the first operand. In some examples, at block 1524, the operand register 802 determines whether there are additional elements of the row of the first operand. In response to the example compute logic 238 determining that there are additional elements of the row of the first operand (block 1524: YES), the machine-readable instructions 1500 proceed to block 1526. In response to the example compute logic 238 determining that there are not additional elements of the row of the first operand (block 1524: NO), the machine-readable instructions 1500 proceed to block 1534.

In the illustrated example of FIG. 15, at block 1526, the compute logic 238 obtains one or more elements of a next row of the second operand. For example, at block 1526, the FAD logic 302 obtains one or more elements of a next row of the second operand. Additionally or alternatively, at block 1526, the example control logic and operand storage 402 obtains one or more elements of a next row of the second operand. In some examples, at block 1526, the operand register 802 obtains one or more elements of a next row of the second operand. At block 1528, the example compute logic 238 transmits a next element of the first row of the first operand to a hardwired LUT multiplexer. For example, at block 1528, the memory address register 318 transmits a next element of the first row of the first operand to the entry select logic 320. Additionally or alternatively, at block 1528, the example control logic and operand storage 402 transmits a next element of the first row of the first operand to the hardwired LUT multiplexer 404. In some examples, at block 1528, the operand select multiplexer 808 transmits a next element of the first row of the first operand to the hardwired LUT multiplexer 846.

In the illustrated example of FIG. 15, at block 1530, the compute logic 238 returns first values representative of a column of the LUT based on the next element of the first row of the first operand. For example, at block 1530, the entry select logic 320 returns first values representative of a column of the LUT based on the next element of the first row of the first operand. Additionally or alternatively, at block 1530, the hardwired LUT multiplexer 404 returns first values representative of a column of the LUT based on the next element of the first row of the first operand. In some examples, at block 1530, the multiplexer 850 returns first values representative of a column of the LUT based on the next element of the first row of the first operand. At block 1532, the example compute logic 238 transmits the elements of the next row of the second operand to one or more select multiplexers. For example, at block 1532, the memory address register 318 transmits the elements of the next row of the second operand to the entry select logic 320. Additionally or alternatively, at block 1532, the example control logic and operand storage 402 transmits the elements of the next row of the second operand to the first select multiplexer 406a, the second select multiplexer 406b, and the nth select multiplexer 406c. In some examples, at block 1532, the operand select multiplexer 808 transmits the elements of the next row of the second operand to the select multiplexer 826.

In the illustrated example of FIG. 15, at block 1534, the compute logic 238 determines whether there are additional rows of the first operand. For example, at block 1534, the FAD logic 302 determines whether there are additional rows of the first operand. Additionally or alternatively, at block 1534, the example control logic and operand storage 402 determines whether there are additional rows of the first operand. In some examples, at block 1534, the operand register 802 determines whether there are additional rows of the first operand. In response to the example compute logic 238 determining that there are additional rows of the first operand (block 1534: YES), the machine-readable instructions 1500 proceed to block 1536.

In the illustrated example of FIG. 15, at block 1536, the compute logic 238 obtains one or more elements of a next row of a first operand. For example, at block 1536, the FAD logic 302 obtains one or more elements of a next row of a first operand. Additionally or alternatively, at block 1536, the example control logic and operand storage 402 obtains one or more elements of a next row of a first operand. In some examples, at block 1536, the operand register 802 obtains one or more elements of a next row of a first operand. In response to the example compute logic 238 determining that there are not additional rows of the first operand (block 1534: NO), the machine-readable instructions 1500 terminate.

Figure 16:
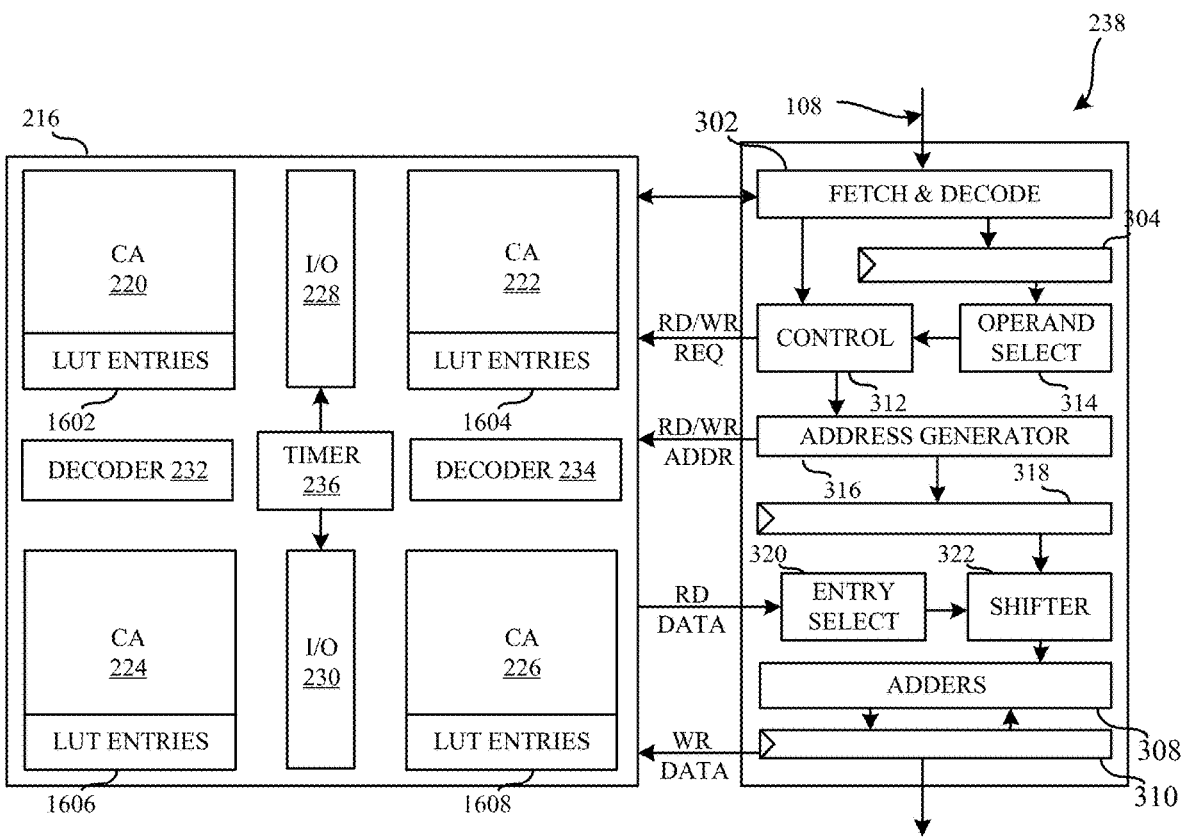
FIG. 16 is a block diagram illustrating additional detail of the compute logic 238 and the SA 216 of FIG. 2.

FIG. 16 is a block diagram illustrating additional example detail of the compute logic 238 and the SA 216 of FIG. 2. In the example of FIG. 16, the compute logic 238 is implemented similarly to the compute logic 238 of FIG. 3. Additionally, in the example of FIG. 16, the SA 216 is implemented similarly to the SA 216 of FIG. 2. However, in the example of FIG. 16, the CAs 220, 222, 224, and 226 include example first LUT entries 1602, example second LUT entries 1604, example third LUT entries 1606, and example fourth LUT entries 1608, respectively.

In the illustrated example of FIG. 16, the compute logic 238 is implemented in-memory (e.g., within the memory media 110) and does not modify bit-cells in the CAs (e.g., CAs 220, 222, 224, and 226) or corresponding peripheral circuitry (e.g., I/O sense amplifiers 228 and 230, decoders 232 and 234, and the timer 236). The example compute logic 238 performs compute operation (e.g., multiplication) via a LUT approach where LUT entries are stored in CAs and logic to access the LUT entries is placed adjacent (e.g., close) to the SA. In examples disclosed herein, the compute logic and SA group is referred to as a Comp-SA and facilitates a new memory SA macro.

In example processing of operands, the control logic 312 forwards the operand corresponding to the opcode to the address generator 316. Based on the opcode, the example control logic 312 transmits a read or write request to the SA 216. For example, if the opcode corresponds to a load operation, then the control logic 312 transmits a read request to the SA 216. The example address generator 316 transmits the operand (e.g., address corresponding to the data on which to be operated) corresponding to the opcode to the SA 216. In particular, the operand corresponds to an address within one of the LUT entries 1602, 1604, 1606, or 1608. The example address generator 316 also loads the memory address register 318 with the operand.

In example processing of operands, based on the selected operand received from the address generator 316, the SA 216 transmits the data stored at the address of the operand to the entry select logic 320. For example, when the operand corresponds to an opcode calling for a MAC operation, one of the LUT entries 1602, 1604, 1606, or 1608 transmits the data stored at the address of the operand to the entry select logic 320. The example entry select logic 320 forwards the data stored at the address of the operand to the shifter 322.

In example processing of operands, based on the operand, the shifter 322 either (1) shifts the data stored at the address of the operand and forwards the data to the adders 308 or (2) forwards the data stored at the address of the operand to the adders 308. The example adders 308 then add the data corresponding to the operand to the data stored in the accumulation register 310 and stores the sum in the accumulation register 310. In some examples, the accumulation register 310 stores the sum in the SA 216. In additional or alternative examples, the accumulation storage returns the sum to the media access circuitry 108.

Figures 17, 18:
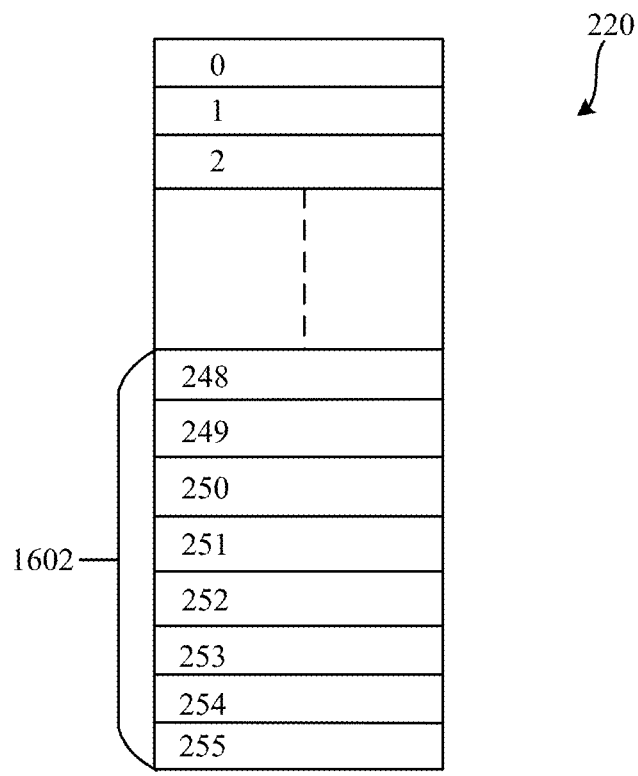
FIG. 17 is a block diagram illustrating how examples disclosed herein repurpose the CA to store LUT entries.
FIG. 18 is a graphical illustration showing additional detail of the LUT entries of FIG. 17.

FIG. 17 is a block diagram illustrating how examples disclosed herein repurpose the CA 220 to store LUT entries 1602. In the example of FIG. 17, the CA 220 includes 256 rows where each row represents 8 bytes. In the example of FIG. 17, the last eight rows (e.g., last 64 bytes) of the CA 220 are repurposed as the LUT entries 1602.

FIG. 18 is a graphical illustration showing additional detail of the LUT entries 1602 of FIG. 17. For example, the LUT entries 1602 are represented as a table including rows corresponding to the value of a first operand (e.g., operand A) and columns corresponding to the value of a second operand (e.g., operand B). In the example of FIG. 18, the LUT entries 1602 correspond to the product of the first and second operands (e.g., A*B). In examples disclosed herein, LUT entries and the compute logic 238 enable 4-bit multiplication (e.g., the output of the LUT entries) and the adders 308 (e.g., 8-bit adders) accumulate the multiplication products to get the matrix multiplication operation. To reduce the space (e.g., memory) consumption for LUT entries, examples disclosed herein perform computation using 4-bit operands.

For example, for a first operand (e.g., operand A) with a value of five and a second operand (e.g., operand B) with a value of seven, the LUT entries 1602 output the product of five and seven, or thirty-five. As such, examples disclosed herein utilize reduced (e.g., minimal, 64B) storage. For higher bit operations (e.g., 8-bits, 16-bits, etc.), examples disclosed herein decompose operands into 4-bit elements and accumulate products appropriately to get the exact results. As such, examples disclosed herein perform absolute computation, not approximations.

In some examples, the memory consumption of the LUT entries 1602 may vary. For example, based on the bit-length of the operands, the memory consumption of the LUT entries 1602 varies. For example, higher bit-length operations cause the memory consumption of the LUT entries to increase. Equation 4 below illustrates a formula to determine the memory consumption of the LUT entries 1602 based on the bit-length of the operands without optimization.

$$\text{Memory Consumption of } LUT \text{ Entries (Bytes)} = \frac{2^{2m+1} * m}{8} \quad \text{Equation 4}$$

For example, for 4-bit operands, the LUT entries 1602 consume 256B of memory. By including the example shifter 322 to shift the outputs of the LUT entries 1602 based on the value of the operands, the memory consumption of the LUT entries 1602 can be reduced. For example, the shifter 322 advantageously reduces the memory consumption of the LUT entries 1602 from 256B to 64B or a third of the unoptimized memory consumption. The example LUT entries 1602 of FIG. 18 illustrate the selected operand combinations stored in the CA 220. For example, the LUT entries 1602 include the products of 4-bit prime numbers, excluding one, and including twelve. The example shifter 322 shifts the output of the LUT entries 1602 for operands of values zero, one, two, four, or eight. In some examples, row one and column one can be removed (e.g., products for operand A=12 and/or operand B=12). For example, such products can be achieved by left shifting the LUT entries of row two and/or column two (e.g., products for operand A=3 and/or operand B=3). In some examples, the LUT entries 1602 only include rows one through four. In other examples, the LUT entries 1602 only include rows five through eight.

In some examples, the size of the products stored in the LUT entries 1602 may change. For example, the example LUT entries 1602 of FIGS. 16, 17, and 18 correspond to an atomic operand size of 4-bits. For example, an atomic operand size refers to the smallest sized datum on which the compute logic 238 will operate without decomposing the operand into smaller portions. In some examples, the LUT entries 1602 correspond to an atomic operand size of 8-bits. In other examples, the LUT entries 1602 correspond to an atomic operand size of 16-bits. In other examples, other atomic operand sizes may be used. Different sizes of the atomic operand will change the size of the LUT entries 1602 stored in the CA 220. For example, increasing the size of the atomic operand allows for the compute logic 238 to perform multiplication of the atomic operand (e.g., 8-bit multiplication, 16-bit multiplication, etc.) more quickly than with a smaller sized atomic operand.

Figure 19:
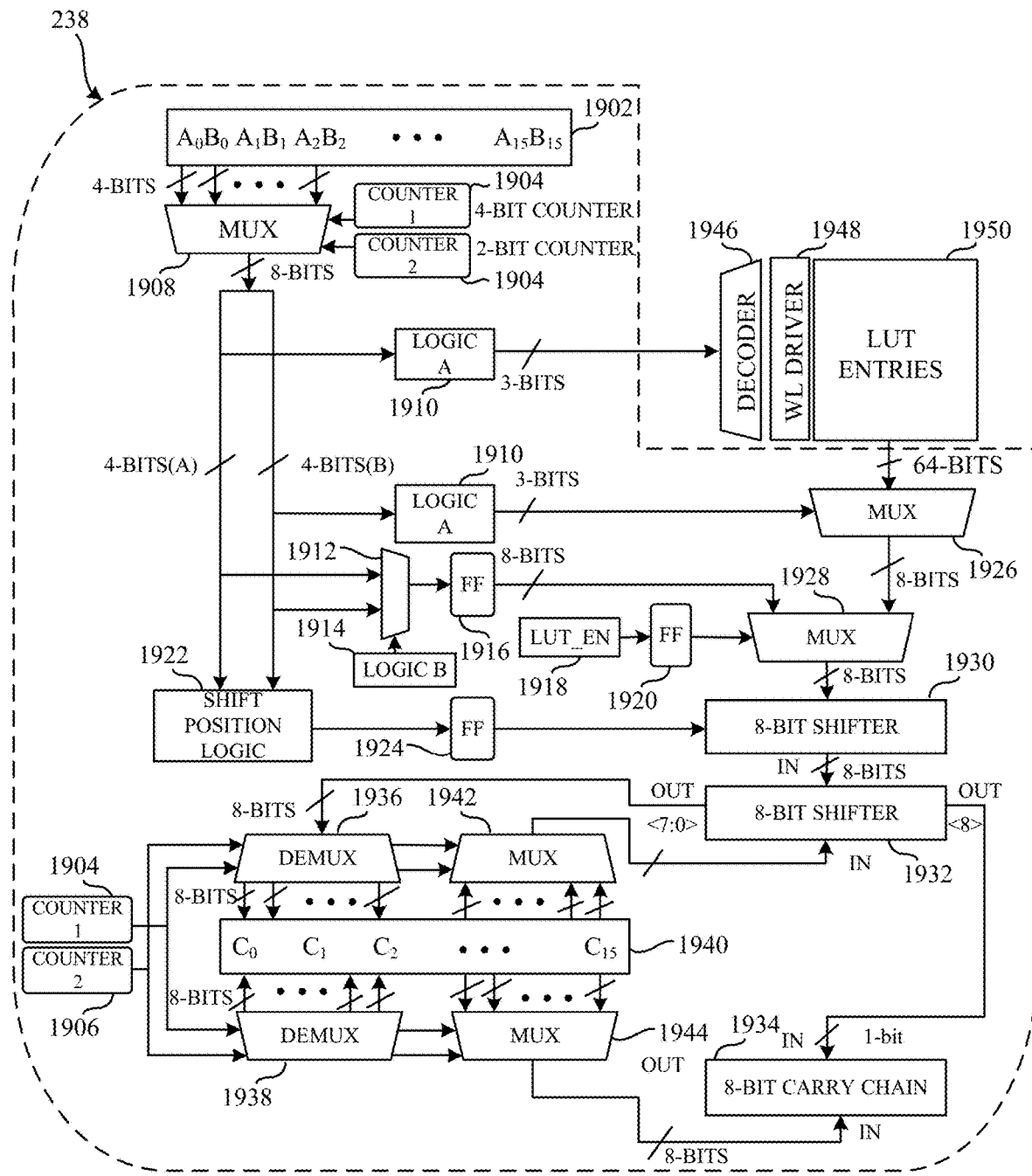
FIG. 19 is a block diagram illustrating additional detail of the compute logic of FIGS. 2 and/or 16.

FIG. 19 is a block diagram illustrating additional detail of the example compute logic 238 of FIGS. 2 and/or 16. In the example of FIG. 19, the compute logic 238 includes an example operand register 1902, an example first counter 1904, an example second counter 1906, an example operand select multiplexer 1908, example converter logic 1910, an example bypass multiplexer 1912, example control logic 1914, an example first feedforward register 1916, example LUT enable logic 1918, an example second feedforward register 1920, example shift position logic 1922, an example third feedforward register 1924, an example select multiplexer 1926, an example LUT enable multiplexer 1928, an example shifter 1930, an example adder 1932, example carry chain logic 1934, an example first accumulation demultiplexer 1936, an example second accumulation demultiplexer 1938, an example accumulation register 1940, an example first accumulation multiplexer 1942, and an example second accumulation multiplexer 1944. The illustrated example of FIG. 19 additionally includes an example decoder 1946, an example WL driver 1948, and example LUT entries 1950.

In the illustrated example of FIG. 19, each of the operand select multiplexer 1908, the converter logic 1910, the bypass multiplexer 1912, the control logic 1914, the LUT enable logic 1918, the shift position logic 1922, the select multiplexer 1926, the LUT enable multiplexer 1928, the shifter 1930, the adder 1932, the carry chain logic 1934, the first accumulation demultiplexer 1936, the second accumulation demultiplexer 1938, the first accumulation multiplexer 1942, and the second accumulation multiplexer 1944 is implemented by logic (e.g., combinational and/or sequential). Additionally, in the example of FIG. 19, each of the operand register 1902, the first counter 1904, the second counter 1906, the first feedforward register 1916, the second feedforward register 1920, the third feedforward register 1924, and the accumulation register 1940 is implemented by a register. In the example of FIG. 19, the decoder 1946, the WL driver 1948, and the LUT entries 1950 are included within a SA of SRAM. In the example of FIG. 19, the hardware of the decoder 1946, the WL driver 1948, and the LUT entries 1950 is not modified. As such, the compute logic 238 achieves PIM without modifying bit-cells in the LUT entries 1950 or the peripheral circuitry (e.g., the decoder 1946, the WL driver 1948, etc.).

In the illustrated example of FIG. 19, the first counter 1904 and/or the second counter 1906 are enabled and/or disabled depending on whether the compute logic 238 is to operate on 4-bit operands, 8-bit operands, and/or 16-bit operands. For example, the first counter 1904 is enabled when the compute logic 238 is to perform MAC operations based on the LUT entries 1950. Additionally or alternatively, the example second counter 1906 is enabled and/or disabled based on the bitlength of the operands. Additionally, the example second counter 1906 may be reset based on a reset value.

Table 8 illustrates parameters of the second counter 1906 with respect to the bitlength of one or more operands to the compute logic 238.

TABLE 8

| Operand Bitlength | Second Counter 1906 Enabled? | Second Counter 1906 Max Count |
| --- | --- | --- |
| 4 | No | Null |
| 8 | Yes | 1 |
| 16 | Yes | 3 |

As illustrated in the Table 8, the second counter 1906 is enabled for operands with bitlengths higher than 4-bits. As such, because MAC operations are based on the 4-bit elements, the compute logic 238 decomposes higher bit-length operands into 4-bit elements and adds appropriately partial products to the corresponding positions (e.g., partitions) of the accumulation register 1940. In the example of FIG. 19, the operand select multiplexer 1908, the first accumulation demultiplexer 1936, the second accumulation demultiplexer 1938, the first accumulation multiplexer 1942, and the second accumulation multiplexer 1944 are controlled (e.g., selected) based on the values of the first counter 1904 and/or the second counter 1906. In the example of FIG. 19, the first counter 1904 is implemented by a 4-bit counter and the second counter 1906 is implemented by a 2-bit counter.

In example operation, the operand register 1902 stores a first operand (e.g., operand A) and/or a second operand (e.g., operand B). For example, each of the first operand and the second operand include sixteen 4-bit elements (e.g., 64-bits). Based on the value of the first counter 1904 and/or the second counter 1906, the operand select multiplexer 1908 generates a first element of the first operand or the second operand. In the example of FIG. 19, if the operand select multiplexer 1908 generates a first element of the first operand (e.g., operand A), the operand select multiplexer 1908 transmits the first element of the first operand to the decoder 1946 (e.g., via the converter logic 1910) and the shift position logic 1922.

In example operation, the converter logic 1910 converts the 4-bit element of the operand to a 3-bit value. In response to receiving the first element of the operand, the decoder 1946 decodes the first element and transmits the decoded value to the WL driver 1948. The WL driver 1948 enables the LUT entries 1950 such that the LUT entries 1950 return first values (e.g., 64-bits) representative of a column of the LUT entries 1950. The example LUT entries 1950 transmit the first values representative of a column of the LUT entries 1950 to the select multiplexer 1926. In the example of FIG. 19, if the operand select multiplexer 1908 generates a first element of the second operand (e.g., operand B), the operand select multiplexer 1908 transmits the first element of the second operand to the select multiplexer 1926 (e.g., via the converter logic 1910) and the shift position logic 1922. In response to receiving the first element of the second operand, the example select multiplexer 1926 generates second values representative of a first row of the column of the LUT entries 1950 selected based on the first element of the first operand. For example, the second values are representative of an entry of the LUT entries 1950 from an intersection of a row and the column of the LUT entries 1950. The example select multiplexer 1926 transmits the second values representative of the first row of the column of the LUT entries 1950 to the shifter 1930 (e.g., via the LUT enable multiplexer 1928).

In example operation, the shift position logic 1922 determines a value to cause the shifter 1930 to shift the second values representative of the first row of the column of the LUT entries 1950 based on the values of the first element of the first operand and/or the first element of the second operand in accordance with teachings of this disclosure. The example shift position logic 1922 transmits (e.g., via the third feedforward register 1924) the value to the shifter 1930 to cause the corresponding shift. In the example of FIG. 19, the shifter 1930 is implemented by an 8-bit shifter. The example shifter 1930 shifts the second values representative of the first row of the column of the LUT entries 1950 based on the value received from the shift position logic 1922. In some examples, the shifter 1930 does not shift the values received from the select multiplexer 1926 (e.g., via the LUT enable multiplexer 1928). The example shifter 1930 transmits the output to the adder 1932.

In example operation, the adder 1932 adds the values output from the shifter 1930 to any values that may be stored in the accumulation register 1940. For example, the adder 1932 operates in conjunction with the carry chain logic 1934, the first accumulation demultiplexer 1936, the second accumulation demultiplexer 1938, the first accumulation multiplexer 1942, and/or the second accumulation multiplexer 1944. In the example of FIG. 19, the adder 1932 is implemented by an 8-bit adder. In the example of FIG. 19, the carry chain logic 1934 is implemented by an 8-bit carry chain.

In example operation, the bypass multiplexer 1912 transmits the element of the first operand or the elements of the second operand to the LUT enable multiplexer 1928 based on the control logic 1914. For example, the control logic 1914 selects which of the first operand or second operand to transmit to the LUT enable multiplexer 1928 based on the values of the first and/or second operand. Table 9 illustrates the operation of the bypass multiplexer 1912 and the control logic 1914. For values 2, 4, and 8, appropriate shifting is applied by the shifter 1930 based on control from the shift position logic 1922.

TABLE 9

| If A ∥ B = | Output of 1912 |
|---|---|
| 0 | 0 |
| 1 | the other operand |
| 2 | the other operand |
| 4 | the other operand |

TABLE 9-continued

| If A ∥ B = | Output of 1912 |
|---|---|
| 8 | the other operand |

In example operation, the LUT enable logic 1918 causes the LUT enable multiplexer 1928 to generate the values output from the select multiplexer 1926 when LUT-based operation is enabled (e.g., for operand values not equal to 0, 1, 2, 4, and/or 8). Alternatively, for some operand values, the example LUT enable logic 1918 causes the LUT enable multiplexer 1928 to generate the values output from the bypass multiplexer 1912 when LUT-based operation can be bypassed. For example, if the first element of the first operand and/or the first element of the second operand is equal to zero, one, two four, or eight, LUT-based operation can be bypassed.

Figure 20:
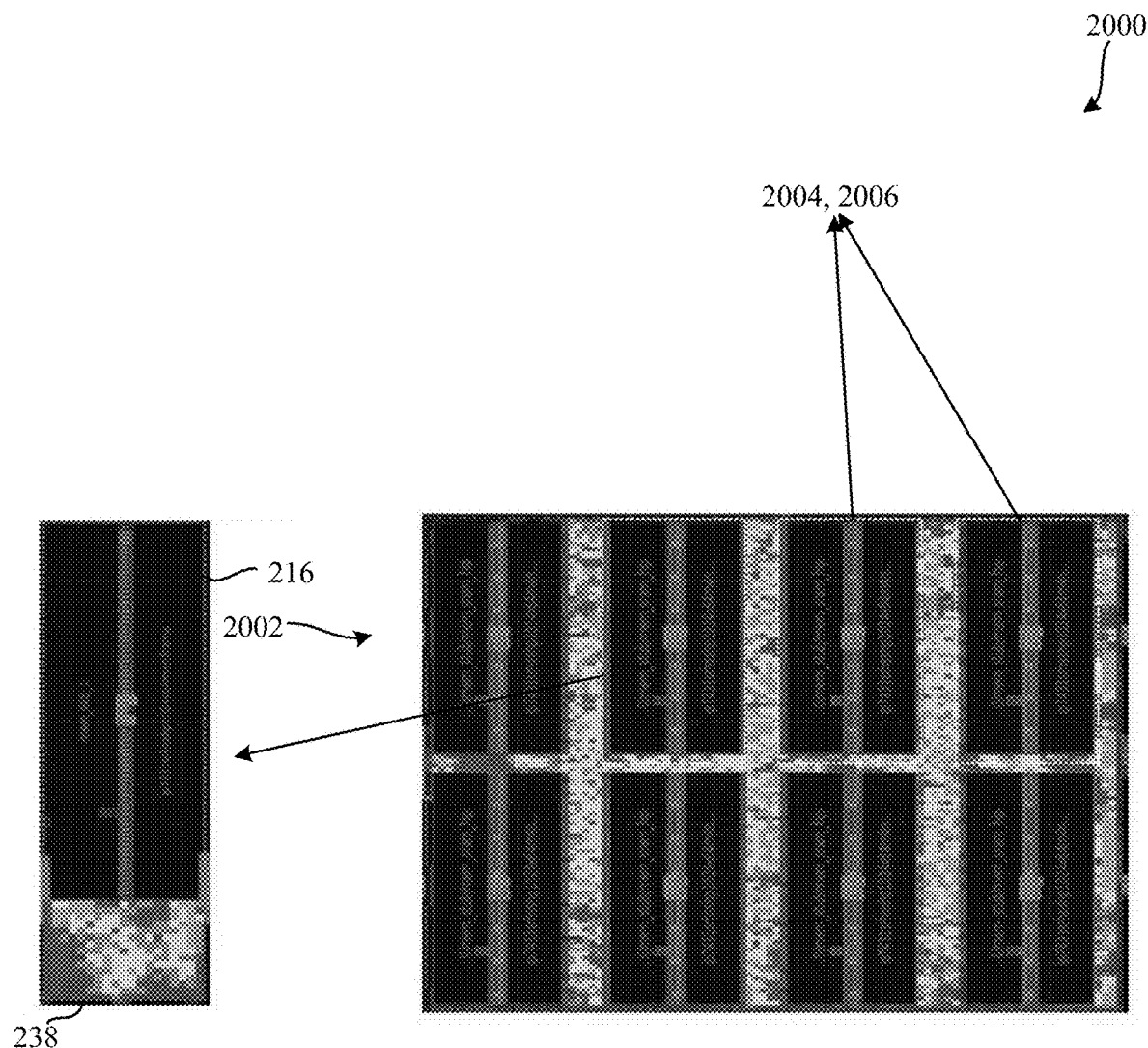
FIG. 20 is a graphical illustration of an example physical layout of the compute logic of FIG. 2, 16 and/or 19 in accordance with teachings of this disclosure.

FIG. 20 is a graphical illustration 2000 of an example physical layout of the compute logic 238 of FIGS. 2, 16 and/or 19 in accordance with teachings of this disclosure. In the example of FIG. 20, the schematic illustration 2000 includes an example memory media 2002. The example memory media 2002 includes the SA 216, the compute logic 238, example compute logic 2004, and example compute logic 2006. The description of the example compute logic 238 may additionally apply to the compute logic 2004 and the compute logic 2006.

In the illustrated example of FIG. 20, the memory media 2002 implements a 64 KB memory. In some examples, the memory media 2002 implements a 2 MB memory. In some examples, the memory media 2002 implements a 4 MB memory. In other examples, the memory media 2002 implements any amount of memory. In the example of FIG. 20, the SA 216 implements 8 KB of memory. In additional or alternative examples, the SA 216 implements 16 KB of memory. In the example of FIG. 20, the memory media 2002 performs four 8-bit MAC operations per clock cycle per SA.

Table 10 illustrates energy consumption in nanojoules (nJ) the memory media 2002 when the SAs (e.g., SA 216) are implemented as 16 KB of memory.

TABLE 10

| Size | Read Energy Consumption (nJ) | Write Energy Consumption (nJ) |
|---|---|---|
| 16 KB per SA | 0.002332 | 0.004492 |
| 2 MB SRAM | 0.00655 | 0.00884 |

Table 10 illustrates example energy consumption for memory media including eight banks of SRAM where each bank includes four sub-banks, each sub-bank includes four SAs, and each SA is implemented by 16 KB (e.g., a 2 MB memory media). The access latency due to the bus in a 2 MB SRAM makes up nearly half of the total latency. Also, the access energy consumption is primarily caused by the bus making up almost 60% of the total access energy consumption.

In the example of FIG. 20, each SA can perform two MAC operations per clock cycle. As such, a 2 MB SRAM including the SAs disclosed herein may compute 256 operations per clock cycle (e.g., 128 multiply and 128 additions). To reduce (e.g., minimize) data-transfer across SRAM, input operands (e.g., weights, activations, etc.) are multi-casted at each decoder level (e.g., at the bank level, at the sub-bank level, and at the SA level). In examples disclosed herein, the amount of multi-casting for each input operand is optimally chosen at each decoder level through an offline dataflow exploration. For example, prior to compute, each SA is loaded with input operands and LUT tables.

Table 11 illustrates performance metrics of the compute logic 238 and SA 216 of FIGS. 2, 16, and/or 19.

TABLE 11

| | Baseline | LUT Based SRAM | | |
| --- | --- | --- | --- | --- |
| | | 0% LUT Access | 50% LUT Access | 100% LUT Access |
| Problem Size (matrices dimensions) | | (1 × 2048), (2048 × 1024) | | |
| Compute to RF bus-width (Bytes/cycle) | 64 | N/A | N/A | N/A |
| Compute to SA bus-width (Bytes/cycle) | N/A | 8 | 8 | 8 |
| SA Read Energy Consumption (nJ) | 747.79 | 746.53 | 1395.72 | 2044.94 |
| SA Write Energy Consumption (nJ) | 3757.91 | 1406.39 | 1406.39 | 1406.39 |
| Interconnect Energy Consumption (nJ) | 2077.28 | 1052.61 | 1052.61 | 1052.61 |
| LUT Compute Energy Consumption (nJ) | N/A | 677.38 | 677.38 | 677.38 |
| MAC Based Compute Energy Consumption (nJ) | 777.92 | N/A | N/A | N/A |
| Total Energy Consumption (nJ) | 7360.9 | 3882.91 | 4532.1 | 5181.32 |
| Improvement in Energy Consumption | | 1.9x | 1.6x | 1.4x |
| Performance (milliseconds) | 0.544128 | 0.278912 | 0.278912 | 0.278912 |
| Improvement in Performance | | 1.95x | 1.95x | 1.95x |

Table 11 illustrates the performance of memory implementing examples disclosed herein. For example, Table 11 illustrates the performance of memory when determining the product, C, of two matrices A and B, where A is a 1×2048 matrix, B is a 2048×1024 matrix, and C is a 1×1024 matrix. In the example of Table 11, the memory operates at a frequency of 1 gigahertz (GHz) with an interface bus of 64 bits. In the example of Table 11, the memory is implemented by 2 MB of memory with 16 KB SAs. Table 11 compares the performance of the memory implementing examples disclosed herein to baseline parameters. For example, the baseline parameters correspond to memory operating at a frequency of 1 GHz with an interface bus of 512 bits, 256 MAC compute engines, and a 16 KB local buffer.

As explained above, the LUT includes 9 out of 16 possible products of 4-bit elements. As such, Table 11 illustrates LUT accesses of 0%, 50% and 100% where the percentage denotes the probability that the LUT can handle the input data element. For example, 50% represents the case where only half of the elements result in LUT access and 0% represent the case where all of the input elements can be computed without LUT access.

As illustrated in Table 11, the "LUT Based SRAM" column includes a utilization factor that indicates the use of the LUT (e.g., 0%, 50%, 100%). Examples disclosed herein achieve an improvement in energy consumption of approximately 1.4× for 100% utilization of the LUT when compared to the baseline. Examples disclosed herein achieve an improvement in performance (e.g., speed of execution) of 1.95× over the baseline. For example, the improvement to performance is, in part, due to optimized data transfers to in-memory compute.

Figure 21:
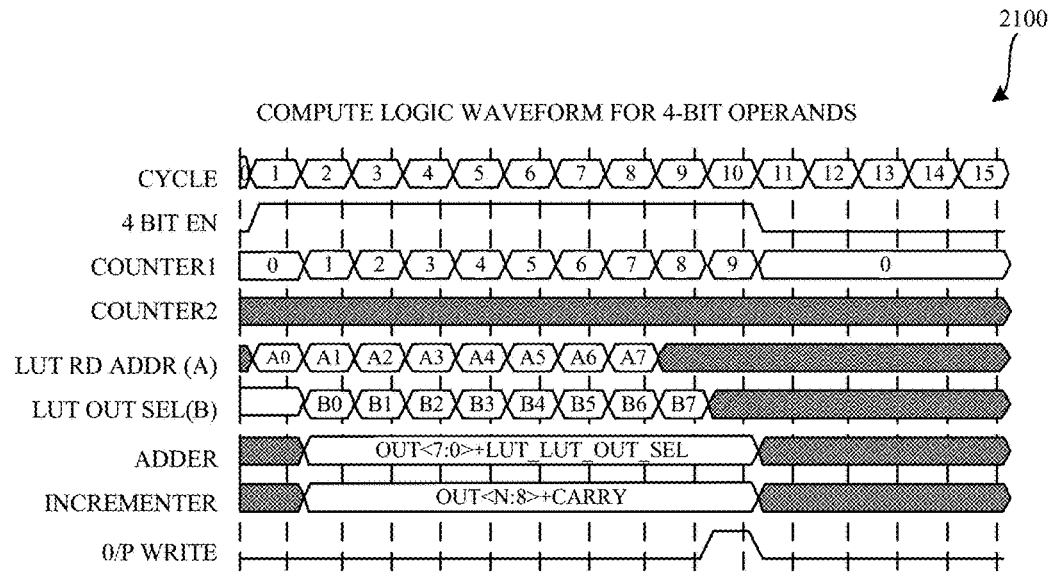
FIG. 21 is a graphical illustration of a timing diagram illustrating example operation of the compute logic of FIGS. 2, 16 and/or 19.

FIG. 21 is a graphical illustration of a timing diagram 2100 illustrating example operation of the compute logic 238 of FIGS. 2, 16 and/or 19. The timing diagram 2100 illustrates example operation of the compute logic 238 with respect to 4-bit operations. For 4-bit operations, the first counter 1904 is enabled and the second counter 1906 is disabled. The second counter 1906 is enabled for higher-bit operations (e.g., 8-bit, 16-bit, etc.). In the example of FIG. 21, the waveforms represent the operation of the compute logic 238 for 4-bit operand matrix multiplication for square matrices of size 8.

Figure 22:
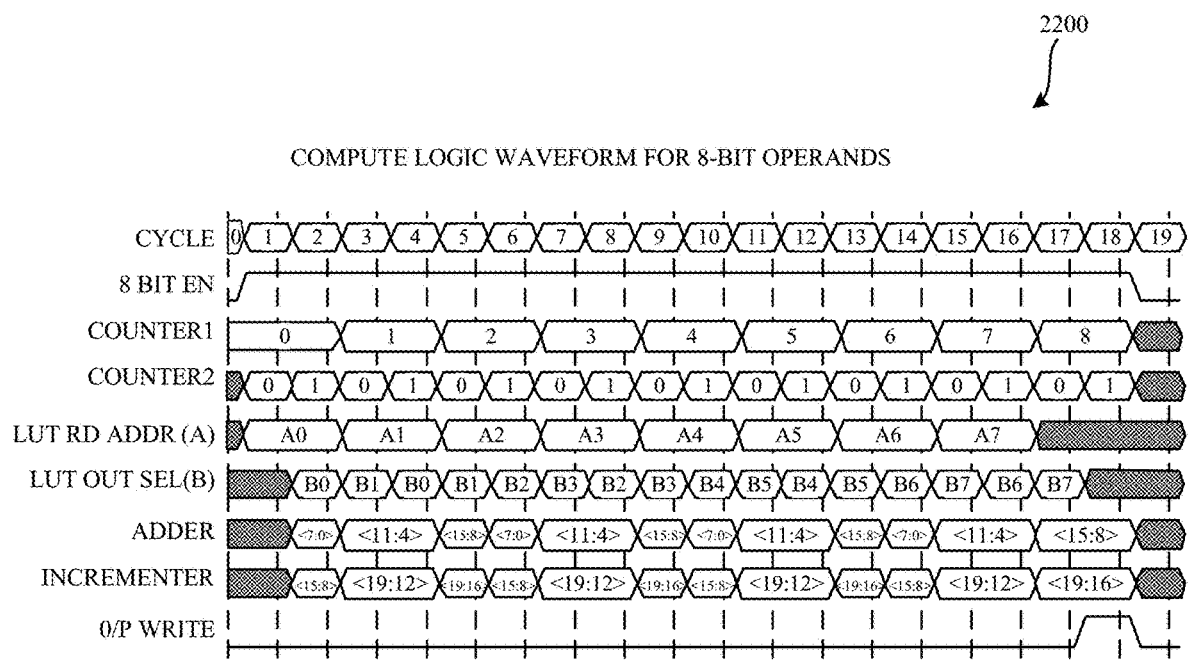
FIG. 22 is a graphical illustration of a timing diagram illustrating example operation of the compute logic of FIGS. 2, 16 and/or 19.

FIG. 22 is a graphical illustration of a timing diagram 2200 illustrating example operation of the compute logic 238 of FIGS. 2, 16 and/or 19. The timing diagram 2200 illustrates example operation of the compute logic 238 with respect to 8-bit operations. In the example of FIG. 22, the waveforms represent the operation of the compute logic 238 for 8-bit operand matrix multiplication for square matrices of size 8. For higher-bit operations, the first counter 1904 is enabled and the second counter 1906 is enabled. For higher-bit operations, the second counter 1906 toggles between a value of zero and a value of one at every toggle of the first counter 1904. As such, the appropriate bits of the accumulation register will be fed as the input to the adder, as discussed below in connection with FIG. 24. If any overflow occurs from the adder, the overflow will be taken care by the carry chain logic by adding one to the next bits.

Figure 23:
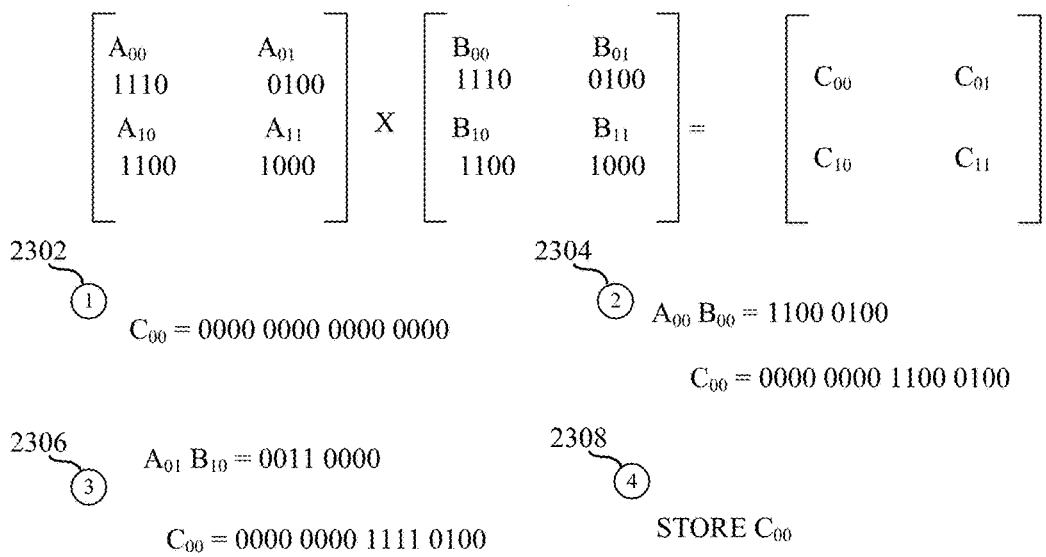
FIG. 23 is a graphical illustration of example multiplication with the compute logic of FIGS. 2, 16 and/or 19 for 4-bit operands.

FIG. 23 is a graphical illustration of example multiplication with the compute logic 238 of FIGS. 2, 16 and/or 19 for 4-bit operands. At operation 2302, the example compute logic 238 reads the operands (e.g., $A_{00}$, $A_{01}$, $B_{00}$, and $B_{10}$) and initializes the accumulation register at the first element of the product matrix, $C_{00}$, to zero. At operation 2304, the example compute logic 238 determines the product of $A_{00}$ and $B_{00}$. At operation 2306, the example compute logic 238 determines the product of $A_{01}$ and $B_{10}$. At operation 2306, the example compute logic 238, either based on the LUT or bypassing the LUT if the values of the operands satisfy the above-mentioned conditions, adds the product of $A_{00}$ and $B_{00}$ to the product of $A_{01}$ and $B_{10}$ and stores the sum at the $C_{oo}$ element of the accumulation register. Subsequently, the example compute logic 238 writes the computed result back to the memory at operation 2308.

Figure 24:
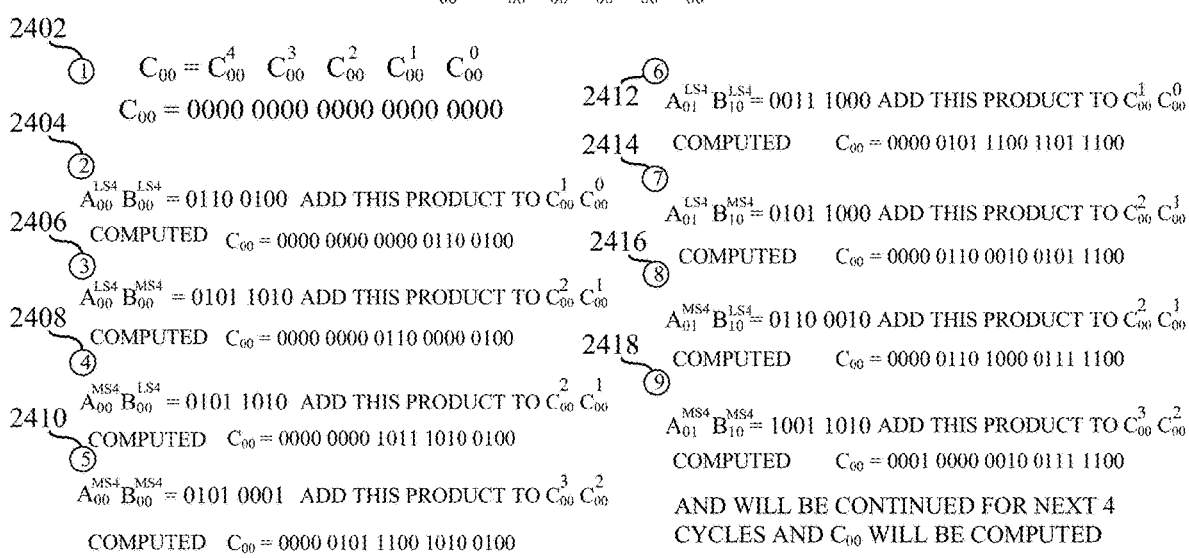
FIG. 24 is a graphical illustration of example multiplication with the compute logic of FIGS. 2, 16, and/or 19 for 8-bit operands.

FIG. 24 is a graphical illustration of example multiplication with the compute logic of FIGS. 2, 16, and/or 19 for 8-bit operands. For the 8-bit operands, the operation of the example compute logic 238 is very similar to that for 4-bit operand matrix multiplication. However, for 8-bit operands, the example compute logic 238 breaks the 8-bit operands down into two 4-bit operands and multiplies the 4-bit halves as shown in the FIG. 24. In the illustrated example of FIG. 24, the compute logic 238 multiples 8-bit operands by executing operations 2402, 2404, 2406, 2408, 2410, 2412,

2414, 2416, and 2418. For example, by executing operations 2404, 2406, 2408, and 2410, the compute logic 238 determines one product of 8-bit operands. By shifting as described above and adding into the Coo element, the example compute logic 238 determines the desired 16-bit product of $A_{00}$ and $B_{00}$.

While example manners of implementing the compute logic 238 of FIG. 2 are illustrated in FIGS. 16 and 19, one or more of the elements, processes and/or devices illustrated in FIGS. 16 and/or 19 may be combined, divided, re-arranged, omitted, eliminated and/or implemented in any other way. Further, the example fetch and decode logic 302, the example operand register 304, the example compute core 306, the example adders 308, the example accumulation register 310, the example control logic 312, example operand select logic 314, the example address generator 316, the example memory address register 318, the example entry select logic 320, the example shifter 322, and/or the example operand register 1902, the example first counter 1904, the example second counter 1906, the example operand select multiplexer 1908, the example converter logic 1910, the example bypass multiplexer 1912, the example control logic 1914, the example first feedforward register 1916, the example LUT enable logic 1918, the example second feedforward register 1920, the example shift position logic 1922, the example third feedforward register 1924, the example select multiplexer 1926, the example LUT enable multiplexer 1928, the example shifter 1930, the example adder 1932, the example carry chain logic 1934, the example first accumulation demultiplexer 1936, the example second accumulation demultiplexer 1938, the example accumulation register 1940, the example first accumulation multiplexer 1942, the example second accumulation multiplexer 1944, and/or, more generally, the example compute logic 238 of FIGS. 16 and/or 19 may be implemented by hardware, software, firmware and/or any combination of hardware, software and/or firmware. Thus, for example, any oft the example fetch and decode logic 302, the example operand register 304, the example compute core 306, the example adders 308, the example accumulation register 310, the example control logic 312, example operand select logic 314, the example address generator 316, the example memory address register 318, the example entry select logic 320, the example shifter 322, and/or the example operand register 1902, the example first counter 1904, the example second counter 1906, the example operand select multiplexer 1908, the example converter logic 1910, the example bypass multiplexer 1912, the example control logic 1914, the example first feedforward register 1916, the example LUT enable logic 1918, the example second feedforward register 1920, the example shift position logic 1922, the example third feedforward register 1924, the example select multiplexer 1926, the example LUT enable multiplexer 1928, the example shifter 1930, the example adder 1932, the example carry chain logic 1934, the example first accumulation demultiplexer 1936, the example second accumulation demultiplexer 1938, the example accumulation register 1940, the example first accumulation multiplexer 1942, the example second accumulation multiplexer 1944, and/or, more generally, the example compute logic 238 of FIGS. 16 and/or 19 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example fetch and decode logic 302, the example operand register 304, the example compute core 306, the example adders 308, the example accumulation register 310, the example control logic 312, example operand select logic 314, the example address generator 316, the example memory address register 318, the example entry select logic 320, the example shifter 322, and/or the example operand register 1902, the example first counter 1904, the example second counter 1906, the example operand select multiplexer 1908, the example converter logic 1910, the example bypass multiplexer 1912, the example control logic 1914, the example first feedforward register 1916, the example LUT enable logic 1918, the example second feedforward register 1920, the example shift position logic 1922, the example third feedforward register 1924, the example select multiplexer 1926, the example LUT enable multiplexer 1928, the example shifter 1930, the example adder 1932, the example carry chain logic 1934, the example first accumulation demultiplexer 1936, the example second accumulation demultiplexer 1938, the example accumulation register 1940, the example first accumulation multiplexer 1942, the example second accumulation multiplexer 1944, and/or, more generally, the example compute logic 238 of FIGS. 16 and/or 19 is/are hereby expressly defined to include a non-transitory computer readable storage device or storage disk such as a memory, a digital versatile disk (DVD), a compact disk (CD), a Blu-ray disk, etc. including the software and/or firmware. Further still, the example compute logic 238 of FIGS. 16 and/or 19 may include one or more elements, processes and/or devices in addition to, or instead of, those illustrated in FIGS. 16 and/or 19, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 25:
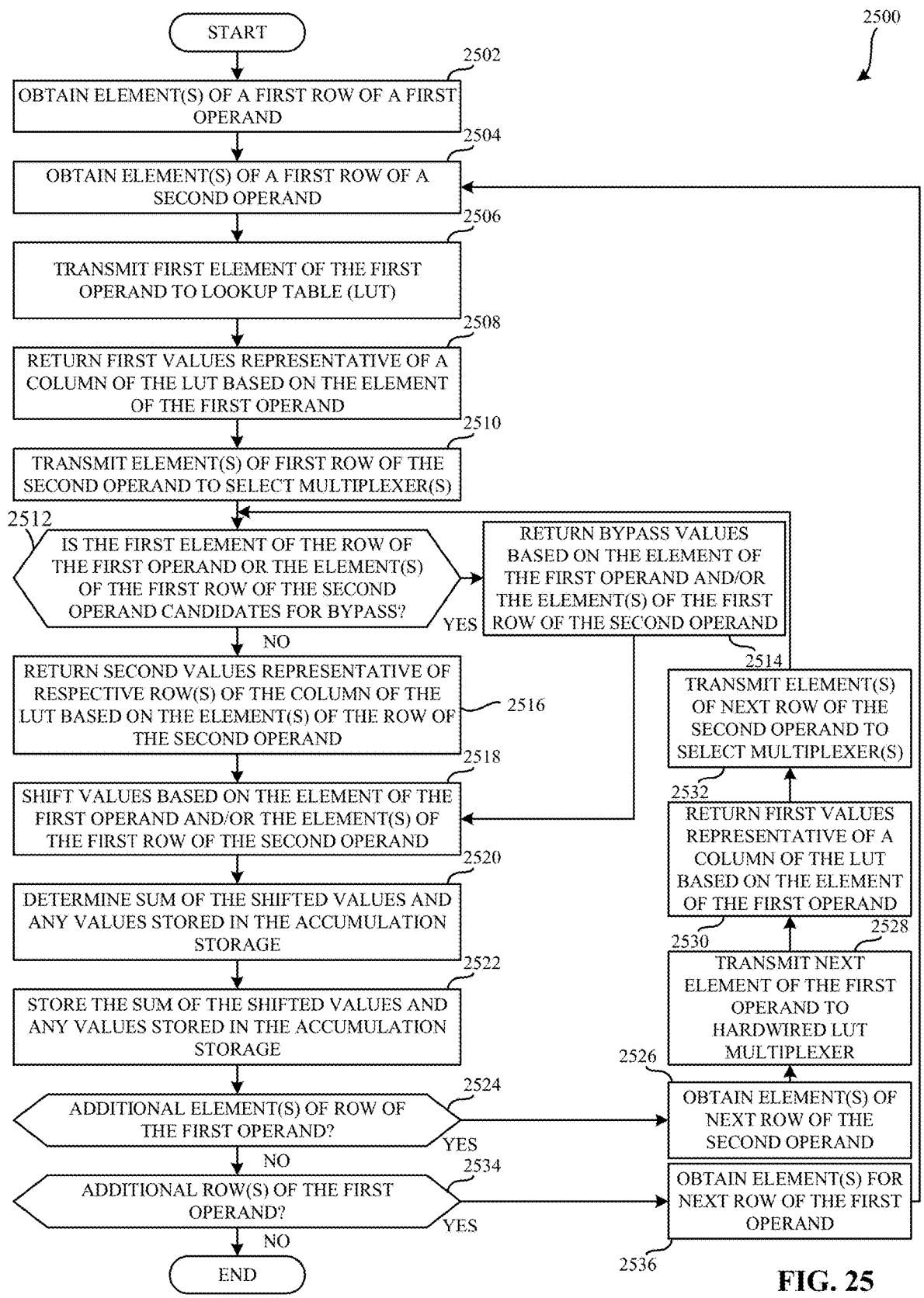
FIG. 25 is a flowchart representative of machine-readable instructions which may be executed to implement the compute logic of FIGS. 2, 16, and/or 19.

A flowchart representative of example hardware logic, machine-readable instructions, hardware implemented state machines, and/or any combination thereof for implementing the compute logic 238 of FIGS. 16 and/or 19 is shown in FIG. 25. The machine-readable instructions may be one or more executable programs or portion(s) of an executable program for execution by a computer processor and/or processor circuitry, such as the processor 2612 shown in the example processor platform 2600 discussed below in connection with FIG. 26. The program may be embodied in software stored on a non-transitory computer readable storage medium such as a CD-ROM, a floppy disk, a hard drive, a DVD, a Blu-ray disk, or a memory associated with the processor 2612, but the entire program and/or parts thereof could alternatively be executed by a device other than the processor 2612 and/or embodied in firmware or dedicated hardware. Further, although the example program is described with reference to the flowchart illustrated in FIG. 25, many other methods of implementing the example compute logic 238 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more devices (e.g., a multi-core processor in a single machine, multiple processors distributed across a server rack, etc.).

The machine-readable instructions described herein may be stored in one or more of a compressed format, an encrypted format, a fragmented format, a compiled format, an executable format, a packaged format, etc. Machine-readable instructions as described herein may be stored as data or a data structure (e.g., portions of instructions, code, representations of code, etc.) that may be utilized to create, manufacture, and/or produce machine executable instructions. For example, the machine-readable instructions may be fragmented and stored on one or more storage devices and/or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine-readable instructions may be stored in multiple parts, which are individually compressed, encrypted, and stored on separate computing devices, wherein the parts when decrypted, decompressed, and combined form a set of executable instructions that implement one or more functions that may together form a program such as that described herein.

In another example, the machine-readable instructions may be stored in a state in which they may be read by processor circuitry, but require addition of a library (e.g., a dynamic link library (DLL)), a software development kit (SDK), an application programming interface (API), etc. in order to execute the instructions on a particular computing device or other device. In another example, the machine-readable instructions may need to be configured (e.g., settings stored, data input, network addresses recorded, etc.) before the machine-readable instructions and/or the corresponding program(s) can be executed in whole or in part. Thus, machine-readable media, as used herein, may include machine-readable instructions and/or program(s) regardless of the particular format or state of the machine-readable instructions and/or program(s) when stored or otherwise at rest or in transit.

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 15 and/or 25 may be implemented using executable instructions (e.g., computer and/or machine-readable instructions) stored on a non-transitory computer and/or machine-readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 25 is a flowchart representative of machine-readable instructions 2500 which may be executed to implement the example compute logic 238 of FIGS. 2, 16, and/or 19. In the example of FIG. 25, a processor may execute the machine-readable instructions 2500 in response to a request from the media access circuitry 108 to perform one or more MAC operations. In the example of FIG. 25, the machine-readable instructions 2500 begin at block 2502 where the compute logic 238 obtains one or more elements of a first row of a first operand. For example, at block 2502, the FAD logic 302 obtains one or more elements of a first row of a first operand. Additionally or alternatively, at block 2502, the example operand register 1902 obtains one or more elements of a first row of a first operand.

In the illustrated example of FIG. 25, at block 2504, the compute logic 238 obtains one or more elements of a first row of a second operand. For example, at block 2504, the FAD logic 302 obtains one or more elements of a first row of a second operand. Additionally or alternatively, at block 2504, the example operand register 1902 obtains one or more elements of a first row of a second operand. At block 2506, the example compute logic 238 transmits a first element of the first row of the first operand to the LUT. For example, at block 2506, the memory address register 318 transmits a first element of the first row of the first operand to the SA 216. Additionally or alternatively, at block 2506, the example operand select multiplexer 1908 transmits a first element of the first row of the first operand to the decoder 1946.

In the illustrated example of FIG. 25, at block 2508, the compute logic 238 returns first values representative of a column of the LUT based on the first element of the first row of the first operand. For example, at block 2508, the entry select logic 320 returns first values representative of a column of the LUT within the SA 216 generated based on the first element of the first row of the first operand. Additionally or alternatively, at block 2508, the example LUT entries 1950 return first values representative of a column of the LUT entries 1950 based on the first element of the first row of the first operand. At block 2510, the example compute logic 238 transmits the elements of the first row of the second operand to one or more select multiplexers. For example, at block 2510, the memory address register 318 transmits the elements of the first row of the second operand to the entry select logic 320. Additionally or alternatively, at block 2510, the example operand select multiplexer 1908 transmits the elements of the select multiplexer 1926.

In the illustrated example of FIG. 25, at block 2512, the compute logic 238 determines whether at least one of the first element of the first row of the first operand or the element(s) of the first row of the second operand is a candidate for bypass. For example, at block 2512, the entry select logic 320 determines whether at least one of the first element of the first row of the first operand or the element(s) of the first row of the second operand is a candidate for bypass. Additionally or alternatively, at block 2512, the example bypass multiplexer 1912 determines whether at least one of the first element of the first row of the first operand or the element(s) of the first row of the second operand is a candidate for bypass. In the example of FIG. 25, candidates for bypass include elements equal to zero, one, two, four, and eight.

In the illustrated example of FIG. 25, in response to the compute logic 238 determining that at least one of the first element of the first row of the first operand or the element(s) of the first row of the second operand is a candidate for bypass (block 2512: YES), the machine-readable instructions 2500 proceed to block 2514. In response to the example compute logic 238 determining that at least one of the first element of the first row of the first operand or the element(s) of the first row of the second operand is not a candidate for bypass (block 2512: NO), the machine-readable instructions 2500 proceed to block 2516. At block 2514, the example compute logic 238 returns first bypass values based on at least one of the first element of the first row of the first operand or the element(s) of the first row of the second operand. For example, at block 2514, the shifter 322 returns first bypass values based on at least one of the first element of the first row of the first operand or the element(s) of the first row of the second operand. Additionally or alternatively, at block 2514, the example LUT enable multiplexer 1928 returns first bypass values based on at least one of the first element of the first row of the first operand or the element(s) of the first row of the second operand.

In the illustrated example of FIG. 25, at block 2516, the compute logic 238 returns second values representative of one or more respective rows of the column of the LUT within the SA 216 generated based on the one or more elements of the row of the second operand. For example, at block 2516, the entry select logic 320 returns second values representative of one or more respective rows of the column of the LUT based on the one or more elements of the row of the second operand. Additionally or alternatively, at block 2516, the example select multiplexer 1926 returns second values representative of one or more respective rows of the column of the LUT entries 1950 based on the one or more elements of the row of the second operand.

At block 2518, the example compute logic 238 shifts the values (e.g., second values representative of one or more respective rows of the column of the LUT entries 1950 or the bypass values) based on at least one of the first element of the first row of the first operand or the element(s) of the first row of the second operand. For example, at block 2518, the shifter 322 shifts the values (e.g., second values representative of one or more respective rows of the column of the LUT entries 1950 or the bypass values) based on at least one of the first element of the first row of the first operand or the element(s) of the first row of the second operand. Additionally or alternatively, at block 2518, the example shifter 1930 shifts the values (e.g., second values representative of one or more respective rows of the column of the LUT entries 1950 or the bypass values) based on at least one of the first element of the first row of the first operand or the element(s) of the first row of the second operand. At block 2520, the example compute logic 238 determines the sum of the shifted values and any values stored in an accumulation storage. For example, at block 2520, the adders 308 determine the sum of the shifted values and any values stored in the accumulation register 310. Additionally or alternatively, at block 2520, the example adder 1932 determines the sum of the shifted values and any values stored in the accumulation register 1940.

As described above, the accumulation storage (e.g., the accumulation register 310 and/or the accumulation register 1940) may be partitioned to represent elements of a product matrix. For example, one or more of the accumulation register 310 or the accumulation register 1940 may be partitioned to represent a first element (e.g., $C_0$), a second element (e.g., $C_1$), a third element (e.g., $C_2$), and/or a fourth element (e.g., $C_3$) of a product matrix. In the example of FIG. 25, at block 2522, the compute logic 238 stores the sum of the shifted values and any values stored in the accumulation storage. For example, at block 2522, the accumulation register 310 stores the sum of the shifted values and any values stored in the accumulation storage. Additionally or alternatively, at block 2522, the example accumulation register 1940 stores the sum of the shifted values and any values stored in the accumulation register 1940.

In the illustrated example of FIG. 25, at block 2524, the compute logic 238 determines whether there are additional elements of the row of the first operand. For example, at block 2524, the operand select logic 314 determines whether there are additional elements of the row of the first operand. Additionally or alternatively, at block 2524, the example operand register 1902 determines whether there are additional elements of the row of the first operand. In response to the example compute logic 238 determining that there are additional elements of the row of the first operand (block 2524: YES), the machine-readable instructions 2500 proceed to block 2526. In response to the example compute logic 238 determining that there are not additional elements of the row of the first operand (block 2524: NO), the machine-readable instructions 2500 proceed to block 2534.

In the illustrated example of FIG. 25, at block 2526, the compute logic 238 obtains one or more elements of a next row of the second operand. For example, at block 2526, the FAD logic 302 obtains one or more elements of a next row of the second operand. Additionally or alternatively, at block 2526, the example operand register 1902 obtains one or more elements of a next row of the second operand. At block 2528, the example compute logic 238 transmits a next element of the first row of the first operand to the LUT. For example, at block 2528, the memory address register 318 transmits a next element of the first row of the first operand to the SA 216. Additionally or alternatively, at block 2528, the example operand select multiplexer 1908 transmits a next element of the first row of the first operand to the decoder 1946.

In the illustrated example of FIG. 25, at block 2530, the compute logic 238 returns first values representative of a column of the LUT based on the next element of the first row of the first operand. For example, at block 2530, the entry select logic 320 returns first values representative of a column of the LUT within the SA 216 generated based on the next element of the first row of the first operand. Additionally or alternatively, at block 2530, the example LUT entries 1950 return first values representative of a column of the LUT entries 1950 based on the next element of the first row of the first operand. At block 2532, the example compute logic 238 transmits the elements of the next row of the second operand to one or more select multiplexers. For example, at block 2532, the memory address register 318 transmits the elements of the next row of the second operand to the entry select logic 320. Additionally or alternatively, at block 2532, the example operand select multiplexer 1908 transmits the elements of the next row of the second operand to the select multiplexer 1926.

In the illustrated example of FIG. 25, at block 2534, the compute logic 238 determines whether there are additional rows of the first operand. For example, at block 2534, the FAD logic 302 determines whether there are additional rows of the first operand. Additionally or alternatively, at block 2534, the example operand register 1902 determines whether there are additional rows of the first operand. In response to the example compute logic 238 determining that there are additional rows of the first operand (block 2534: YES), the machine-readable instructions 2500 proceed to block 2536. In response to the compute logic 238 determining that there are not additional rows of the first operand (block 2534: NO), the machine-readable instructions 2500 terminate.

In the illustrated example of FIG. 25, at block 2536, the compute logic 238 obtains one or more elements of a next row of a first operand. For example, at block 2536, the FAD logic 302 obtains one or more elements of a next row of a first operand. Additionally or alternatively, at block 2536, the example operand register 1902 obtains one or more elements of a next row of a first operand.

Figure 26:
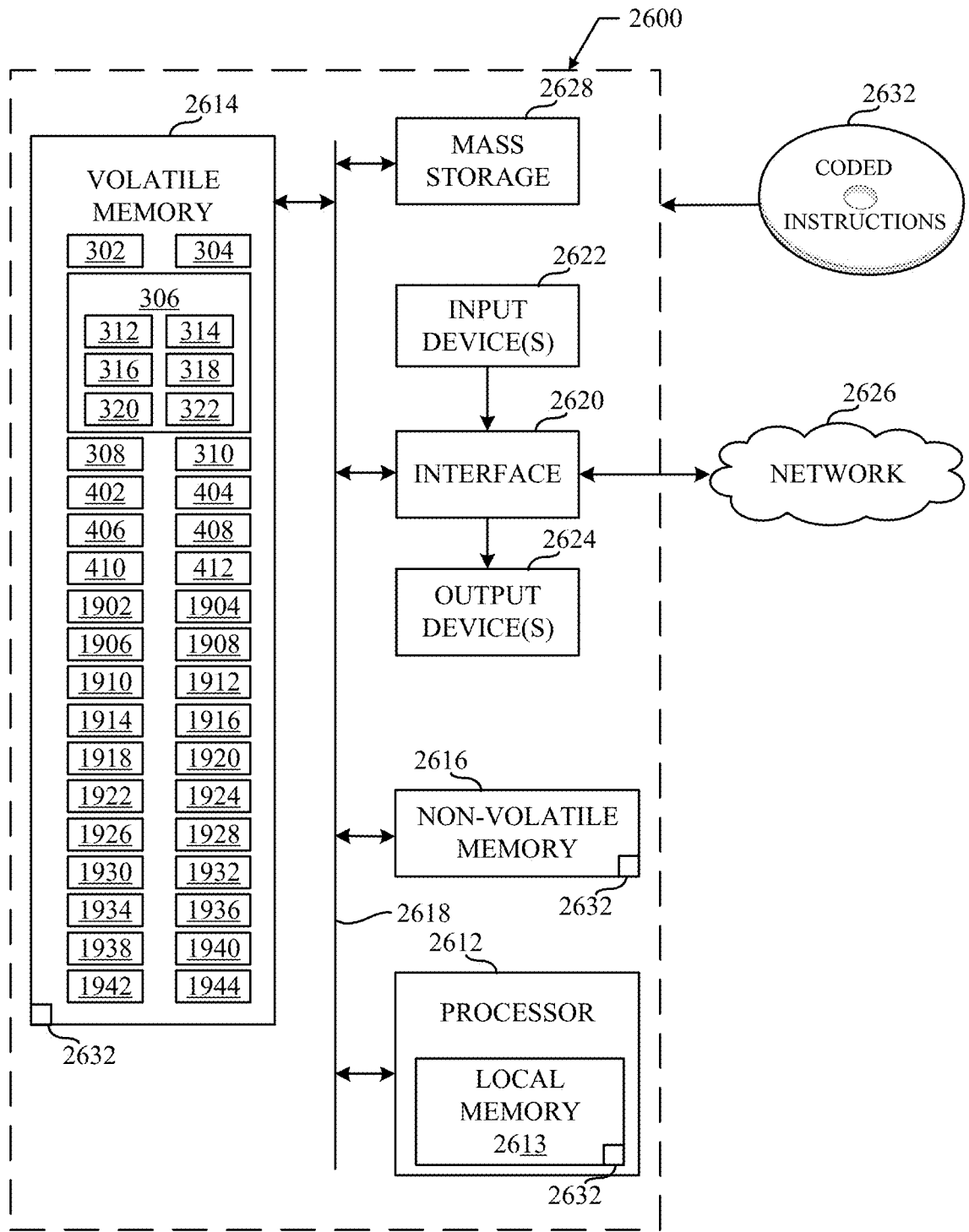
FIG. 26 is a block diagram of an example processor platform structured to execute the instructions of FIGS. 15 and/or 25 to implement the compute logic of FIGS. 2, 3, 4, 16, and/or 19.

FIG. 26 is a block diagram of an example processor platform 2600 structured to execute the instructions of FIGS. 15 and/or 25 to implement the compute logic 238 of FIGS. 2, 3, 4, 16, and/or 19. The processor platform 2600 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 2600 of the illustrated example includes a processor 2612. The processor 2612 of the illustrated example is hardware. For example, the processor 2612 can be implemented by one or more integrated circuits, logic circuits, microprocessors, GPUs, DSPs, or controllers from any desired family or manufacturer. The hardware processor 2612 may be a semiconductor based (e.g., silicon based) device.

The processor 2612 of the illustrated example includes a local memory 2613 (e.g., a cache). The processor 2612 of the illustrated example is in communication with a main memory including a volatile memory 2614 and a non-volatile memory 2616 via a bus 2618. The volatile memory 2614 may be implemented by SRAM, Synchronous Dynamic Random-Access Memory (SDRAM), Dynamic Random-Access Memory (DRAM), RAMBUS® Dynamic Random-Access Memory (RDRAM®) and/or any other type of random-access memory device. In this example, the volatile memory 2614 implements the example fetch and decode logic 302, the example operand register 304, the example compute core 306, the example adders 308, the example accumulation register 310, the example control logic 312, example operand select logic 314, the example address generator 316, the example memory address register 318, the example entry select logic 320, the example shifter 322, and/or the example control logic and operand storage 402, the example hardwired LUT multiplexer 404, the example first select multiplexer 406a, the example second select multiplexer 406b, the example nth select multiplexer 406c, the example shift and adder logic 408, the example accumulation storage 410, the example control logic 412, and/or the example operand register 1902, the example first counter 1904, the example second counter 1906, the example operand select multiplexer 1908, the example converter logic 1910, the example bypass multiplexer 1912, the example control logic 1914, the example first feedforward register 1916, the example LUT enable logic 1918, the example second feedforward register 1920, the example shift position logic 1922, the example third feedforward register 1924, the example select multiplexer 1926, the example LUT enable multiplexer 1928, the example shifter 1930, the example adder 1932, the example carry chain logic 1934, the example first accumulation demultiplexer 1936, the example second accumulation demultiplexer 1938, the example accumulation register 1940, the example first accumulation multiplexer 1942, the example second accumulation multiplexer 1944, and/or, more generally, the example compute logic 238 of FIGS. 2, 3, 4, 16, and/or 19. The non-volatile memory 2616 may be implemented by flash memory and/or any other desired type of memory device. Access to the main memory 2614, 2616 is controlled by a memory controller.

The processor platform 2600 of the illustrated example also includes an interface circuit 2620. The interface circuit 2620 may be implemented by any type of interface standard, such as an Ethernet interface, a universal serial bus (USB), a Bluetooth® interface, a near field communication (NFC) interface, and/or a PCI express interface.

In the illustrated example, one or more input devices 2622 are connected to the interface circuit 2620. The input device(s) 2622 permit(s) a user to enter data and/or commands into the processor 2612. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 2624 are also connected to the interface circuit 2620 of the illustrated example. The output devices 2624 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 2620 of the illustrated example, thus, typically includes a graphics driver card, a graphics driver chip and/or a graphics driver processor.

The interface circuit 2620 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 2626. The communication can be via, for example, an Ethernet connection, a digital subscriber line (DSL) connection, a telephone line connection, a coaxial cable system, a satellite system, a line-of-site wireless system, a cellular telephone system, etc.

The processor platform 2600 of the illustrated example also includes one or more mass storage devices 2628 for storing software and/or data. Examples of such mass storage devices 2628 include floppy disk drives, hard drive disks, compact disk drives, Blu-ray disk drives, redundant array of independent disks (RAID) systems, and digital versatile disk (DVD) drives.

Machine executable instructions 2632 include the machine-readable instructions 1500 of FIG. 15 and/or the machine-readable instructions 2500 of FIG. 25 and may be stored in the mass storage device 2628, in the volatile memory 2614, in the non-volatile memory 2616, and/or on a removable non-transitory computer readable storage medium such as a CD or DVD.

Figure 27:
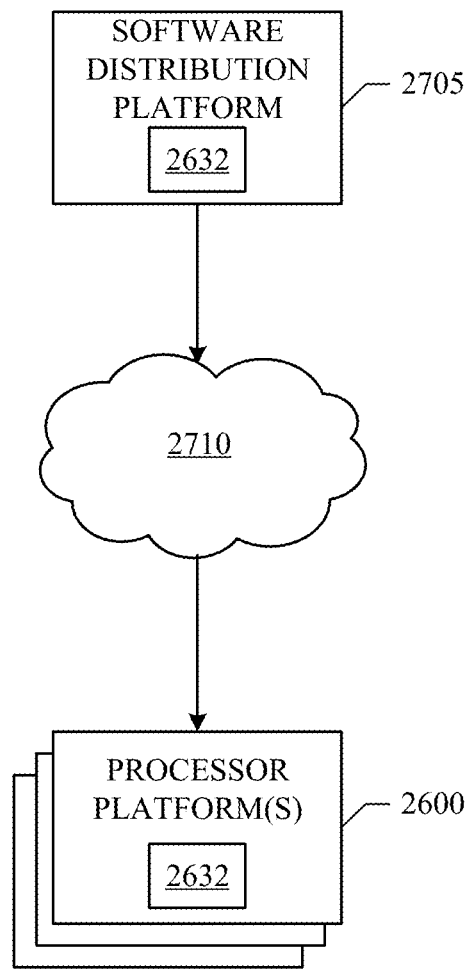
FIG. 27 is a block diagram of an example software distribution platform to distribute software (e.g., software corresponding to the example computer readable instructions of FIGS. 15 and/or 25) to client devices such as those owned and/or operated by consumers, retailers, and/or original equipment manufacturers (OEMs).

A block diagram illustrating an example software distribution platform 2705 to distribute software such as the example computer readable instructions 2632 of FIG. 26 to devices owned and/or operated by third parties is illustrated in FIG. 27. The example software distribution platform 2705 may be implemented by any computer server, data facility, cloud service, etc., capable of storing and transmitting software to other computing devices. The third parties may be customers of the entity owning and/or operating the software distribution platform. For example, the entity that owns and/or operates the software distribution platform may be a developer, a seller, and/or a licensor of software such as the example computer readable instructions 2632 of FIG. 26. The third parties may be consumers, users, retailers, OEMs, etc., who purchase and/or license the software for use and/or re-sale and/or sub-licensing. In the illustrated example, the software distribution platform 2705 includes one or more servers and one or more storage devices. The storage devices store the computer readable instructions 2632, which may correspond to the example computer readable instructions 1500 of FIG. 15 and/or the computer readable instructions 2500 of FIG. 25, as described above. The one or more servers of the example software distribution platform 2705 are in communication with a network 2710, which may correspond to any one or more of the Internet and/or any of the example networks described above. In some examples, the one or more servers are responsive to requests to transmit the software to a device owned and/or operated by a requesting party as part of a commercial transaction. Payment for the delivery, sale and/or license of the software may be handled by the one or more servers of the software distribution platform and/or via a third-party payment entity. The servers enable purchasers and/or licensors to download the computer readable instructions 2632 from the software distribution platform 2705. For example, the software, which may correspond to the example computer readable instructions 2632 of FIG. 26, may be downloaded to the example processor platform 2600, which is to execute the computer readable instructions 2632 to implement the compute logic 238 of FIGS. 2, 3, 4, 16, and/or 19. In some example, one or more servers of the software distribution platform 2705 periodically offer, transmit, and/or force updates to the software (e.g., the example computer readable instructions 2632 of FIG. 26) to ensure improvements, patches, updates, etc. are distributed and applied to the software at the end user devices.

From the foregoing, it will be appreciated that example methods, apparatus and articles of manufacture have been disclosed that improve in-memory multiply and accumulate operations. Examples disclosed herein include a LUT-based, bit-line-computing-free, PIM compute logic for in-cache-acceleration of various machine learning model (e.g., DNN) inference workloads. Examples disclosed herein efficiently leverage array-level parallelism for performance gains, while reducing data access energy consumption. The example compute logic disclosed herein is located adjacent to corresponding SAs within memory and utilize the increase (e.g., maximum) bandwidth available and do not alter the bit-line circuitry of corresponding SAs. Examples disclosed herein exhibit between 1.45 times and 1.95 times increases in processing speed and between 1.2 times and 1.9 times improvement in energy consumption compared to PNM designs. The area overhead for adding the compute resource in the proposed SRAM is 14% for 2 MB SRAM, which decreases as the size of memory grows. Examples disclosed herein achieve 16% less area consumption and offer 55% more energy efficiency. Examples disclosed herein increase SRAM SA locations and improve (e.g., optimize) area consumption efficiency. Examples disclosed herein include a highly optimized and multi-precision design that is positioned adjacent to smaller SRAM-SAs. Thus, examples disclosed herein provide very fine-grained compute capability where dataflow can exploit higher bandwidth due to parallelism.

Examples disclosed herein enable in-memory compute without modifying the memory cell-arrays or corresponding peripheral circuitry and therefore preserve memory density. Examples disclosed herein yield a 1.95× acceleration (e.g., increased processing speed) as compared to PNM designs, while reducing power consumption by 1.4 to 1.9× across various LUT utilization configurations. Disclosed methods, apparatus and articles of manufacture improve the efficiency of using a computing device by decreasing execution time of workloads, reducing energy consumption of computing devices when executing workloads, and improving memory density for PIM design. The disclosed methods, apparatus and articles of manufacture are accordingly directed to one or more improvement(s) in the functioning of a computer.

Example methods, apparatus, systems, and articles of manufacture to improve in-memory multiply and accumulate operations are disclosed herein. Further examples and combinations thereof include the following:

Example 1 includes an apparatus to improve in-memory multiply and accumulate operations, the apparatus comprising a first multiplexer in a subarray of memory, the first multiplexer including first select terminals, first input terminals, and first output terminals, the first input terminals to receive first values representative of a column of a lookup table (LUT) including entries to represent products of four-bit numbers, the first multiplexer to return second values from an intersection of a row and the column of the LUT based on a first element of a first operand received at the first select terminals, shift and adder logic in the subarray, the shift and adder logic including second input terminals and second output terminals, the second input terminals in circuit with the first output terminals, the shift and adder logic to shift the second values based on at least one of the first element of the first operand or a first element of a second operand, and accumulation storage in the subarray, the accumulation storage including third input terminals in circuit with the second output terminals, the accumulation storage to store at least the shifted second values.

Example 2 includes the apparatus of example 1, further including a second multiplexer in the subarray, the second multiplexer including second select terminals, fourth input terminals, and third output terminals, the fourth input terminals to represent respective columns of the LUT, the second multiplexer to return the first values representative of the column of the LUT based on the first element of the first operand, the first element of the first operand received at the first select terminals.

Example 3 includes the apparatus of example 2, wherein the row is a first row, the column of the LUT is a first column and the second multiplexer is to return third values representative of a second column of the LUT based on a second element of the second operand received at the second select terminals, the first multiplexer is to return fourth values from an intersection of a second row and the second column of the LUT based on a second element of the first operand received at the first select terminals, the shift and adder logic is to shift the fourth values based on at least one of the second element of the first operand or the second element of the second operand, and the accumulation storage is to store a sum of the shifted second values and the shifted fourth values.

Example 4 includes the apparatus of example 1, wherein the LUT is stored in the subarray of the memory.

Example 5 includes the apparatus of example 4, wherein two or more rows of the subarray of the memory are reserved for performing operations other than multiply and accumulate operations.

Example 6 includes the apparatus of example 1, wherein the row of the column of the LUT is a first row and the apparatus further includes a second multiplexer in the subarray, the second multiplexer including second select terminals, fourth input terminals, and third output terminals, the fourth input terminals to receive the first values representative of the column of the LUT, the second multiplexer to return third values from an intersection of a second row and the column of the LUT based on a second element of the first operand received at the second select terminals.

Example 7 includes the apparatus of example 6, wherein the first operand corresponds to a first row of a first matrix, the second operand corresponds to a first row of a second matrix, and the accumulation storage is partitioned to represent at least a first element and a second element of a product matrix, the first element to store the shifted second values from the intersection of the first row and the column of the LUT, the second element to store shifted fourth values from the intersection of the second row and the column.

Example 8 includes the apparatus of example 1, wherein the second values from the intersection of the row and the column of the LUT are representative of a product of the first element of the first operand and the first element of the second operand.

Example 9 includes a non-transitory computer-readable medium comprising instructions which, when executed, cause at least one processor within a subarray of memory to at least receive first values representative of a column of a lookup table (LUT) including entries to represent products of four-bit numbers, return second values from an intersection of a row and the column of the LUT based on a first element of a first operand, shift the second values based on at least one of the first element of the first operand or a first element of a second operand, and store at least the shifted second values.

Example 10 includes the non-transitory computer-readable medium of example 9, wherein the instructions, when executed, cause the at least one processor to return the first values representative of the column of the LUT based on the first element of the first operand.

Example 11 includes the non-transitory computer-readable medium of example 10, wherein the row is a first row, the column of the LUT is a first column and the instructions, when executed, cause the at least one processor to return third values representative of a second column of the LUT based on a second element of the second operand, return fourth values from an intersection of a second row and the second column of the LUT based on a second element of the first operand, shift the fourth values based on at least one of the second element of the first operand or the second element of the second operand, and store a sum of the shifted second values and the shifted fourth values.

Example 12 includes the non-transitory computer-readable medium of example 9, wherein the LUT is stored in the subarray of the memory.

Example 13 includes the non-transitory computer-readable medium of example 12, wherein two or more rows of the subarray of the memory are reserved for performing operations other than multiply and accumulate operations.

Example 14 includes the non-transitory computer-readable medium of example 9, wherein the row of the column of the LUT is a first row and the instructions, when executed, cause the at least one processor to receive the first values representative of the column of the LUT, and return third values from an intersection of a second row and the column of the LUT based on a second element of the first operand.

Example 15 includes the non-transitory computer-readable medium of example 14, wherein the first operand corresponds to a first row of a first matrix, the second operand corresponds to a first row of a second matrix, and the instructions, when executed, cause the at least one processor to store the shifted second values and shifted fourth values in a register that is partitioned to represent at least a first element and a second element of a product matrix, the first element to store the shifted second values from the intersection of the first row and the column of the LUT, the second element to store the shifted fourth values from the intersection of the second row and the column.

Example 16 includes the non-transitory computer-readable medium of example 9, wherein the second values from the intersection of the row and the column of the LUT are representative of a product of the first element of the first operand and the first element of the second operand.

Example 17 includes a method to improve in-memory multiply and accumulate operations, the method comprising receiving, with a first multiplexer in a subarray of memory, first values representative of a column of a lookup table (LUT) including entries to represent products of four-bit numbers, returning, with the first multiplexer, second values from an intersection of a row and the column of the LUT based on a first element of a first operand, shifting, with shift and adder logic in the subarray, the second values based on at least one of the first element of the first operand or a first element of a second operand, and storing, in accumulation storage in the subarray, at least the shifted second values.

Example 18 includes the method of example 17, further including returning, with a second multiplexer in the subarray, the first values representative of the column of the LUT based on the first element of the first operand.

Example 19 includes the method of example 18, wherein the row is a first row, the column of the LUT is a first column and the method further includes returning, with the second multiplexer, third values representative of a second column of the LUT based on a second element of the second operand, returning, with the first multiplexer, fourth values from an intersection of a second row and the second column of the LUT based on a second element of the first operand, shifting, with the shift and adder logic, the fourth values based on at least one of the second element of the first operand or the second element of the second operand, and storing, in the accumulation storage, a sum of the shifted second values and the shifted fourth values.

Example 20 includes the method of example 17, wherein the LUT is stored in the subarray of the memory.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus to improve in-memory multiply and accumulate operations, the apparatus comprising:
    a first multiplexer in a subarray of memory, the first multiplexer including first select terminals, first input terminals, and first output terminals, the first input terminals to receive first values representative of a column of a lookup table (LUT) including entries to represent products of four-bit numbers, the first multiplexer to return second values from an intersection of a row and the column of the LUT based on a first element of a first operand received at the first select terminals;
    shift and adder logic in the subarray, the shift and adder logic including second input terminals and second output terminals, the second input terminals in circuit with the first output terminals, the shift and adder logic to shift the second values based on at least one of the first element of the first operand or a first element of a second operand; and
    accumulation storage in the subarray, the accumulation storage including third input terminals in circuit with the second output terminals, the accumulation storage to store at least the shifted second values.

2. The apparatus of claim 1, further including a second multiplexer in the subarray, the second multiplexer including second select terminals, fourth input terminals, and third output terminals, the fourth input terminals to represent respective columns of the LUT, the second multiplexer to return the first values representative of the column of the LUT based on the first element of the first operand, the first element of the first operand received at the first select terminals.

3. The apparatus of claim 2, wherein the row is a first row, the column of the LUT is a first column and:

the second multiplexer is to return third values representative of a second column of the LUT based on a second element of the second operand received at the second select terminals;
the first multiplexer is to return fourth values from an intersection of a second row and the second column of the LUT based on a second element of the first operand received at the first select terminals;
the shift and adder logic is to shift the fourth values based on at least one of the second element of the first operand or the second element of the second operand; and
the accumulation storage is to store a sum of the shifted second values and the shifted fourth values.

4. The apparatus of claim 1, wherein the LUT is stored in the subarray of the memory.

5. The apparatus of claim 4, wherein two or more rows of the subarray of the memory are reserved for performing operations other than multiply and accumulate operations.

6. The apparatus of claim 1, wherein the row of the column of the LUT is a first row and the apparatus further includes a second multiplexer in the subarray, the second multiplexer including second select terminals, fourth input terminals, and third output terminals, the fourth input terminals to receive the first values representative of the column of the LUT, the second multiplexer to return third values from an intersection of a second row and the column of the LUT based on a second element of the first operand received at the second select terminals.

7. The apparatus of claim 6, wherein the first operand corresponds to a first row of a first matrix, the second operand corresponds to a first row of a second matrix, and the accumulation storage is partitioned to represent at least a first element and a second element of a product matrix, the first element to store the shifted second values from the intersection of the first row and the column of the LUT, the second element to store shifted fourth values from the intersection of the second row and the column.

8. The apparatus of claim 1, wherein the second values from the intersection of the row and the column of the LUT are representative of a product of the first element of the first operand and the first element of the second operand.

9. A non-transitory computer-readable medium comprising instructions which, when executed, cause at least one processor within a subarray of memory to at least:
    receive first values representative of a column of a lookup table (LUT) including entries to represent products of four-bit numbers;
    return second values from an intersection of a row and the column of the LUT based on a first element of a first operand;
    shift the second values based on at least one of the first element of the first operand or a first element of a second operand; and
    store at least the shifted second values.

10. The non-transitory computer-readable medium of claim 9, wherein the instructions, when executed, cause the at least one processor to return the first values representative of the column of the LUT based on the first element of the first operand.

11. The non-transitory computer-readable medium of claim 10, wherein the row is a first row, the column of the LUT is a first column and the instructions, when executed, cause the at least one processor to:
    return third values representative of a second column of the LUT based on a second element of the second operand;

return fourth values from an intersection of a second row and the second column of the LUT based on a second element of the first operand;

shift the fourth values based on at least one of the second element of the first operand or the second element of the second operand; and store a sum of the shifted second values and the shifted fourth values.

12. The non-transitory computer-readable medium of claim 9, wherein the LUT is stored in the subarray of the memory.

13. The non-transitory computer-readable medium of claim 12, wherein two or more rows of the subarray of the memory are reserved for performing operations other than multiply and accumulate operations.

14. The non-transitory computer-readable medium of claim 9, wherein the row of the column of the LUT is a first row and the instructions, when executed, cause the at least one processor to:

receive the first values representative of the column of the LUT; and return third values from an intersection of a second row and the column of the LUT based on a second element of the first operand.

15. The non-transitory computer-readable medium of claim 14, wherein the first operand corresponds to a first row of a first matrix, the second operand corresponds to a first row of a second matrix, and the instructions, when executed, cause the at least one processor to store the shifted second values and shifted fourth values in a register that is partitioned to represent at least a first element and a second element of a product matrix, the first element to store the shifted second values from the intersection of the first row and the column of the LUT, the second element to store the shifted fourth values from the intersection of the second row and the column.

16. The non-transitory computer-readable medium of claim 9, wherein the second values from the intersection of the row and the column of the LUT are representative of a product of the first element of the first operand and the first element of the second operand.

17. A method to improve in-memory multiply and accumulate operations, the method comprising:

receiving, with a first multiplexer in a subarray of memory, first values representative of a column of a lookup table (LUT) including entries to represent products of four-bit numbers;

returning, with the first multiplexer, second values from an intersection of a row and the column of the LUT based on a first element of a first operand;

shifting, with shift and adder logic in the subarray, the second values based on at least one of the first element of the first operand or a first element of a second operand; and storing, in accumulation storage in the subarray, at least the shifted second values.

18. The method of claim 17, further including returning, with a second multiplexer in the subarray, the first values representative of the column of the LUT based on the first element of the first operand.

19. The method of claim 18, wherein the row is a first row, the column of the LUT is a first column and the method further includes:

returning, with the second multiplexer, third values representative of a second column of the LUT based on a second element of the second operand;

returning, with the first multiplexer, fourth values from an intersection of a second row and the second column of the LUT based on a second element of the first operand;

shifting, with the shift and adder logic, the fourth values based on at least one of the second element of the first operand or the second element of the second operand; and storing, in the accumulation storage, a sum of the shifted second values and the shifted fourth values.

20. The method of claim 17, wherein the LUT is stored in the subarray of the memory.

* * * * *